United States Patent
Nakatani et al.

(10) Patent No.: US 8,384,066 B2
(45) Date of Patent: *Feb. 26, 2013

(54) POLYMER LIGHT-EMITTING DEVICE, POLYMER COMPOUND, COMPOSITION, LIQUID COMPOSITION, AND CONDUCTIVE THIN FILM

(75) Inventors: Tomoya Nakatani, Tsukuba (JP); Hidenobu Kakimoto, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 41 days.

This patent is subject to a terminal disclaimer.

(21) Appl. No.: 12/525,154

(22) PCT Filed: Feb. 1, 2008

(86) PCT No.: PCT/JP2008/051622
§ 371 (c)(1),
(2), (4) Date: Jul. 30, 2009

(87) PCT Pub. No.: WO2008/093821
PCT Pub. Date: Aug. 7, 2008

(65) Prior Publication Data
US 2010/0090206 A1    Apr. 15, 2010

(30) Foreign Application Priority Data
Feb. 2, 2007    (JP) .................................. 2007-024313

(51) Int. Cl.
*H01L 29/08* (2006.01)
*H01L 35/24* (2006.01)
*H01L 51/00* (2006.01)

(52) U.S. Cl. ............ 257/40; 257/E51.027; 257/E51.017

(58) Field of Classification Search .................. 313/504; 252/301.35, 500; 525/174; 257/40, E51.017, 257/E51.027

See application file for complete search history.

(56) References Cited

U.S. PATENT DOCUMENTS

| | | | | |
|---|---|---|---|---|
| 6,926,973 | B2 * | 8/2005 | Suzuki et al. ................ | 428/690 |
| 2003/0165713 | A1 | 9/2003 | Oguma et al. | |
| 2009/0256475 | A1 * | 10/2009 | Nakatani et al. ............. | 313/504 |
| 2010/0033085 | A1 * | 2/2010 | Nakatani et al. ............. | 313/504 |
| 2010/0033086 | A1 * | 2/2010 | Mikami et al. ................ | 313/504 |

FOREIGN PATENT DOCUMENTS

| | | |
|---|---|---|
| JP | 10-92582 A | 4/1998 |
| JP | 2003-226744 A | 8/2003 |
| JP | 2004-168999 A | 6/2004 |
| JP | 2006182920 A | 7/2006 |
| JP | 2006-335933 A | 12/2006 |
| JP | 2007-162009 A | 6/2007 |
| WO | 9954385 A1 | 10/1999 |
| WO | 03095586 A1 | 11/2003 |
| WO | 2005/049548 A1 | 6/2005 |
| WO | 2005056633 A1 | 6/2005 |
| WO | 2005/070995 A1 | 8/2005 |
| WO | 2006/060437 A2 | 6/2006 |

OTHER PUBLICATIONS

Extended European Search Report issued in corresponding European Patent Application No. 08704331.1, dated Aug. 29, 2011.
European Patent Office, "Communication with Extended Search Report," issued in connection with European Patent Application No. 12162121.3, dated May 15, 2012.
European Patent Office, "Communication with Extended Search and Examination Reports," issued in connection with European Patent Application No. 12162124.7, dated May 15, 2012.

* cited by examiner

*Primary Examiner* — Jarrett Stark
(74) *Attorney, Agent, or Firm* — Sughrue Mion, PLLC

(57) ABSTRACT

Disclosed is a polymer light-emitting device having a light-emitting layer arranged between an anode and a cathode, and a hole transport layer arranged between the light-emitting layer and the anode. This polymer light-emitting device is characterized in that the hole transport layer is a layer containing a polymer compound which contains a repeating unit represented by the general formula (I) below, a repeating unit represented by the general formula (II) below and a repeating unit represented by the general formula (III) below.

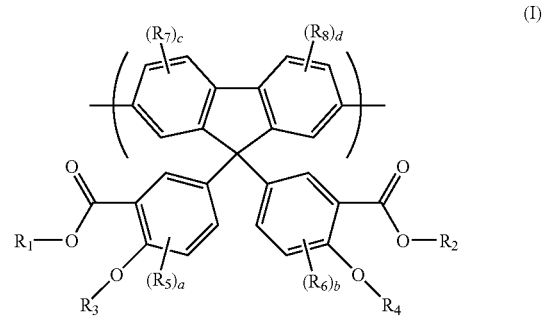

14 Claims, No Drawings

POLYMER LIGHT-EMITTING DEVICE, POLYMER COMPOUND, COMPOSITION, LIQUID COMPOSITION, AND CONDUCTIVE THIN FILM

TECHNICAL FIELD

The present invention relates to a polymer light-emitting device, a polymer compound, a composition, a liquid composition and a conductive thin film.

BACKGROUND ART

Charge transport materials (including interlayer materials) or light-emitting materials comprising a high-molecular-weight compound are useful as, for example, materials used in organic layers in devices such as light-emitting devices. Therefore, studies have been made on various polymer compounds and on polymer light-emitting devices comprising such a polymer compound in a hole transport layer. For example, JP-A-10-92582 (PATENT DOCUMENT 1) discloses a polymer light-emitting device comprising a hole transport layer comprising a polymer compound which comprises a predetermined triphenylamine derivative as a repeating unit. Moreover, the pamphlet of WO2005/49548 (PATENT DOCUMENT 2) discloses a polymer compound which comprises a fluorenediyl group as a repeating unit. Moreover, the pamphlet of WO2006/060437 (PATENT DOCUMENT 3) discloses a polymer compound which comprises, as a repeating unit, a divalent group represented by the following general formula:

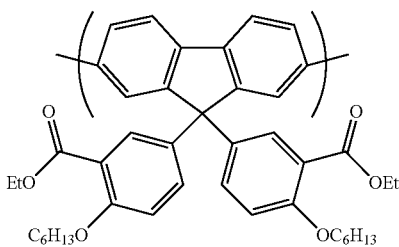

PATENT DOCUMENT 1: JP-A-10-92582
PATENT DOCUMENT 2: pamphlet of WO2005/49548
PATENT DOCUMENT 3: pamphlet of WO2006/060437

DISCLOSURE OF THE INVENTION

Problems to be Solved by the Invention

However, a polymer light-emitting device described in PATENT DOCUMENT 1 or a polymer light-emitting device comprising a polymer compound described in PATENT DOCUMENT 2 or 3 in an organic layer did not always have a sufficient luminance half-life.

The present invention has been achieved in consideration of the problems of the conventional techniques. An object of the present invention is to provide a polymer light-emitting device that can have a sufficiently long luminance half-life as well as to provide a polymer compound that allows production of a polymer light-emitting device having a sufficiently long luminance half-life, when used as a material for the polymer light-emitting device, and a composition, a liquid composition and a conductive thin film which are obtained using the polymer compound.

Means for Solving the Problems

The present inventors have conducted diligent studies to attain the object and consequently completed the present invention by finding that a polymer light-emitting material can have a sufficiently long luminance half-life, which is obtained by using a polymer light-emitting device having a light-emitting layer between an anode (a positive electrode) and a cathode (a negative electrode) and having a hole transport layer between the light-emitting layer and the anode, wherein the hole transport layer is a layer containing a polymer compound comprising a repeating unit represented by the general formula (I) shown below, a repeating unit represented by the general formula (II) shown below and a repeating unit represented by the general formula (III) shown below and by finding that the polymer compound containing particular repeating units allows production of a polymer light-emitting device having a sufficiently long luminance half-life.

Specifically, a polymer light-emitting device of the present invention is a polymer light-emitting device having a light-emitting layer between an anode and a cathode and having a hole transport layer between the light-emitting layer and the anode, characterized in that the hole transport layer is a layer containing a polymer compound comprising a repeating unit represented by the following general formula (I), a repeating unit represented by the following general formula (II) and a repeating unit represented by the following general formula (III):

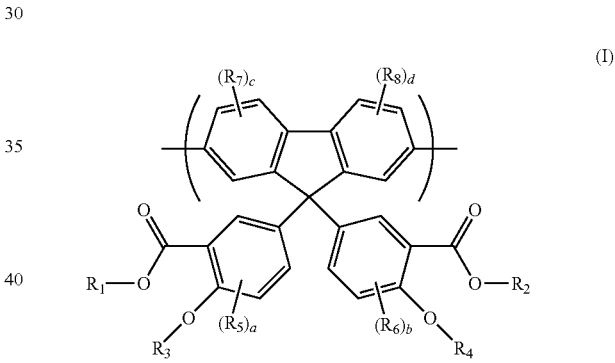

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different,

wherein $Ar_1$ represents a divalent aromatic amine, and

wherein $Ar_2$ represents an arylene group or a divalent heterocyclic group.

Moreover, for the polymer light-emitting device of the present invention, it is preferred that $Ar_1$ in the general formula (II) should be a group represented by the following general formula (IV):

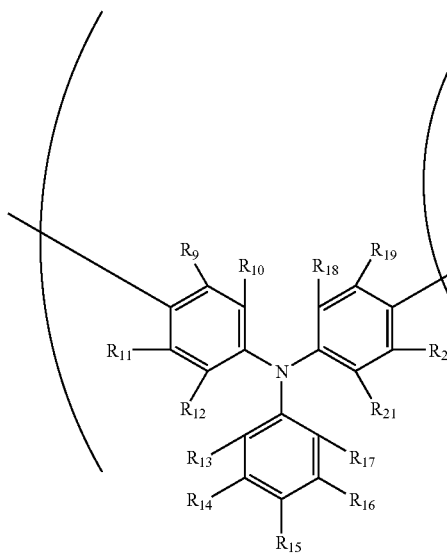

(IV)

wherein $R_9$ to $R_{34}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; o and p may be the same or different and each represent an integer of 0 or 1; and carbon bonded to $R_{10}$ and carbon bonded to $R_{18}$, carbon bonded to $R_{12}$ and carbon bonded to $R_{13}$, carbon bonded to $R_{24}$ and carbon bonded to $R_{34}$, or carbon bonded to $R_{30}$ and carbon bonded to $R_{31}$ may form a ring through a direct bond or through a bond via an oxygen or sulfur atom, and when such a ring is formed, $R_{10}$ and $R_{18}$, $R_{12}$ and $R_{13}$, $R_{24}$ and $R_{34}$, or $R_{30}$ and $R_{31}$ together represent the direct bond or the oxygen or sulfur atom.

Moreover, for the polymer light-emitting device of the present invention, it is preferred that $Ar_2$ in the general formula (III) should be a group represented by the following general formula (V):

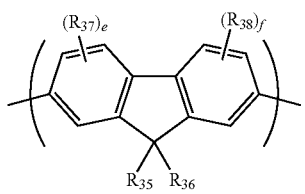

(V)

wherein $R_{35}$ and $R_{36}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{37}$ and $R_{38}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; e and f may be the same or different and each represent an integer of 0 to 3; and when a plurality of $R_{37}$ or $R_{38}$ are present, they may be the same or different.

Furthermore, for the polymer light-emitting device of the present invention, it is preferred that $Ar_2$ in the general formula (III) should be a group represented by the following general formula (VI):

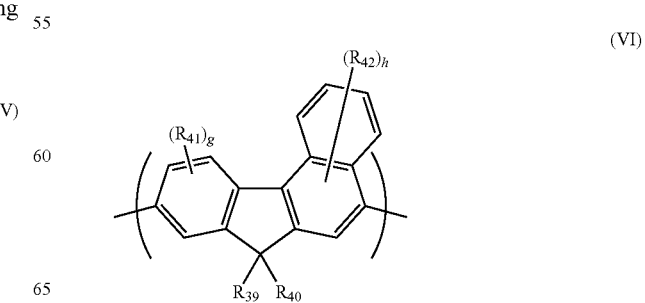

(VI)

wherein $R_{39}$ and $R_{40}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{41}$ and $R_{42}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; g represents an integer of 0 to 3; h represents an integer of 0 to 5; and when a plurality of $R_{41}$ or $R_{42}$ are present, they may be the same or different.

Moreover, for the polymer light-emitting device of the present invention, it is preferred that $Ar_2$ in the general formula (III) should be a group represented by the following general formula (VII):

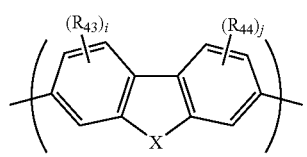
(VII)

wherein X represents an oxygen atom or a sulfur atom; $R_{43}$ and $R_{44}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; i and j may be the same or different and each represent an integer of 0 to 3; and when a plurality of $R_{43}$ or $R_{44}$ are present, they may be the same or different.

Moreover, for the polymer light-emitting device of the present invention, it is preferred that the polymer compound should have a weight average molecular weight based on polystyrene standards of $10^3$ to $10^7$.

Furthermore, for the polymer light-emitting device of the present invention, it is preferred that the hole transport layer should be a layer further containing a hole transport material.

Moreover, a first polymer compound of the present invention is characterized by comprising a repeating unit represented by the following general formula (I), a repeating unit represented by the following general formula (II) and a repeating unit represented by the following general formula (VI):

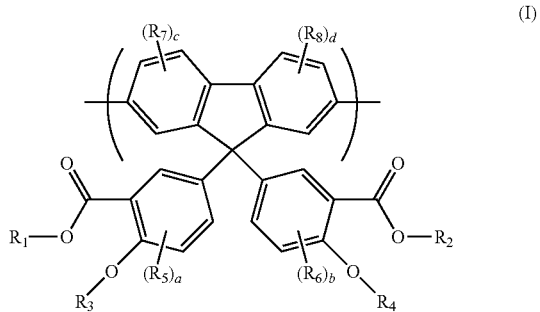
(I)

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different,

[General Formula (II)]

—$Ar_1$— (II)

wherein $Ar_1$ represents a divalent aromatic amine, and

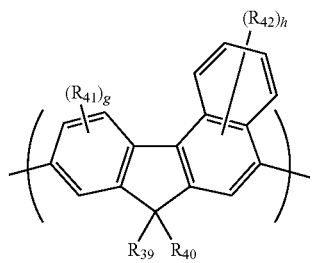
(VI)

wherein $R_{39}$ and $R_{40}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{41}$ and $R_{42}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; g represents an integer of 0 to 3; h represents an integer of 0 to 5; and when a plurality of $R_{41}$ or $R_{42}$ are present, they may be the same or different.

Moreover, a second polymer compound of the present invention is characterized by comprising a repeating unit represented by the following general formula (I), a repeating unit represented by the following general formula (II) and a repeating unit represented by the following general formula (VII):

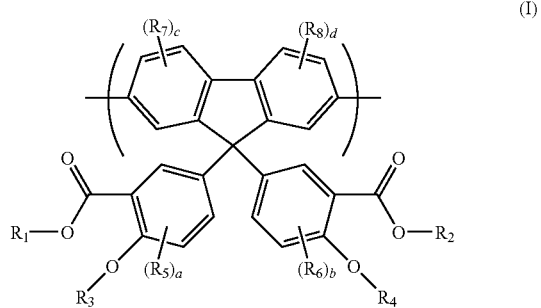
(I)

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different, —$Ar_1$— (II)

wherein in the formula (II), $Ar_1$ represents divalent aromatic amine, and

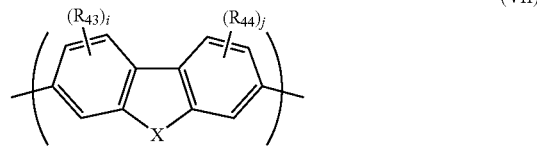
(VII)

wherein X represents an oxygen atom or a sulfur atom; $R_{43}$ and $R_{44}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; i and j may be the same or different and each represent an integer of 0 to 3; and when a plurality of $R_{43}$ or $R_{44}$ are present, they may be the same or different.

Furthermore, for the first and second polymer compounds of the present invention, it is preferred that $Ar_1$ in the general formula (II) should be a group represented by the following general formula (IV):

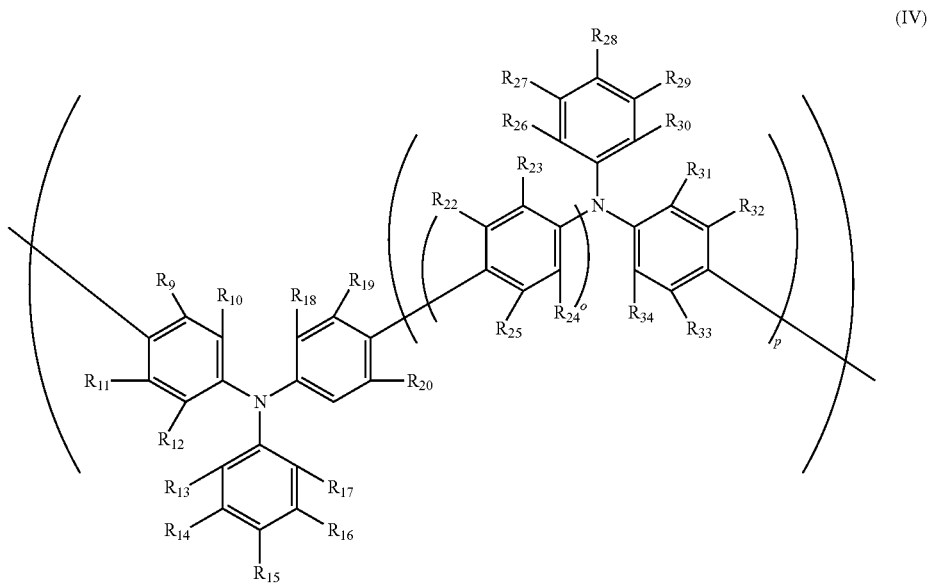
(IV)

wherein $R_9$ to $R_{34}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; o and p may be the same or different and each represent an integer of 0 or 1; and carbon bonded to $R_{10}$ and carbon bonded to $R_{18}$, carbon bonded to $R_{12}$ and carbon bonded to $R_{13}$, carbon bonded to $R_{24}$ and carbon bonded to $R_{34}$, or carbon bonded to $R_{30}$ and carbon bonded to $R_{31}$ may form a ring through a direct bond or through a bond via an oxygen or sulfur atom, and when such a ring is formed, $R_{10}$ and $R_{18}$, $R_{12}$ and $R_{13}$, $R_{24}$ and $R_{34}$, or $R_{30}$ and $R_{31}$ together represent the direct bond or the oxygen or sulfur atom.

Moreover, for the first and second polymer compounds of the present invention, it is preferred that the polymer compound should have a polystyrene equivalent weight average molecular weight of $10^3$ to $10^7$.

Moreover, a composition of the present invention is characterized by comprising at least one of the first and second polymer compounds of the present invention and at least one material selected from the group consisting of a light-emitting material and a hole transport material.

Moreover, a liquid composition of the present invention is characterized by comprising at least one of the first and second polymer compounds of the present invention and a solvent.

Furthermore, a conductive thin film of the present invention is characterized by comprising one or more of any polymer compound of the first and second polymer compounds of the present invention.

Advantages of the Invention

An object of the present invention is to provide a polymer light-emitting device that can have a sufficiently long luminance half-life as well as to provide a polymer compound that allows production of a polymer light-emitting device having a sufficiently long luminance half-life, when used as a material for the polymer light-emitting device, and a composition, a liquid composition and a conductive thin film which are obtained using the polymer compound.

Thus, the polymer light-emitting device of the present invention and a polymer light-emitting device comprising the polymer compound of the present invention can be used preferably in a liquid-crystal display backlight, a curved or planar light source for illumination, a segment-type display device, a dot matrix flat-panel display, and so on.

BEST MODE FOR CARRYING OUT THE INVENTION

Hereinafter, the present invention will be described in detail in view of preferable embodiments thereof.
[Polymer Light-Emitting Device]

A polymer light-emitting device of the present invention is a polymer light-emitting device having a light-emitting layer between an anode and a cathode and having a hole transport layer between the light-emitting layer and the anode, characterized in that the hole transport layer is a layer containing a polymer compound comprising a repeating unit represented by the following general formula (I), a repeating unit represented by the following general formula (II) and a repeating unit represented by the following general formula (III):

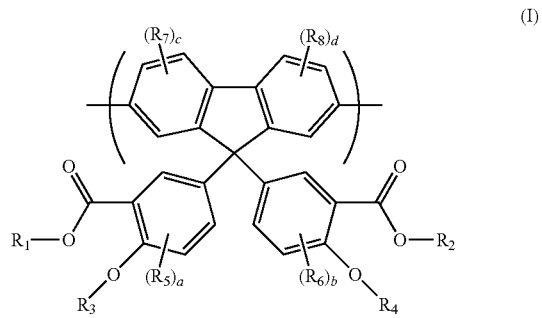

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different,

wherein $Ar_1$ represents a divalent aromatic amine, and

wherein $Ar_2$ represents an arylene group or a divalent heterocyclic group.

First, the polymer compound according to the present invention will be described. The polymer compound according to the present invention comprises a repeating unit represented by the general formula (I), as described above. The alkyl group that may be selected as $R_1$, $R_2$, $R_3$, $R_4$, $R_5$, $R_6$, $R_7$ or $R_8$ in such a general formula (I) may be linear, branched or cyclic and may further have a substituent. Moreover, such an alkyl group has preferably 1 to 20 (more preferably 1 to 10) carbon atoms. Examples thereof include methyl, ethyl, propyl, isopropyl, butyl, isobutyl, s-butyl, t-butyl, pentyl, hexyl, cyclohexyl, heptyl, octyl, 2-ethylhexyl, nonyl, decyl, 3,7-dimethyloctyl, lauryl, trifluoromethyl, pentafluoroethyl, perfluorobutyl, perfluorohexyl and perfluorooctyl groups.

The alkoxy group that may be selected as $R_5$, $R_6$, $R_7$ or $R_8$ in the general formula (I) may be linear, branched or cyclic and may further have a substituent. Moreover, such an alkoxy group has preferably 1 to 20 (more preferably 1 to 10) carbon atoms. Examples thereof include methoxy, ethoxy, propyloxy, isopropyloxy, butoxy, isobutoxy, s-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy, trifluoromethoxy, pentafluoroethoxy, perfluorobutoxy, perfluorohexyloxy, perfluorooctyloxy, methoxymethyloxy and 2-methoxyethyloxy groups.

Moreover, the alkylthio group that may be selected as $R_5$, $R_6$, $R_7$ or $R_8$ in the general formula (I) may be linear, branched or cyclic and may further have a substituent. Furthermore, such an alkylthio group has preferably 1 to 20 (more preferably 1 to 10) carbon atoms. Examples thereof include methylthio, ethylthio, propylthio, isopropylthio, butylthio, isobutylthio, s-butylthio, t-butylthio, pentylthio, hexylthio, cyclohexylthio, heptylthio, octylthio, 2-ethylhexylthio, nonylthio, decylthio, 3,7-dimethyloctylthio, laurylthio and trifluoromethylthio groups.

Furthermore, the aryl group that may be selected as $R_5$, $R_6$, $R_7$ or $R_8$ in the general formula (I) is not particularly limited as long as it is an atomic group derived from aromatic hydrocarbon by removal of one hydrogen atom. It includes those having a condensed ring and those comprising two or more independent benzene rings or condensed rings bonded directly or via a group such as vinylene. Such an aryl group has preferably 6 to 60 (more preferably 7 to 48) carbon atoms. Examples thereof include phenyl, $C_1$ to $C_{12}$ alkoxyphenyl (the term $C_1$ to $C_{12}$ means that the moiety has 1 to 12 carbon atoms; the same holds true for description below), $C_1$ to $C_{12}$ alkylphenyl, 1-naphthyl, 2-naphthyl, 1-anthracenyl, 2-anthracenyl, 9-anthracenyl and pentafluorophenyl groups. Among such aryl groups, $C_1$ to $C_{12}$ alkoxyphenyl and $C_1$ to $C_{12}$ alkylphenyl groups are more preferable.

Examples of the $C_1$ to $C_{12}$ alkoxy among such aryl groups include methoxy, ethoxy, propyloxy, isopropyloxy, butoxy, isobutoxy, s-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy.

Moreover, examples of the $C_1$ to $C_{12}$ alkylphenyl group among the aryl groups include methylphenyl, ethylphenyl, dimethylphenyl, propylphenyl, mesityl, methylethylphenyl, isopropylphenyl, butylphenyl, isobutylphenyl, t-butylphenyl, pentylphenyl, isoamylphenyl, hexylphenyl, heptylphenyl, octylphenyl, nonylphenyl, decylphenyl and dodecylphenyl groups.

Moreover, the aryloxy group that may be selected as $R_5$, $R_6$, $R_7$ or $R_8$ in the general formula (I) has preferably 6 to 60 (more preferably 7 to 48) carbon atoms. Examples thereof include phenoxy, $C_1$ to $C_{12}$ alkoxyphenoxy, $C_1$ to $C_{12}$ alkylphenoxy, 1-naphthyloxy, 2-naphthyloxy and pentafluorophenyloxy groups. Moreover, among such aryloxy groups, $C_1$ to $C_{12}$ alkoxyphenoxy and $C_1$ to $C_{12}$ alkylphenoxy groups are more preferable.

Examples of the $C_1$ to $C_{12}$ alkoxy among the aryloxy groups include methoxy, ethoxy, propyloxy, isopropyloxy, butoxy, isobutoxy, s-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and lauryloxy.

Moreover, examples of the $C_1$ to $C_{12}$ alkylphenoxy group among the aryloxy groups include methylphenoxy, ethylphenoxy, dimethylphenoxy, propylphenoxy, 1,3,5-trimethylphenoxy, methylethylphenoxy, isopropylphenoxy, butylphenoxy, isobutylphenoxy, s-butylphenoxy, t-butylphenoxy, pentylphenoxy, isoamylphenoxy, hexylphenoxy, heptylphenoxy, octylphenoxy, nonylphenoxy, decylphenoxy and dodecylphenoxy groups.

Moreover, the arylthio group that may be selected as $R_5$, $R_6$, $R_7$ or $R_8$ in the general formula (I) is not particularly limited as long as it is the aryl group bonded to a sulfur element. It may have a substituent on the aromatic ring of the aryl group. Such an arylthio group has preferably 3 to 60 (more preferably 5 to 30) carbon atoms. Examples thereof include phenylthio, $C_1$ to $C_{12}$ alkoxyphenylthio, $C_1$ to $C_{12}$ alkylphenylthio, 1-naphthylthio, 2-naphthylthio, pentafluorophenylthio, pyridylthio, pyridazinylthio, pyrimidylthio, pyrazinylthio and triazinylthio groups.

Furthermore, the arylalkyl group that may be selected as $R_5$, $R_6$, $R_7$ or $R_8$ in the general formula (I) is not particularly limited as long as it is the aryl group bonded to the alkyl group. It may have a substituent. Such an arylalkyl group has preferably 7 to 60 (more preferably 7 to 30) carbon atoms. Examples thereof include phenyl-$C_1$ to $C_{12}$ alkyl, $C_1$ to $C_{12}$ alkoxyphenyl-$C_1$ to $C_{12}$ alkyl, $C_1$ to $C_{12}$-alkylphenyl-$C_1$ to $C_{12}$ alkyl, 1-naphthyl-$C_1$ to $C_{12}$ alkyl and 2-naphthyl-$C_1$ to $C_{12}$ alkyl groups.

Moreover, the arylalkoxy group that may be selected as $R_5$, $R_6$, $R_7$ or $R_8$ in the general formula (I) is not particularly limited as long as it is the aryl group bonded to the alkoxy group. It may have a substituent. Such an arylalkoxy group has preferably 7 to 60 (more preferably 7 to 30) carbon atoms. Examples thereof include phenyl-$C_1$ to $C_{12}$ alkoxy, $C_1$ to $C_{12}$ alkoxyphenyl-$C_1$ to $C_{12}$ alkoxy, $C_1$ to $C_{12}$ alkylphenyl-$C_1$ to $C_{12}$ alkoxy, 1-naphthyl-$C_1$ to $C_{12}$ alkoxy and 2-naphthyl-$C_1$ to $C_{12}$ alkoxy groups.

Moreover, the arylalkylthio group that may be selected as $R_5$, $R_6$, $R_7$ or $R_8$ in the general formula (I) is not particularly limited as long as it is the aryl group bonded to the alkylthio group. It may have a substituent. Such an arylalkylthio group has preferably 7 to 60 (more preferably 7 to 30) carbon atoms. Examples thereof include phenyl-$C_1$ to $C_{12}$ alkylthio, $C_1$ to $C_{12}$ alkoxyphenyl-$C_1$ to $C_{12}$ alkylthio, $C_1$ to $C_{12}$ alkylphenyl-$C_1$ to $C_{12}$ alkylthio, 1-naphthyl-$C_1$ to $C_{12}$ alkylthio and 2-naphthyl-$C_1$ to $C_{12}$ alkylthio groups.

Moreover, the arylalkenyl group that may be selected as $R_5$, $R_6$, $R_7$ or $R_8$ in the general formula (I) needs only to be the aryl group bonded to an alkenyl group. Such an arylalkenyl group is not particularly limited and has preferably 8 to 60 (more preferably 8 to 30) carbon atoms. It is exemplified by phenyl-$C_2$ to $C_{12}$ alkenyl, $C_1$ to $C_{12}$ alkoxyphenyl-$C_2$ to $C_{12}$ alkenyl, $C_1$ to $C_{12}$ alkylphenyl-$C_2$ to $C_{12}$ alkenyl, 1-naphthyl-$C_2$ to $C_{12}$ alkenyl and 2-naphthyl-$C_2$ to $C_{12}$ alkenyl groups. Among them, $C_1$ to $C_{12}$ alkoxyphenyl-$C_2$ to $C_{12}$ alkenyl and $C_2$ to $C_{12}$ alkylphenyl-$C_2$ to $C_{12}$ alkenyl groups are more preferable.

Furthermore, the arylalkynyl group that may be selected as $R_5$, $R_6$, $R_7$ or $R_8$ in the general formula (I) needs only to be the aryl group bonded to an alkynyl group. Such an arylalkynyl group is not particularly limited and has preferably 8 to 60 (more preferably 8 to 30) carbon atoms. It is exemplified by phenyl-$C_2$ to $C_{12}$ alkynyl, $C_1$ to $C_{12}$ alkoxyphenyl-$C_2$ to $C_{12}$ alkynyl, $C_1$ to $C_{12}$ alkylphenyl-$C_2$ to $C_{12}$ alkynyl, 1-naphthyl-$C_2$ to $C_{12}$ alkynyl and 2-naphthyl-$C_2$ to $C_{12}$ alkynyl groups. Among them, $C_1$ to $C_{12}$ alkoxyphenyl-$C_2$ to $C_{12}$ alkynyl and $C_1$ to $C_{12}$ alkylphenyl-$C_2$ to $C_{12}$ alkynyl groups are more preferable.

Moreover, the substituted amino group that may be selected as $R_5$, $R_6$, $R_7$ or $R_8$ in the general formula (I) is not particularly limited and is preferably an amino group substituted by one or two groups selected from the group consisting of an alkyl group, an aryl group, an arylalkyl group and a monovalent heterocyclic group. Moreover, the alkyl group, the aryl group, the arylalkyl group or the monovalent heterocyclic group in such a substituted amino group may have an additional substituent. Furthermore, such a substituted amino group has 1 to 60 (more preferably 2 to 48) carbon atoms exclusive of the carbon number of the substituent.

Examples of such a substituted amino group include methylamino, dimethylamino, ethylamino, diethylamino, propylamino, dipropylamino, isopropylamino, diisopropylamino, butylamino, isobutylamino, secondary butyl, s-butylamino, t-butylamino, pentylamino, hexylamino, cyclohexylamino, heptylamino, octylamino, 2-ethylhexylamino, nonylamino, decylamino, 3,7-dimethyloctylamino, laurylamino, cyclopentylamino, dicyclopentylamino, cyclohexylamino, dicyclohexylamino, pyrrolidyl, piperidyl, ditrifluoromethylamino, phenylamino, diphenylamino, $C_1$ to $C_{12}$ alkoxyphenylamino, di($C_1$ to $C_{12}$ alkoxyphenyl)amino, di($C_1$ to $C_{12}$ alkylphenyl)amino, 1-naphthylamino, 2-naphthylamino, pentafluorophenylamino, pyridylamino, pyridazinylamino, pyrimidylamino, pyrazylamino, triazylamino, phenyl-$C_1$ to $C_{12}$ alkylamino, $C_1$ to $C_{12}$ alkoxyphenyl-$C_1$ to $C_{12}$ alkylamino, $C_1$ to $C_{12}$ alkylphenyl-$C_1$ to $C_{12}$ alkylamino, di($C_1$ to $C_{12}$ alkoxyphenyl-$C_1$ to $C_{12}$ alkyl)amino, di($C_1$ to $C_{12}$ alkylphenyl-$C_1$ to $C_{12}$ alkyl)amino, 1-naphthyl-$C_1$ to $C_{12}$ alkylamino and 2-naphthyl-$C_1$ to $C_{12}$ alkylamino groups.

Moreover, examples of the substituted silyl group that may be selected as $R_5$, $R_6$, $R_7$ or $R_8$ in the general formula (I) include a silyl group substituted by one to three groups selected from the group consisting of an alkyl group, an aryl group, an arylalkyl group and a monovalent heterocyclic group. Such a substituted silyl group is not particularly limited and has preferably 1 to 60 (more preferably 3 to 48) carbon atoms. In this context, the alkyl group, the aryl group, the arylalkyl group or the monovalent heterocyclic group in such a substituted silyl group may have a substituent.

Examples of such a substituted silyl group include trimethylsilyl, triethylsilyl, tripropylsilyl, tri-isopropylsilyl, dimethyl-isopropylsilyl, diethyl-isopropylsilyl, t-butylsilyldimethylsilyl, pentyldimethylsilyl, hexyldimethylsilyl, heptyldimethylsilyl, octyldimethylsilyl, 2-ethylhexyl-dimethylsilyl, nonyldimethylsilyl, decyldimethylsilyl, 3,7-dimethyloctyl-dimethylsilyl, lauryldimethylsilyl, phenyl-$C_1$ to $C_{12}$ alkylsilyl, $C_1$ to $C_{12}$ alkoxyphenyl-$C_1$ to $C_{12}$ alkylsilyl, $C_1$ to $C_{12}$ alkylphenyl-$C_1$ to $C_{12}$ alkylsilyl, 1-naphthyl-$C_1$ to $C_{12}$ alkylsilyl, 2-naphthyl-$C_1$ to $C_{12}$ alkylsilyl, phenyl-$C_1$ to $C_{12}$ alkyldimethylsilyl, triphenylsilyl, tri-p-xylylsilyl, tribenzylsilyl, diphenylmethylsilyl, t-butyldiphenylsilyl and dimethylphenylsilyl groups.

Moreover, examples of the halogen atom that may be selected as $R_5$, $R_6$, $R_7$ or $R_8$ in the general formula (I) include fluorine, chlorine, bromine and iodine atoms.

Furthermore, the acyl group that may be selected as $R_5$, $R_6$, $R_7$ or $R_8$ in the general formula (I) is not particularly limited and has preferably 2 to 20 (more preferably 2 to 18) carbon atoms. Examples thereof include acetyl, propionyl, butyryl, isobutyryl, pivaloyl, benzoyl, trifluoroacetyl and pentafluorobenzoyl groups.

Moreover, the acyloxy group that may be selected as $R_5$, $R_6$, $R_7$ or $R_8$ in the general formula (I) is not particularly limited and has preferably 2 to 20 (more preferably 2 to 18) carbon atoms. Examples thereof include acetoxy, propionyloxy, butyryloxy, isobutyryloxy, pivaloyloxy, benzoyloxy, trifluoroacetyloxy and pentafluorobenzoyloxy groups.

Moreover, the imine residue that may be selected as $R_5$, $R_6$, $R_7$ or $R_8$ in the general formula (I) is not particularly limited as long as it is a residue derived from an imine compound (which refers to an organic compound having a group represented by the formula —N=C— in the molecule; examples thereof include aldimine, ketimine, and compounds having an alkyl group or the like substituted for a hydrogen atom on N in these molecules) by removal of one hydrogen atom. The imine residue has preferably 2 to 20 (more preferably 2 to 18) carbon atoms. Examples of such an imine residue include groups represented by the following structural formulas:

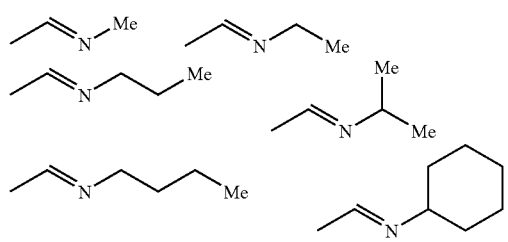

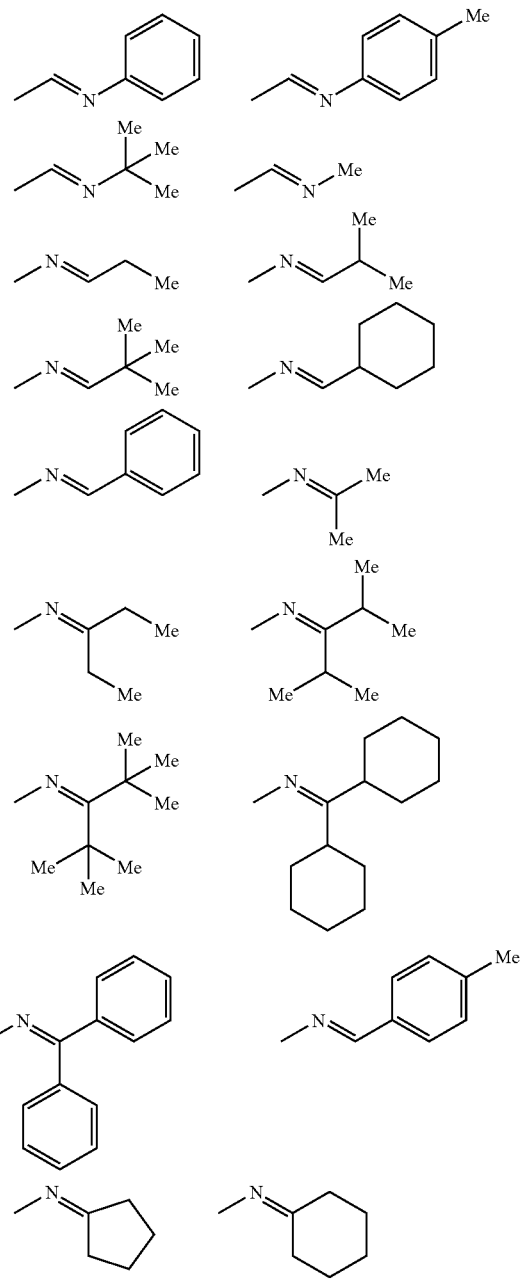

Furthermore, the amide group that may be selected as $R_5$, $R_6$, $R_7$ or $R_8$ in the general formula (I) is not particularly limited and has preferably 2 to 20 (more preferably 2 to 18) carbon atoms. Examples thereof include formamide, acetamide, propionamide, butylamide, benzamide, trifluoroacetamide, pentafluorobenzamide, diformamide, diacetamide, dipropionamide, dibutylamide, dibenzamide, ditrifluoroacetamide and dipentafluorobenzamide groups.

Moreover, the acid imide group that may be selected as $R_5$, $R_6$, $R_7$ or $R_8$ in the general formula (I) is not particularly limited as long as it is a residue derived from acid imide by removal of a hydrogen atom bonded to the nitrogen atom. The acid imide group has preferably 4 to 20 (more preferably 4 to 18) carbon atoms. Examples thereof include groups represented by the following structural formulas:

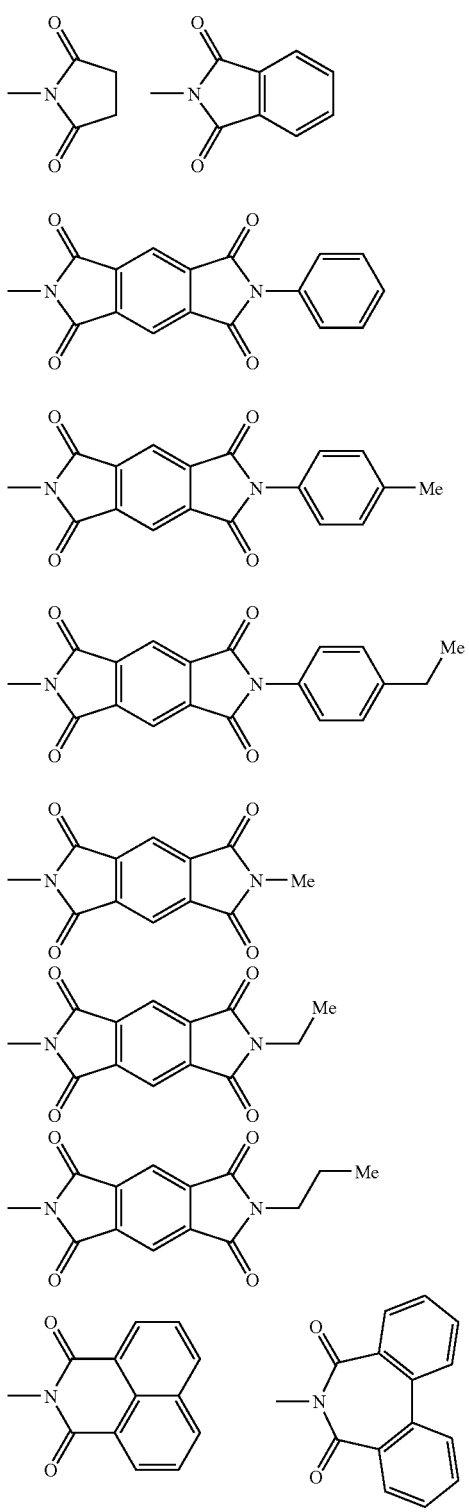

the heterocyclic compound refers to, of organic compounds having a cyclic structure, those endocyclically containing not only a carbon atom but also heteroatoms such as oxygen, sulfur, nitrogen, phosphorus and boron as elements constituting the ring. Examples of such a monovalent heterocyclic group include thienyl, $C_1$ to $C_{12}$ alkylthienyl, pyrrolyl, furyl, pyridyl, $C_1$ to $C_{12}$ alkylpyridyl, piperidyl, quinolyl and isoquinolyl groups. Among them, thienyl, $C_1$ to $C_{12}$ alkylthienyl, pyridyl and $C_1$ to $C_{12}$ alkylpyridyl groups are more preferable.

Moreover, the substituted carboxyl group that may be selected as $R_5$, $R_6$, $R_7$ or $R_8$ in the general formula (I) refers to a carboxyl group substituted by an alkyl group, an aryl group, an arylalkyl group or a monovalent heterocyclic group. Such a substituted carboxyl group has preferably 2 to 60 (more preferably 2 to 48) carbon atoms. Moreover, the alkyl group, the aryl group, the arylalkyl group or the monovalent heterocyclic group in the substituted carboxyl group may have an additional substituent. In this context, the carbon number of the substituent is excluded from the carbon number of the substituted carboxyl group. Such a substituted carboxyl group is not particularly limited, and examples thereof include methoxycarbonyl, ethoxycarbonyl, propoxycarbonyl, isopropoxycarbonyl, butoxycarbonyl, isobutoxycarbonyl, s-butoxycarbonyl, t-butoxycarbonyl, pentyloxycarbonyl, hexyloxycarbonyl, cyclohexyloxycarbonyl, heptyloxycarbonyl, octyloxycarbonyl, 2-ethylhexyloxycarbonyl, nonyloxycarbonyl, decyloxycarbonyl, 3,7-dimethyloctyloxycarbonyl, dodecyloxycarbonyl, trifluoromethoxycarbonyl, pentafluoroethoxycarbonyl, perfluorobutoxycarbonyl, perfluorohexyloxycarbonyl, perfluorooctyloxycarbonyl, phenoxycarbonyl, naphthoxycarbonyl and pyridyloxycarbonyl groups.

Moreover, $R_5$, $R_6$, $R_7$ or $R_8$ in the general formula (I) is preferably an alkyl group, an alkoxy group, an aryl group, an aryloxy group, a carboxyl group or a substituted carboxyl group from the viewpoint of easy synthesis of a raw material monomer.

Moreover, a, b, c and d in the general formula (I) are each independently more preferably 0 or 1 and most preferably 0 from the viewpoint of easy synthesis of a raw material monomer.

Furthermore, $R_1$, $R_2$, $R_3$ and $R_4$ in the general formula (I) are preferably an alkyl group from the viewpoint of easy synthesis of a raw material monomer.

Specific examples of the repeating unit represented by the general formula (I) include repeating units represented by the following formula (I-1) to (I-9):

(I-1)

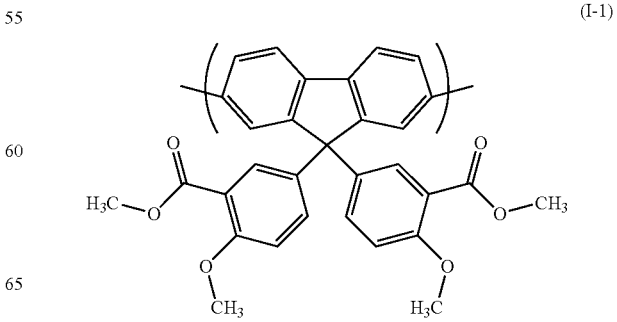

Moreover, the monovalent heterocyclic group that may be selected as $R_5$, $R_6$, $R_7$ or $R_6$ in the general formula (I) refers to an atomic group derived from a heterocyclic compound by removal of one hydrogen atom. Such a monovalent heterocyclic group is not particularly limited and has preferably 4 to 60 (more preferably 4 to 20) carbon atoms. In this context, the carbon number of the substituent is excluded from the carbon number of such a monovalent heterocyclic group. Moreover, (I-2)

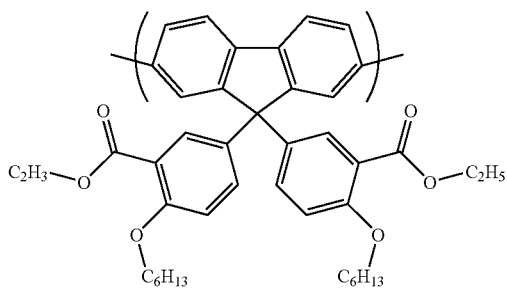

(I-3)

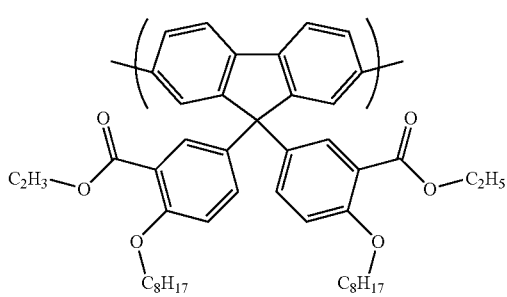

(I-4)

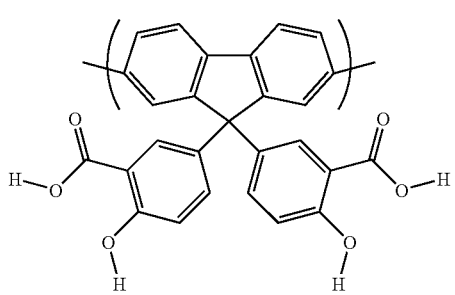

(I-5)

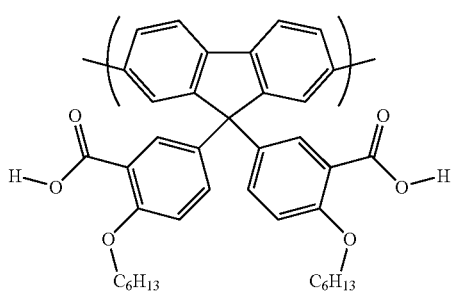

(I-6)

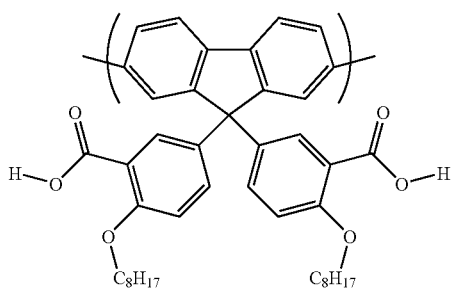

(I-7)

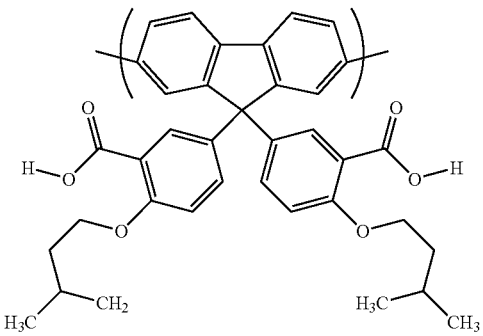

(I-8)

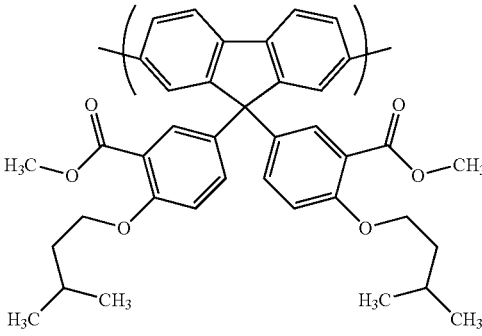

(I-9)

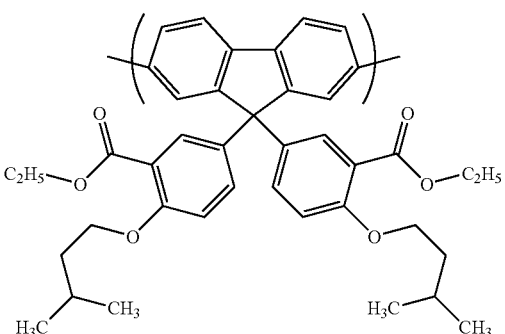

Moreover, the polymer compound according to the present invention comprises, in addition to the repeating unit represented by the general formula (I), a repeating unit represented by the following general formula (II), as described above:

$$—Ar_1—\qquad(II)$$

wherein in the formula (II), $Ar_1$ represents divalent aromatic amine.

In the general formula (II), the divalent aromatic amine refers to an atomic group derived from aromatic amine by removal of two hydrogen atoms and may have a substituent. Such divalent aromatic amine has preferably 5 to 100 (more preferably 15 to 60) carbon atoms. In this context, the carbon number of the substituent is excluded from the carbon number of the aromatic amine.

Moreover, such divalent aromatic amine is specifically exemplified by divalent aromatic amines represented by the following general formulas 401 to 410:

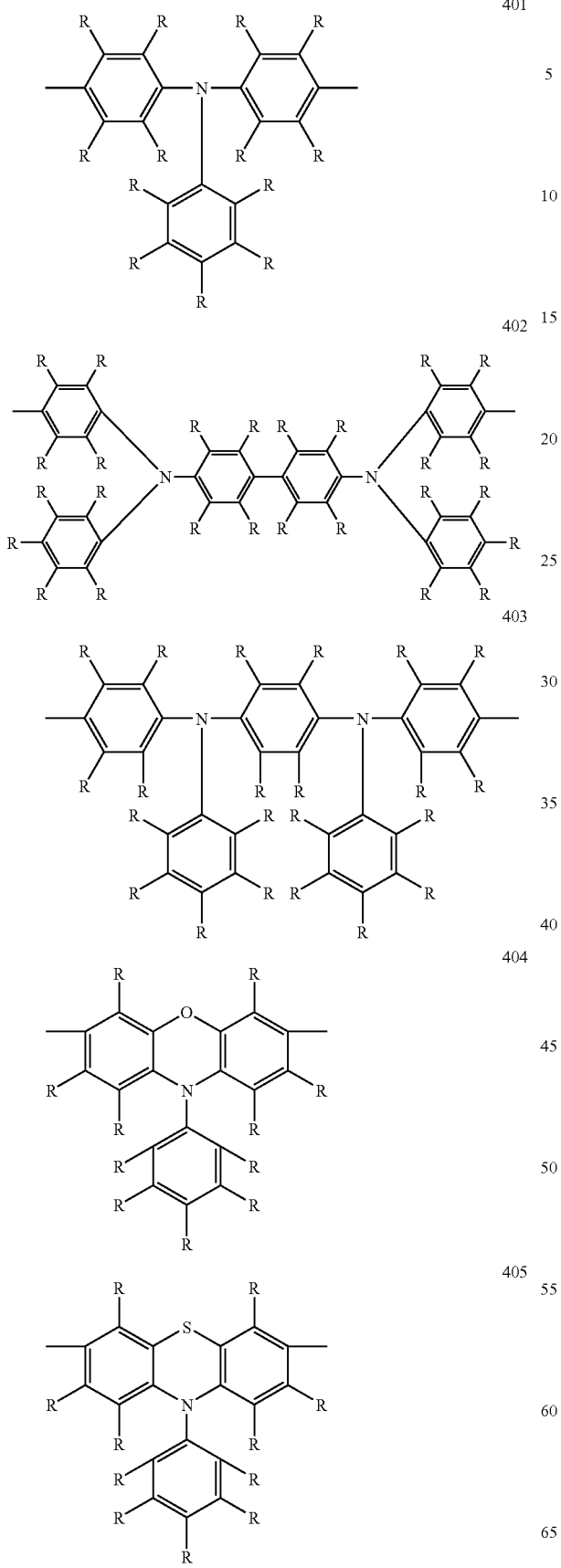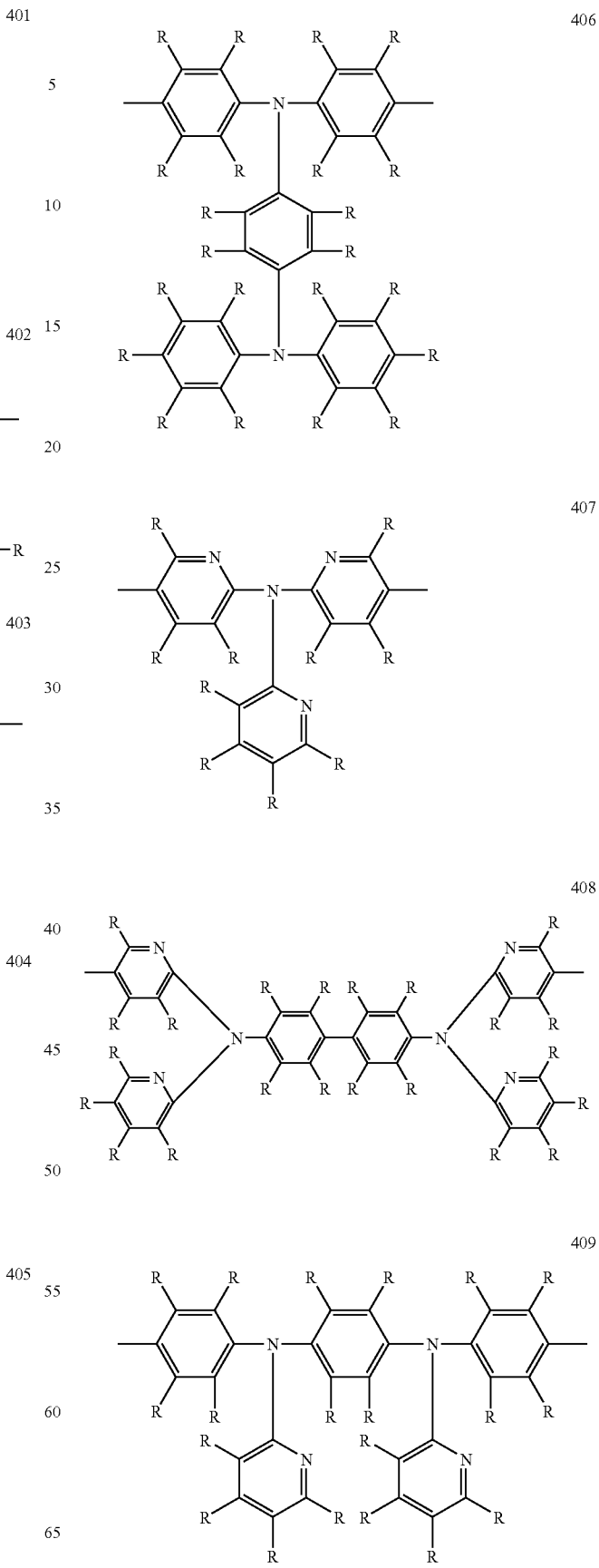

-continued

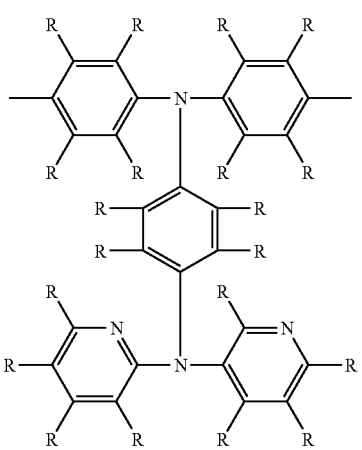

410 wherein in the formulas 401 to 410, R represents a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the substituted amino group, the substituted silyl group, the halogen atom, the acyl group, the acyloxy group, the imine residue, the amide group, the acid imide group, the monovalent heterocyclic group and the substituted carboxyl group that may be selected as R in the general formulas 401 to 410 have the same definition, specific examples, and so on as those described in $R_5$, $R_6$, $R_7$ and $R_8$ in the general formula (I).

Moreover, the repeating unit represented by the general formula (II) is more preferably a repeating unit represented by the following general formula (IV) from the viewpoint of obtaining a polymer device having a long luminance half-life:

wherein $R_9$ to $R_{34}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; o and p may be the same or different and each represent an integer of 0 or 1; and carbon bonded to $R_{10}$ and carbon bonded to $R_{18}$, carbon bonded to $R_{12}$ and carbon bonded to $R_{13}$, carbon bonded to $R_{24}$ and carbon bonded to $R_{34}$, or carbon bonded to $R_{30}$ and carbon bonded to $R_{31}$ may form a ring through a direct bond or through a bond via an oxygen or sulfur atom, and when such a ring is formed, $R_{10}$ and $R_{18}$, $R_{12}$ and $R_{13}$, $R_{24}$ and $R_{34}$, or $R_{30}$ and $R_{31}$ together represent the direct bond or the oxygen or sulfur atom.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the substituted amino group, the substituted silyl group, the halogen atom, the acyl group, the acyloxy group, the imine residue, the amide group, the acid imide group, the monovalent heterocyclic group and the substituted carboxyl group that may be selected as $R_9$ to $R_{34}$ in the general formula (IV) have the same definition, specific examples, and so on as those described in $R_5$, $R_6$, $R_7$ and $R_8$ in the general formula (I).

Moreover, $R_9$ to $R_{34}$ in the general formula (IV) is more preferably a hydrogen atom, an alkyl group, an alkoxy group, an aryl group, an aryloxy group, a carboxyl group or a substituted carboxyl group, even more preferably a hydrogen atom, an alkyl group, an alkoxy group or a substituted carboxyl group, from the viewpoint of easy synthesis of a raw material monomer.

Moreover, when carbon bonded to $R_{10}$ and carbon bonded to $R_{18}$ or carbon bonded to $R_{24}$ and carbon bonded to $R_{34}$ in the general formula (IV) form a ring through a direct bond or through a bond via an oxygen or sulfur atom (e.g., when the general formula (IV) represents a repeating unit represented (IV)

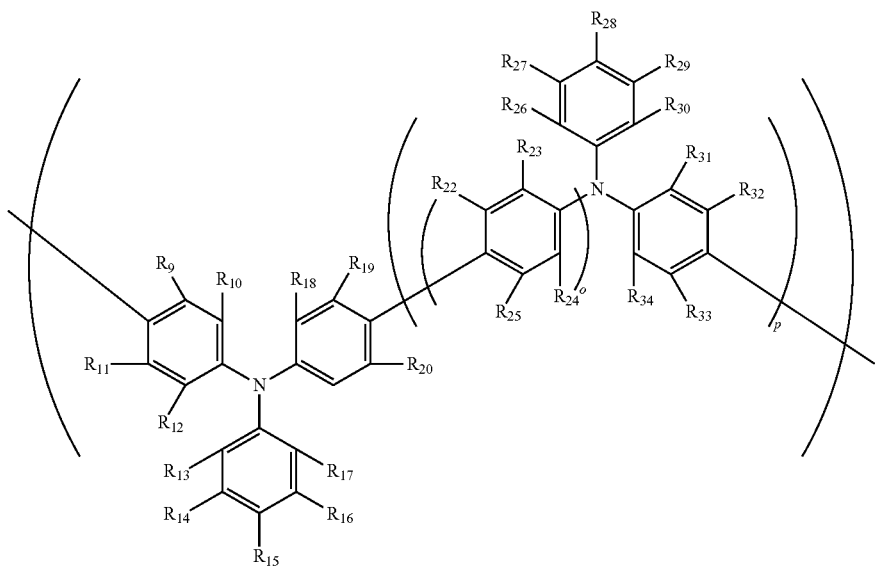

by the general formula (IV-5), (IV-9), or the like shown below), it is preferred from the viewpoint of easy synthesis of a raw material monomer that the carbons should form a ring through a bond via an oxygen or sulfur atom.

Moreover, when carbon bonded to $R_{12}$ and carbon bonded to $R_{13}$ or carbon bonded to $R_{30}$ and carbon bonded to $R_{31}$ in the general formula (IV) form a ring through a direct bond or through a bond via an oxygen or sulfur atom (e.g., when the general formula (IV) represents a repeating unit represented by the general formula (IV-17), (IV-18), or the like shown below), it is preferred from the viewpoint of easy synthesis of a raw material monomer that the carbons should form a ring through a direct bond.

Specific examples of the repeating unit represented by the general formula (IV) include repeating units represented by the following general formulas (IV-1) to (IV-18):

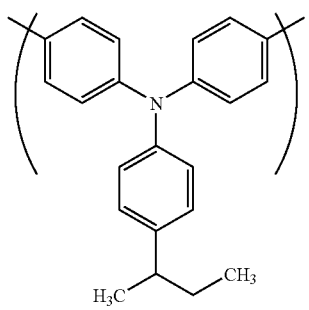 (IV-1)

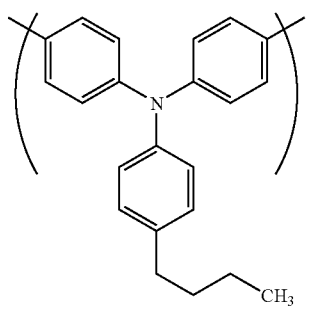 (IV-2)

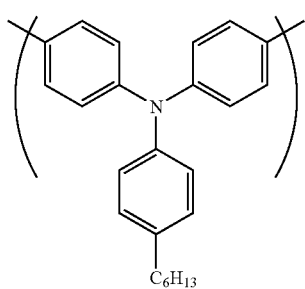 (IV-3)

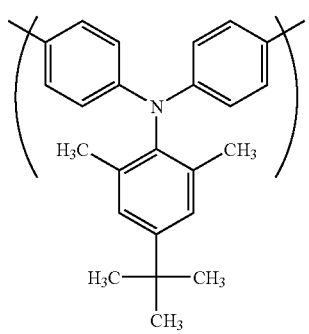 (IV-4)

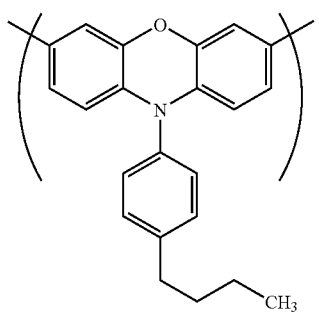 (IV-5)

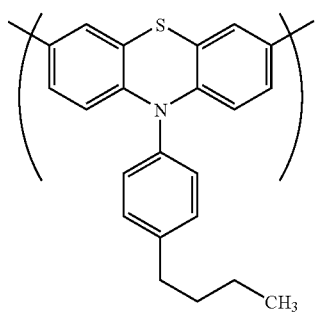 (IV-6)

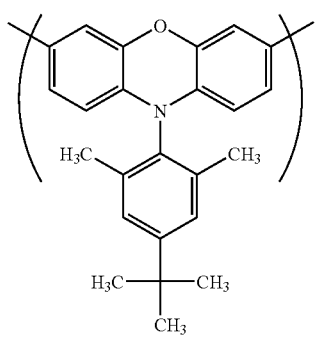 (IV-7)

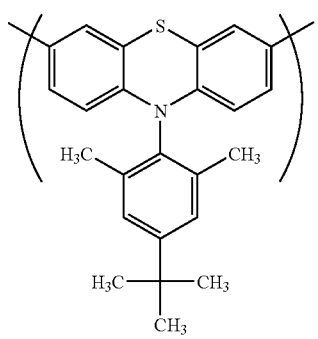 (IV-8)

-continued
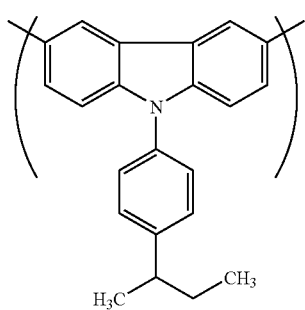 (IV-9)
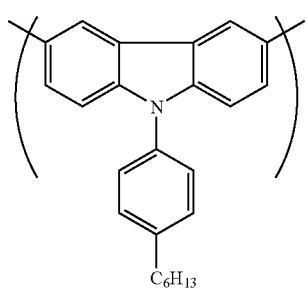 (IV-10)
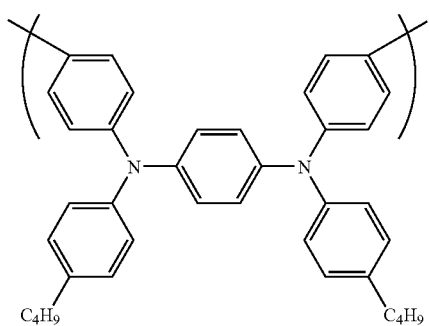 (IV-11)
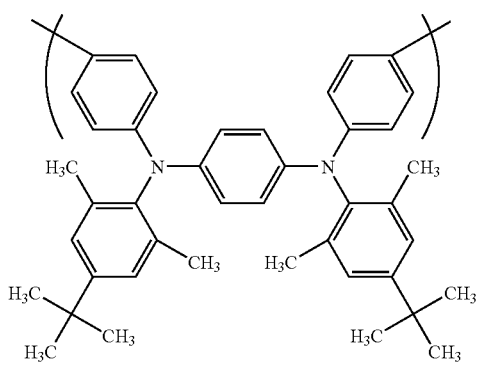 (IV-12)
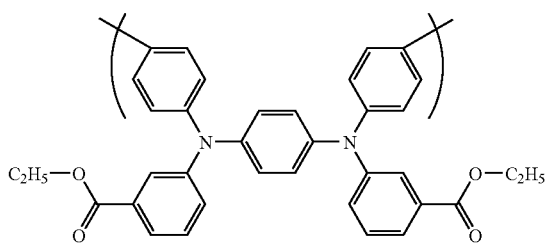 (IV-13)
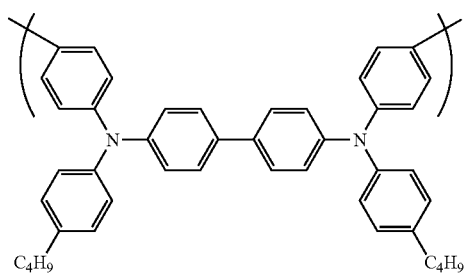 (IV-14)
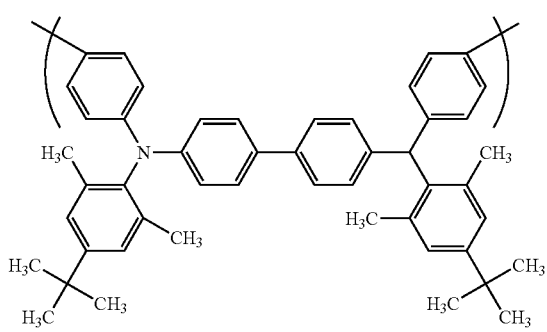 (IV-15)
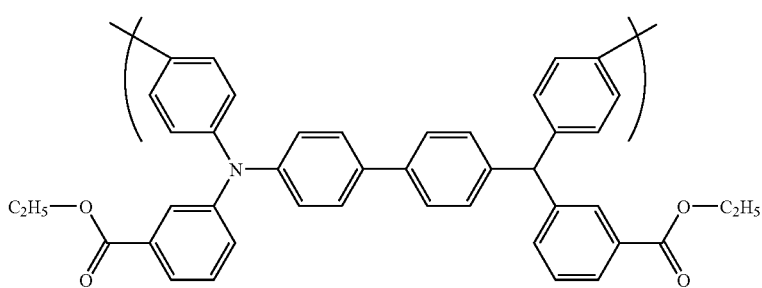 (IV-16)

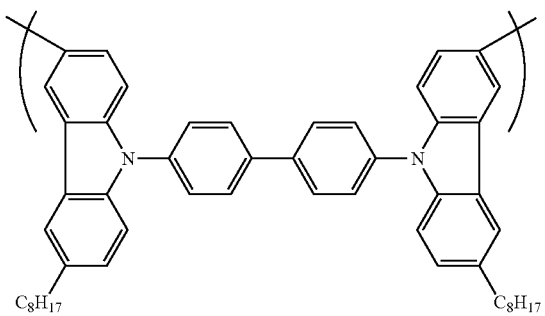
(IV-17)

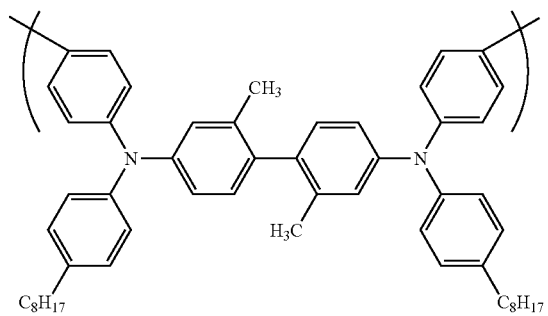
(IV-18)

Moreover, the polymer compound according to the present invention comprises in addition to the repeating unit represented by the general formula (I) and the repeating unit represented by the general formula (II), a repeating unit represented by the following general formula (III), as described above:

—Ar$_2$— (III)

wherein in the formula (III), Ar$_2$ represents an arylene group or a divalent heterocyclic group.

The arylene group that may be selected as Ar$_2$ in the general formula (III) refers to an atomic group derived from aromatic hydrocarbon by removal of two hydrogen atoms and includes those having a condensed ring and those comprising two or more independent benzene rings or condensed rings bonded directly or via a group such as vinylene. Moreover, such an arylene group may have a substituent. The type of such a substituent is not particularly limited. The substituent is preferably an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group and a nitro group from the viewpoint of solubility, fluorescence characteristics, easy synthesis, characteristics as the resulting device, and so on.

Such an arylene group has preferably 6 to 60 (more preferably 6 to 20) carbon atoms in the moiety exclusive of the substituent from the viewpoint of easy synthesis of a raw material monomer. Moreover, such an arylene group has a total of preferably 6 to 100 carbon atoms inclusive of the substituent.

Moreover, examples of such an arylene group include phenylene groups (e.g., groups represented by the following general formulas 1 to 3), naphthalenediyl groups (groups represented by the following general formulas 4 to 13), anthracene-diyl groups (groups represented by the following general formulas 14 to 19), biphenyl-diyl groups (groups represented by the following general formulas 20 to 25), terphenyl-diyl groups (groups represented by the following general formulas 26 to 28), condensed-ring compound groups (groups represented by the following general formulas 29 to 35), fluorene-diyl groups (groups represented by the following general formulas 36 to 38) and benzofluorene-diyl (groups represented by the following general formulas 39 to 46):

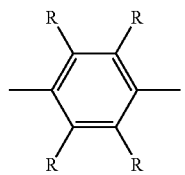
1

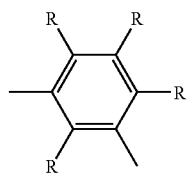
2

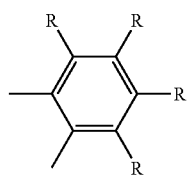
3

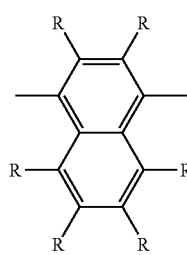
4

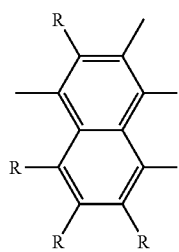
5

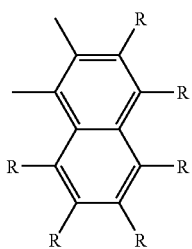
6
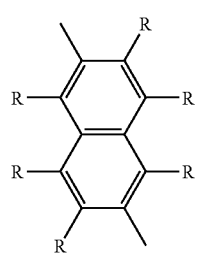
12
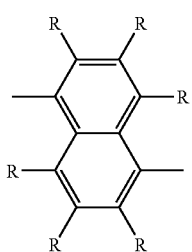
7
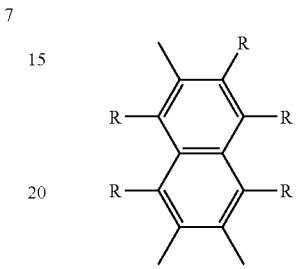
13
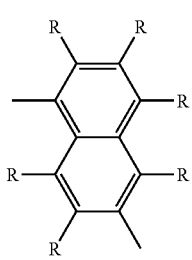
8
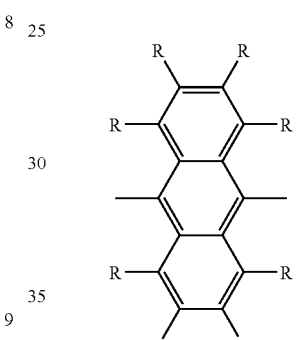
14
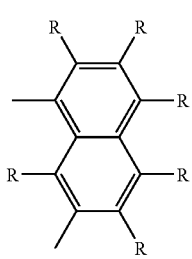
9
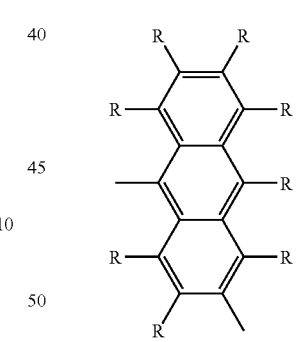
15
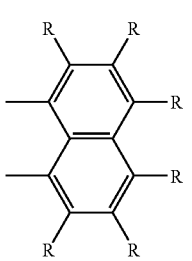
10
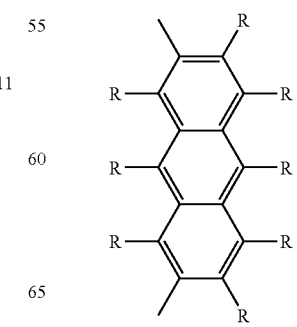
16
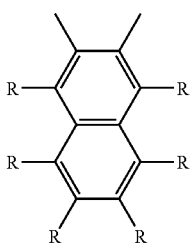
11

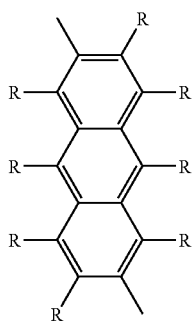
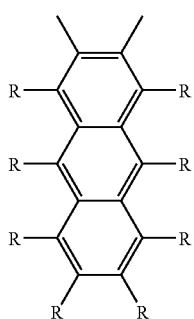
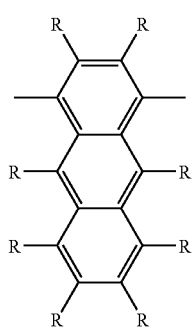
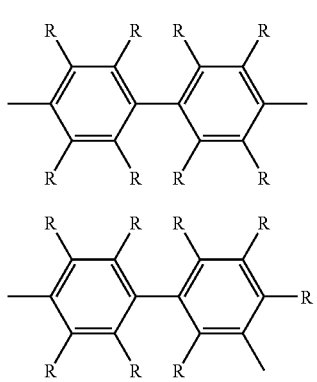
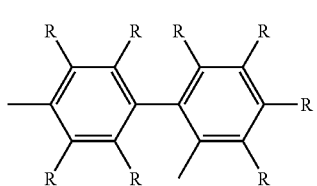
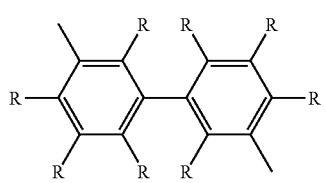
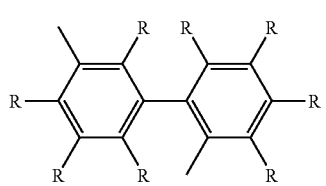
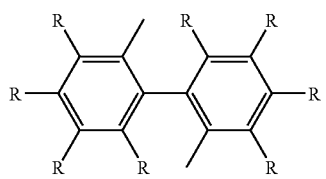
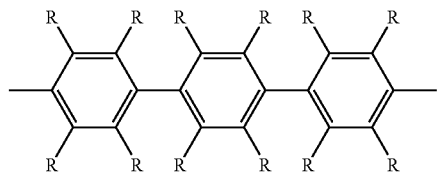
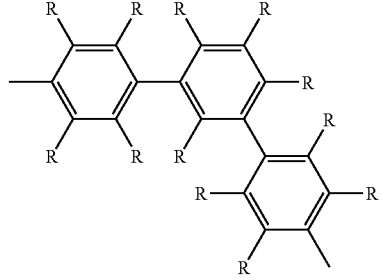
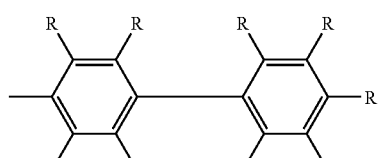
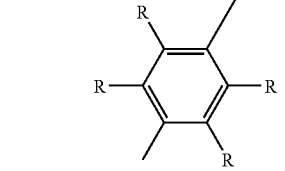
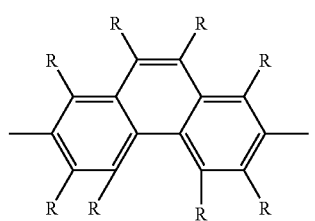

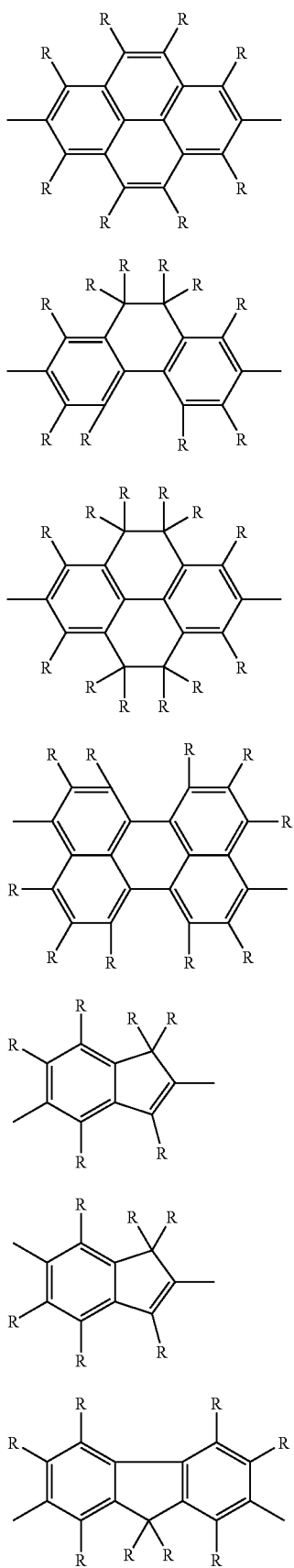
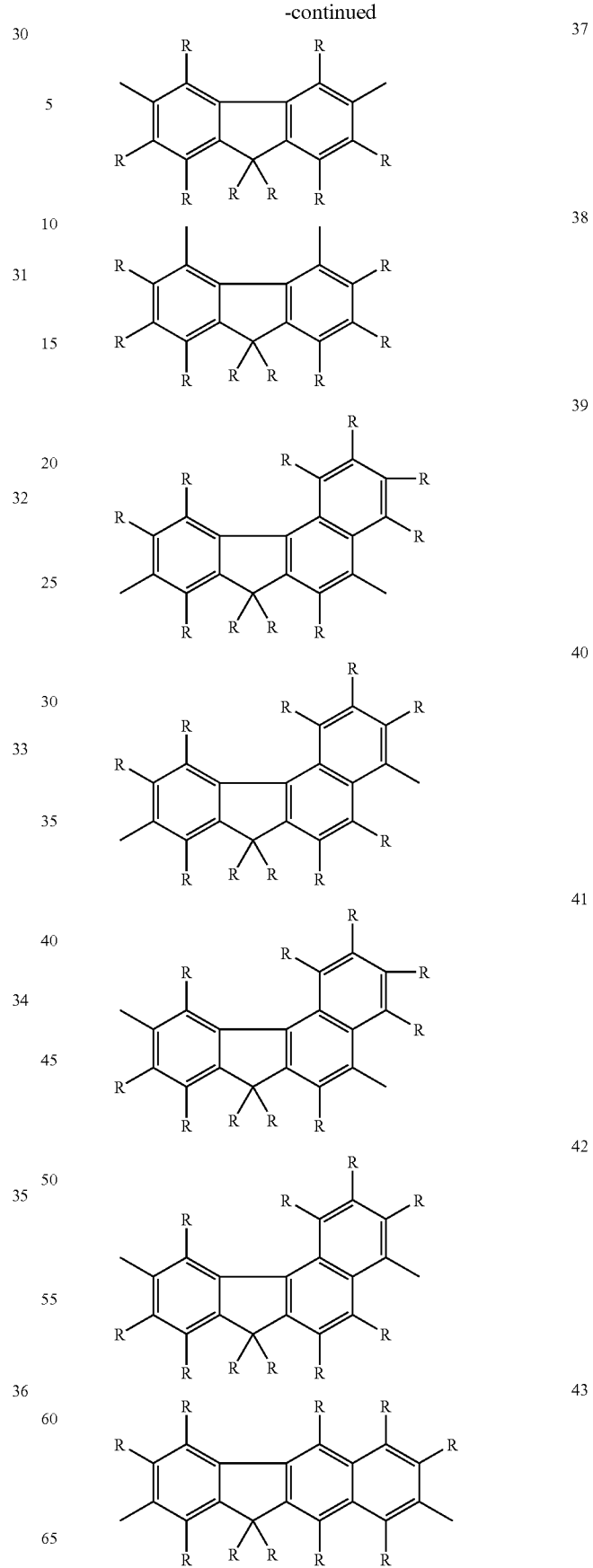

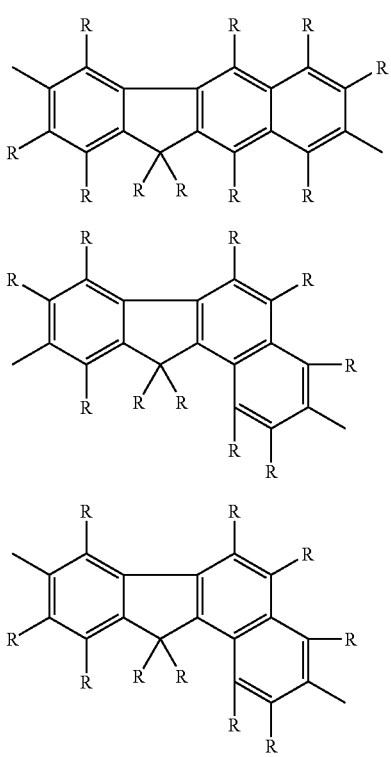

wherein in the formulas 1 to 46, R represents a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group.

Moreover, the divalent heterocyclic group that may be selected as Ar$_2$ in the general formula (III) refers to an atomic group derived from a heterocyclic compound by removal of two hydrogen atoms. Moreover, such a divalent heterocyclic group may have a substituent. Moreover, the heterocyclic compound refers to, of organic compounds having a cyclic structure, those endocyclically containing not only a carbon atom but also heteroatoms such as oxygen, sulfur, nitrogen, phosphorus, boron and arsenic as elements constituting the ring. Among such divalent heterocyclic groups, an aromatic heterocyclic group is preferable. Moreover, the type of the substituent which may be contained in such a divalent heterocyclic group is not particularly limited. The substituent is preferably an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group and a nitro group from the viewpoint of solubility, fluorescence characteristics, easy synthesis, characteristics as the resulting device, and so on.

Moreover, such a divalent heterocyclic group has preferably 3 to 60 (more preferably 3 to 20) carbon atoms in the moiety exclusive of the substituent. Moreover, such a divalent heterocyclic group has a total of preferably 3 to 100 (more preferably 3 to 50) carbon atoms inclusive of the substituent.

Furthermore, examples of such a divalent heterocyclic group include the following groups (a) to (h):

(a) divalent heterocyclic groups which contain nitrogen as a heteroatom: pyridine-diyl groups (groups represented by the following general formulas 101 to 106), diazaphenylene groups (groups represented by the following general formulas 107 to 110), quinolinediyl groups (groups represented by the following general formulas 111 to 125), quinoxalinediyl groups (groups represented by the following general formulas 126 to 130), acridinediyl groups (groups represented by the following general formulas 131 to 134), bipyridyldiyl groups (groups represented by the following general formulas 135 to 137) and phenanthrolinediyl groups (groups represented by the following general formulas 138 to 140);

(b) groups which contain oxygen, silicon, nitrogen, sulfur, selenium, or the like as a heteroatom and have a fluorene structure (groups represented by the following general formulas 141 to 155);

(c) five-membered heterocyclic groups which contain oxygen, silicon, nitrogen, sulfur, selenium, boron, phosphorus, or the like as a heteroatom (groups represented by the following general formulas 156 to 175);

(d) five-membered condensed heterocyclic groups which contain oxygen, silicon, nitrogen, selenium, or the like as a heteroatom (groups represented by the following general formulas 176 to 187);

(e) five-membered heterocyclic groups which contain oxygen, silicon, nitrogen, sulfur, selenium, or the like as a heteroatom and form a dimer or an oligomer through a bond at the α-position relative to the heteroatom (groups represented by the following general formulas 188 to 189);

(f) five-membered heterocyclic groups which contain oxygen, silicon, nitrogen, sulfur, selenium, or the like as a heteroatom and are bonded to a phenyl group at the α-position relative to the heteroatom (groups represented by the following general formulas 190 to 196);

(g) five-membered condensed heterocyclic group which contain oxygen, nitrogen, sulfur, selenium, or the like as a heteroatom and are substituted by a phenyl, furyl or thienyl group (groups represented by the following general formulas 197 to 202); and (h) six-membered heterocyclic groups which contain oxygen, nitrogen, or the like as a heteroatom (groups represented by the following general formulas 203 to 206):

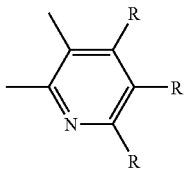

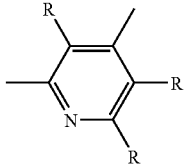

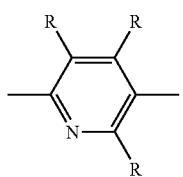 103
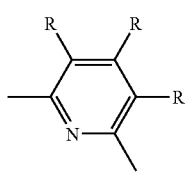 104
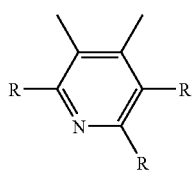 105
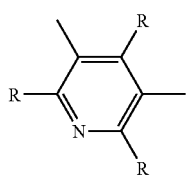 106
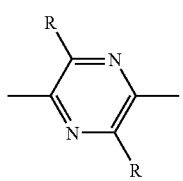 107
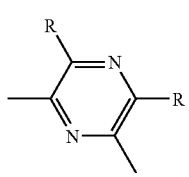 108
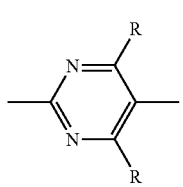 109
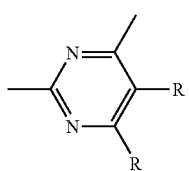 110
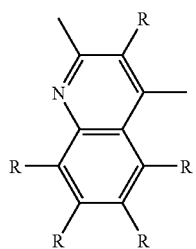 111
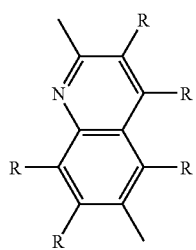 112
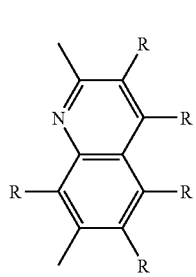 113
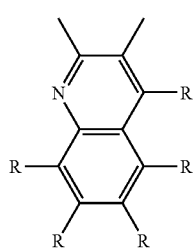 114
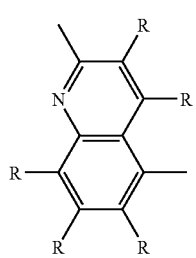 115
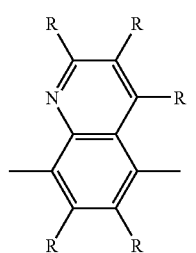 116

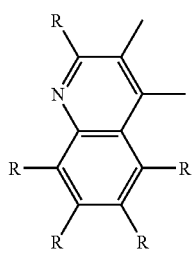 117
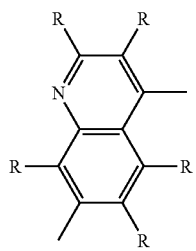 123
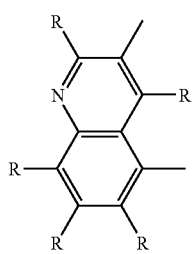 118
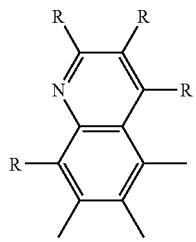 124
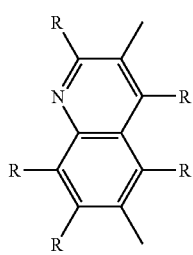 119
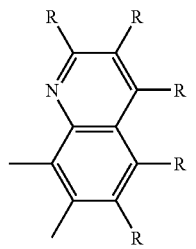 125
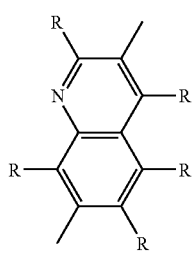 120
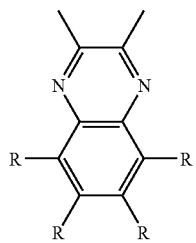 126
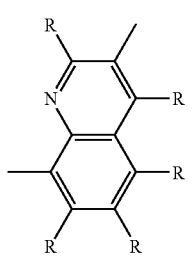 121
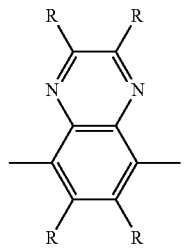 127
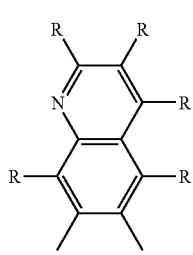 122
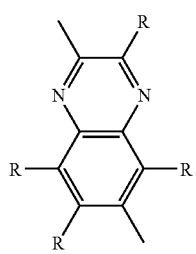 128

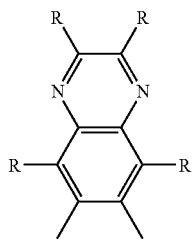
129
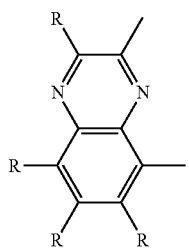
130
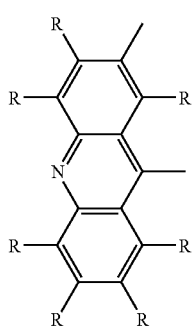
131
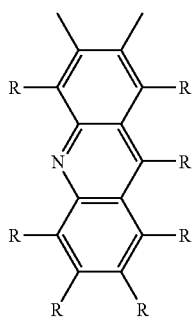
132
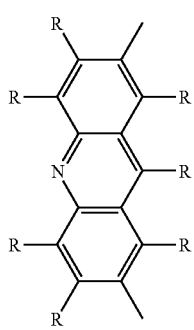
133
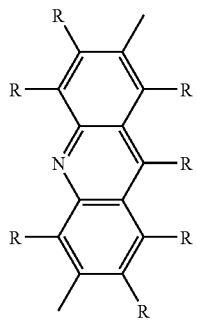
134
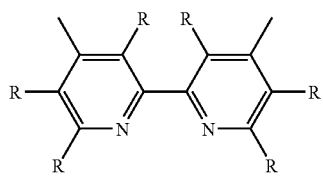
135
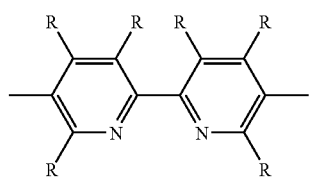
136
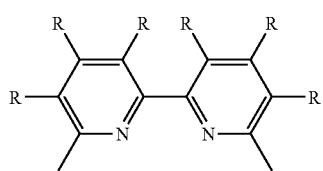
137
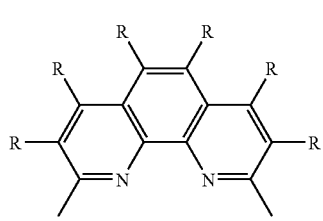
138
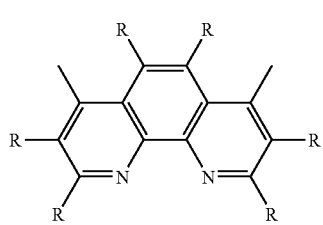
139
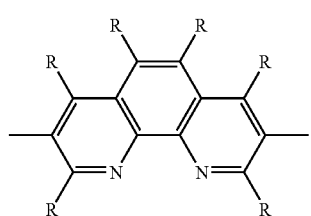
140

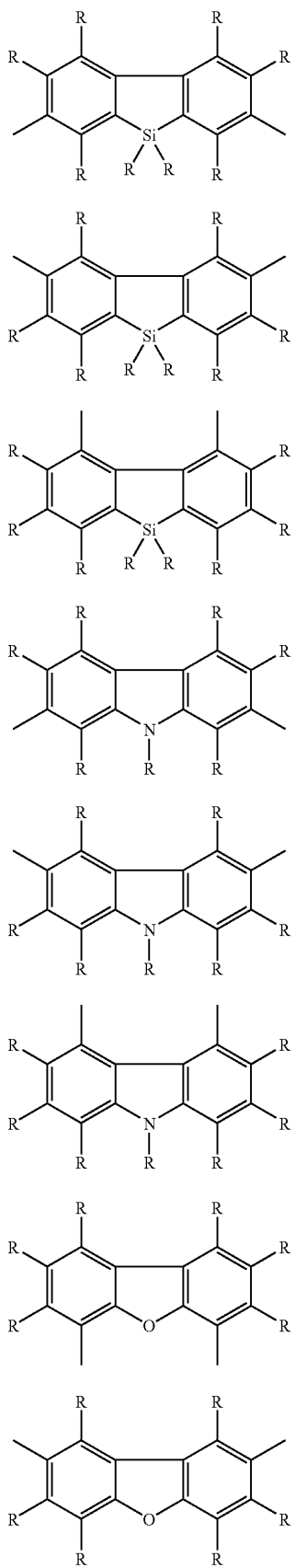
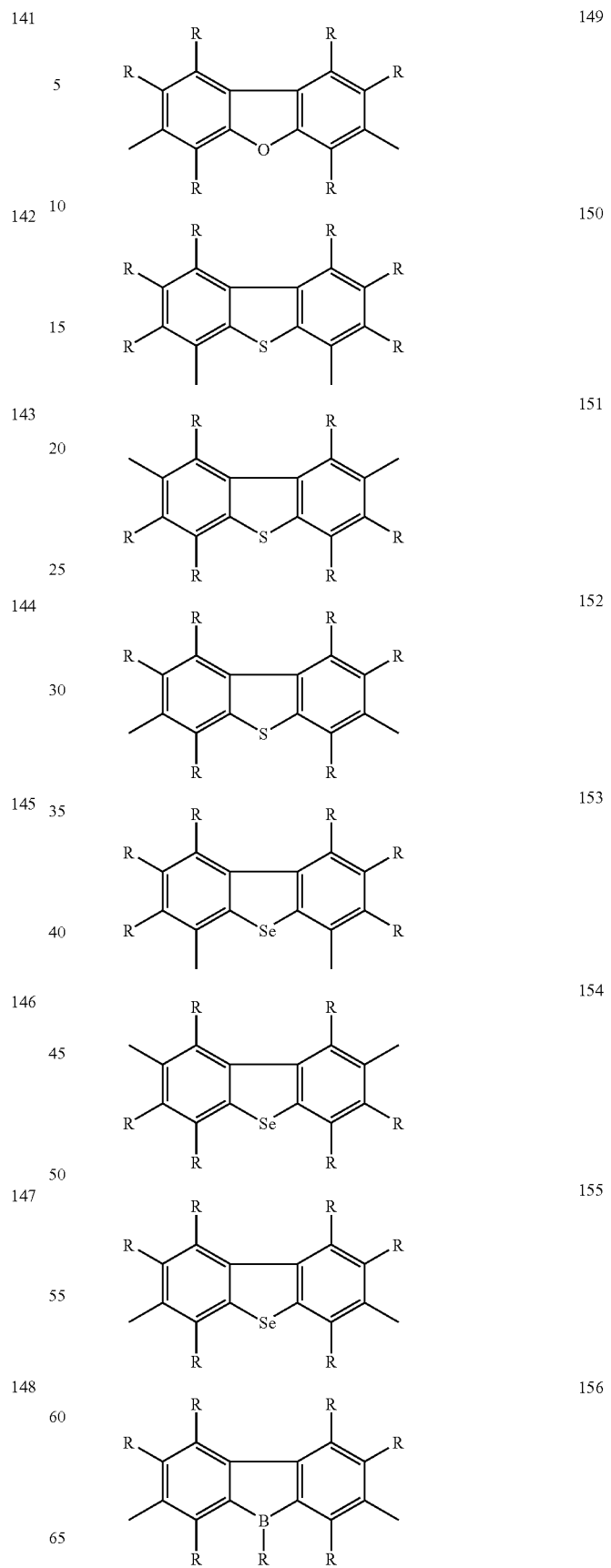

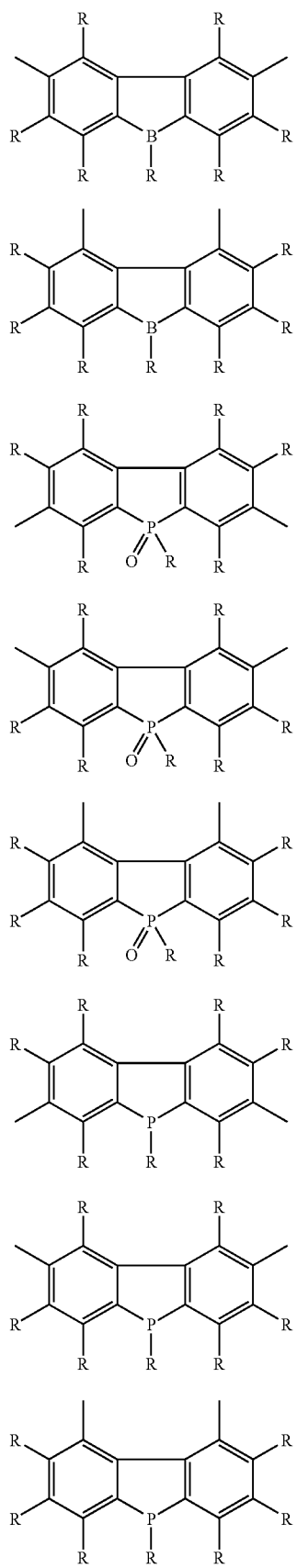
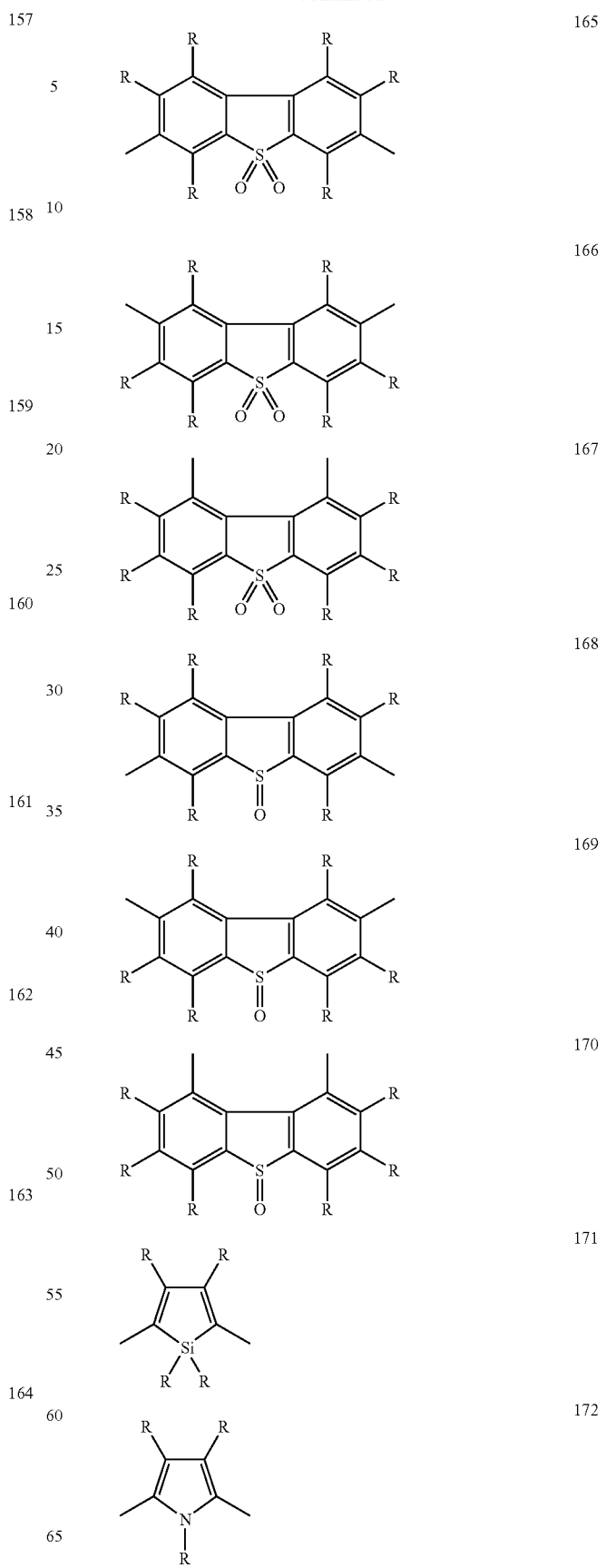

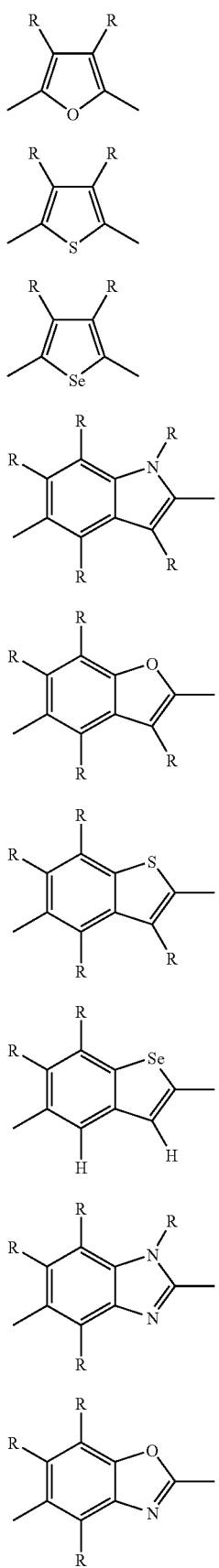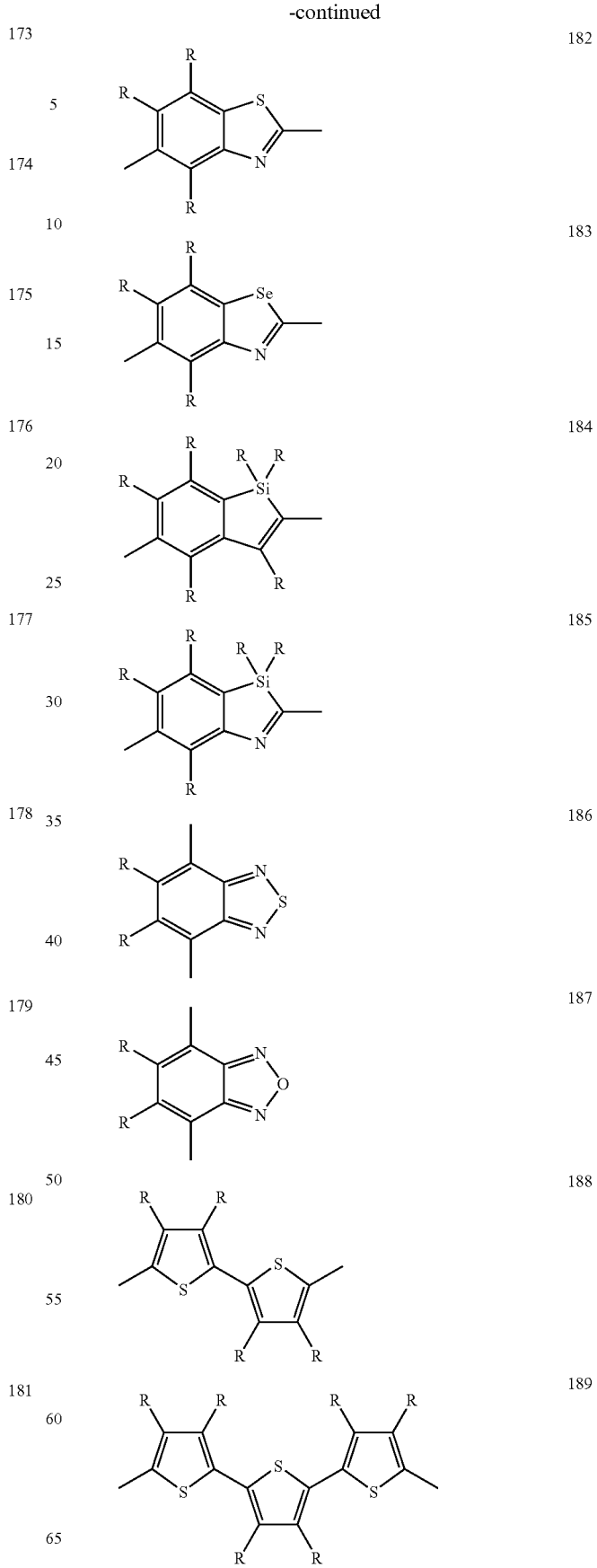

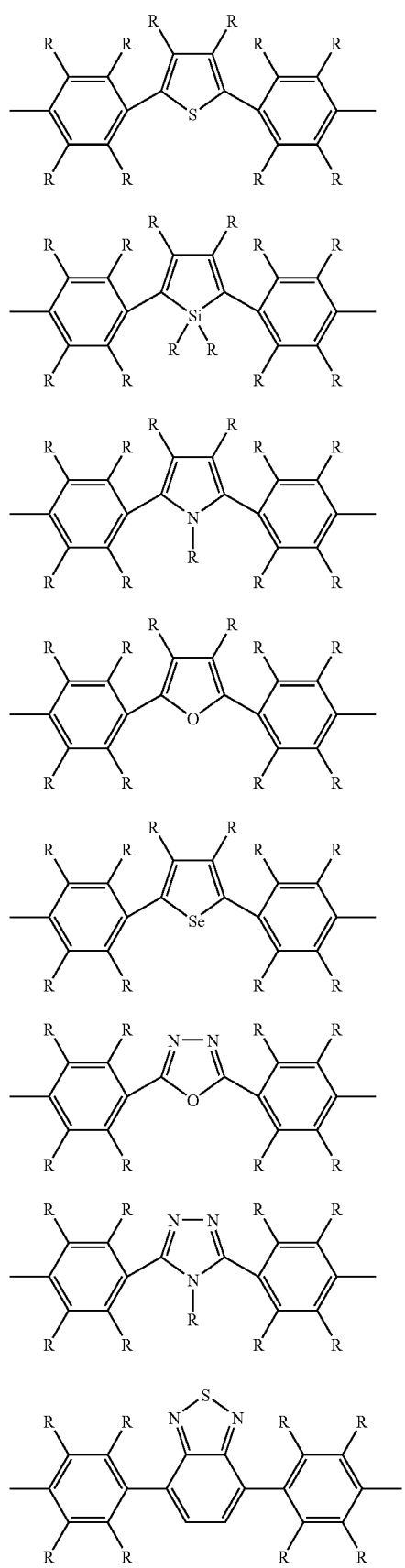
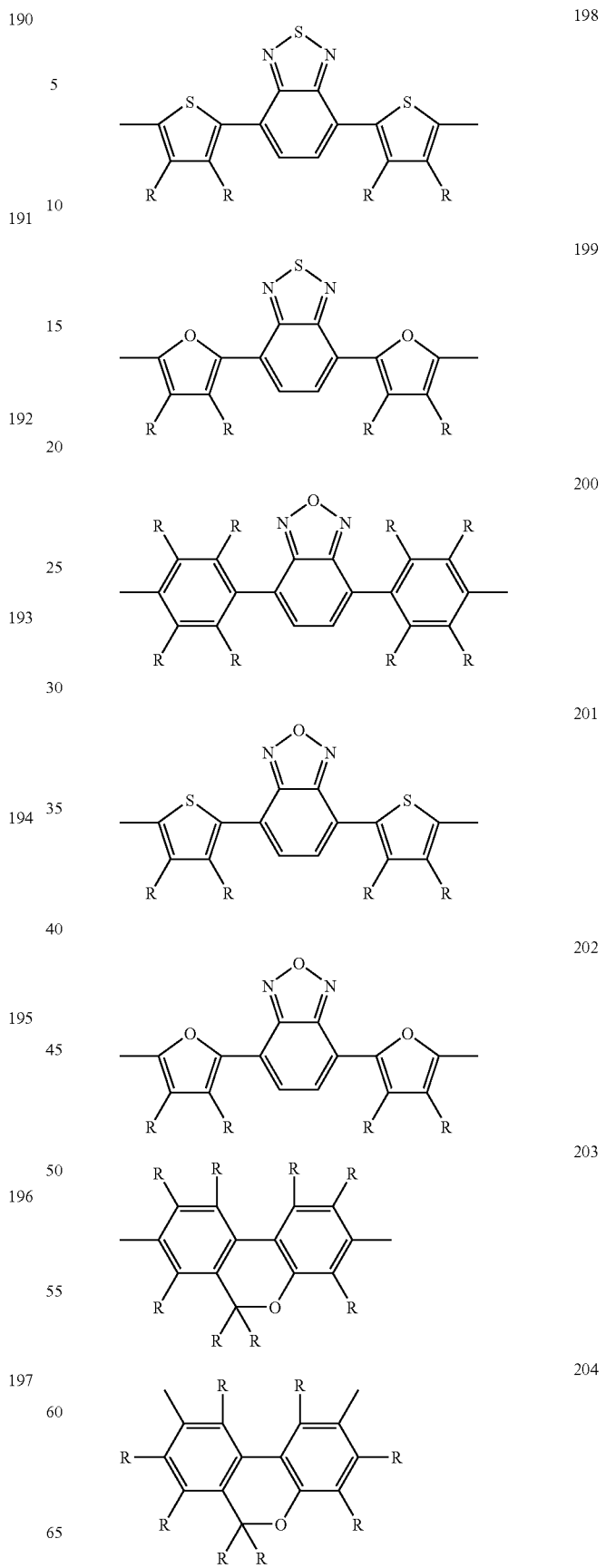

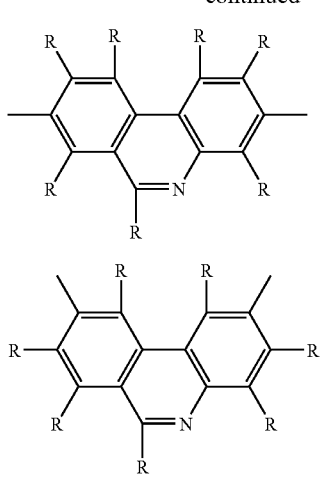

wherein in the formulas 101 to 206, R represents a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the substituted amino group, the substituted silyl group, the halogen atom, the acyl group, the acyloxy group, the imine residue, the amide group, the acid imide group, the monovalent heterocyclic group and the substituted carboxyl group that may be selected as R in the general formulas 1 to 46 and 101 to 206 have the same definition, specific examples, and so on as those described in $R_5$, $R_6$, $R_7$ and $R_8$ in the general formula (I).

Moreover, when $Ar_2$ in the general formula (III) is an arylene group, it is preferably a repeating unit represented by the following general formula (V) from the viewpoint of obtaining a light-emitting device having a longer half-life when the resulting polymer compound is used as a material for the light-emitting device:

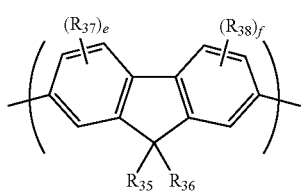

(V)

wherein $R_{35}$ and $R_{36}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{37}$ and $R_{38}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; e and f may be the same or different and each represent an integer of 0 to 3; and when a plurality of $R_{37}$ or $R_{38}$ are present, they may be the same or different.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the substituted amino group, the substituted silyl group, the halogen atom, the acyl group, the acyloxy group, the imine residue, the amide group, the acid imide group, the monovalent heterocyclic group and the substituted carboxyl group that may be selected as $R_{35}$, $R_{36}$, $R_{37}$ or $R_{38}$ in the general formula (V) have the same definition, specific examples, and so on as those described in $R_5$, $R_6$, $R_7$ and $R_8$ in the general formula (I).

$R_{35}$ and $R_{36}$ in the general formula (V) are each independently preferably an alkyl group, an alkoxy group, an aryl group, an aryloxy group, an arylalkyl group, an arylalkoxy group, an arylalkenyl group or a monovalent heterocyclic group, more preferably an alkyl group, an alkoxy group, an aryl group or an aryloxy group, particularly preferably an alkyl group or an aryl group, from the viewpoint of improving the solubility of the polymer compound in an organic solvent.

$R_{37}$ and $R_{38}$ in the general formula (V) are each independently preferably an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group or a monovalent heterocyclic group, more preferably an alkyl group, an alkoxy group, an alkylthio group, an aryl group, an aryloxy group, an arylthio group, an arylalkyl group, an arylalkoxy group or an arylalkylthio group, even more preferably an alkyl group, an alkoxy group, an aryl group or an aryloxy group, particularly preferably an alkyl group or an aryl group, from the viewpoint of easy synthesis of a raw material monomer.

e and f in the general formula (V) are each independently preferably an integer of 0 or 1, particularly preferably 0, from the viewpoint of easy synthesis of a raw material monomer.

Moreover, examples of such a repeating unit represented by the general formula (V) include repeating units represented by the following formulas (V-1) to (V-8):

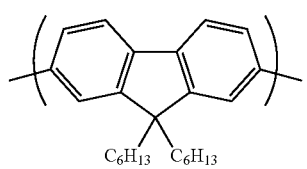

(V-1)

(V-1)

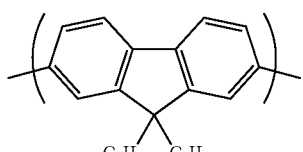

(V-2)

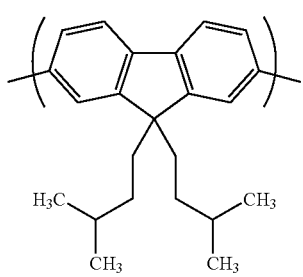

(V-3)

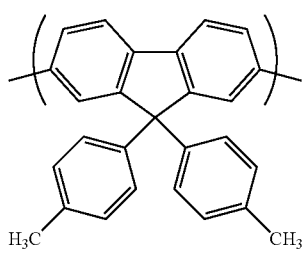

(V-4)

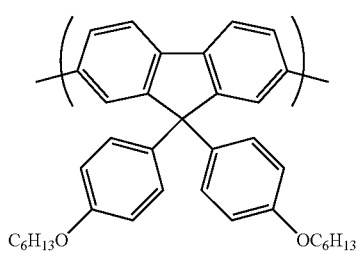

(V-5)

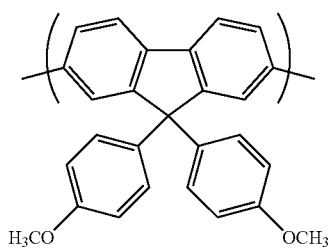

(V-6)

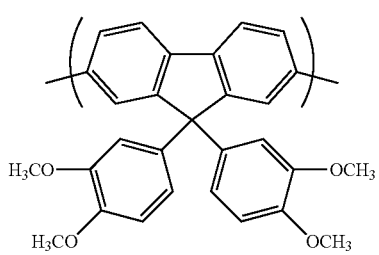

(V-7)

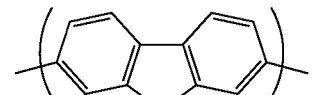

(V-8)

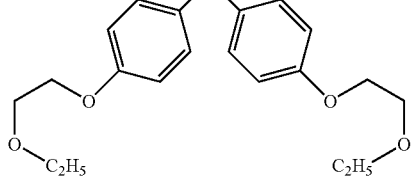

Moreover, when $Ar_2$ in the general formula (III) is an arylene group, it is preferably a repeating unit represented by the following general formula (VI) from the viewpoint of obtaining a light-emitting device having a longer luminance half-life when the resulting polymer compound is used as a material for the light-emitting device:

(VI)

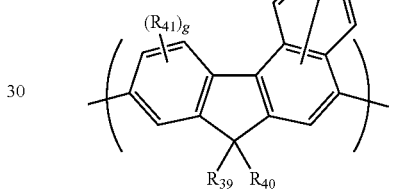

wherein $R_{39}$ and $R_{40}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{41}$ and $R_{42}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; g represents an integer of 0 to 3; h represents an integer of 0 to 5; and when a plurality of $R_{41}$ or $R_{42}$ are present, they may be the same or different.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the substituted amino group, the substituted silyl group, the halogen atom, the acyl group, the acyloxy group, the imine residue, the amide group, the acid imide group, the monovalent heterocyclic group and the substituted carboxyl group that may be selected as $R_{39}$, $R_{40}$, $R_{41}$ or $R_{42}$ in the general formula (VI)

have the same definition, specific examples, and so on as those described in $R_5$, $R_6$, $R_7$ and $R_8$ in the general formula (I).

$R_{39}$ and $R_{40}$ in the general formula (VI) are each independently preferably an alkyl group, an alkoxy group, an aryl group, an aryloxy group, an arylalkyl group, an arylalkoxy group, an arylalkenyl group or a monovalent heterocyclic group, more preferably an alkyl group, an alkoxy group, an aryl group or an aryloxy group, particularly preferably an alkyl group or an aryl group, from the viewpoint of improving the solubility of the polymer compound in an organic solvent.

Moreover, $R_{41}$ and $R_{42}$ in the general formula (VI) are each independently preferably an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group or a monovalent heterocyclic group, more preferably an alkyl group, an alkoxy group, an alkylthio group, an aryl group, an aryloxy group, an arylthio group, an arylalkyl group, an arylalkoxy group or an arylalkylthio group, even more preferably an alkyl group, an alkoxy group, an aryl group or an aryloxy group, particularly preferably an alkyl group or an aryl group, from the viewpoint of easy synthesis of a raw material monomer.

g in the general formula (VI) is preferably an integer of 0 or 1, particularly preferably 0, from the viewpoint of easy synthesis of a raw material monomer.

h in the general formula (VI) is preferably an integer of 0 or 1, particularly preferably 0, from the viewpoint of easy synthesis of a raw material monomer.

Moreover, examples of such a repeating unit represented by the general formula (VI) include repeating units represented by the following formulas (VI-1) to (VI-8):

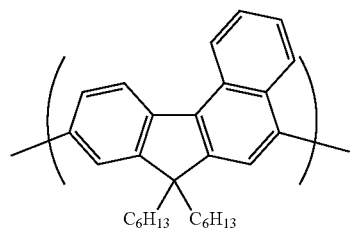
(VI-1)

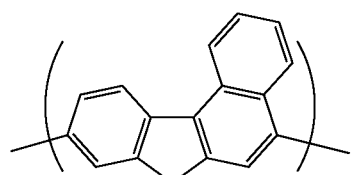
(VI-2)

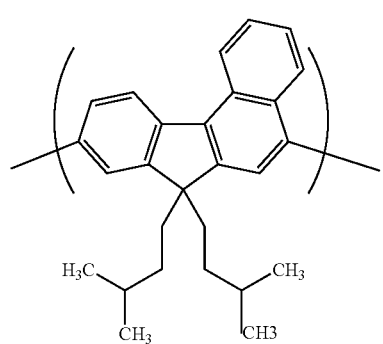
(VI-3)

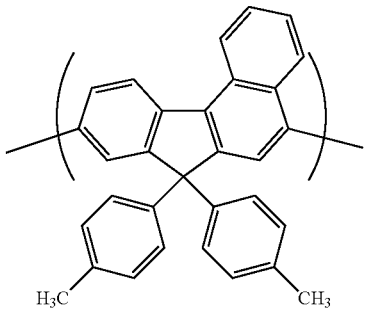
(VI-4)

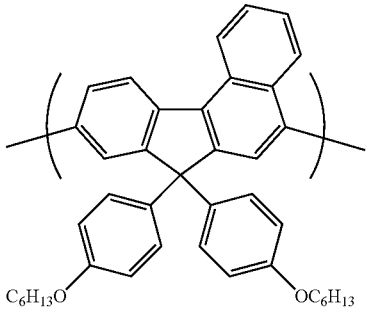
(VI-5)

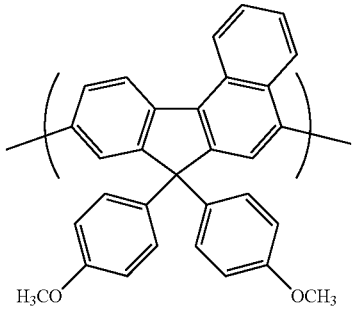
(VI-6)

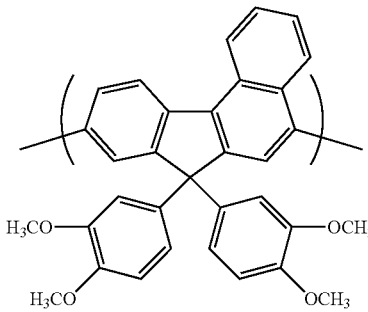
(VI-7)

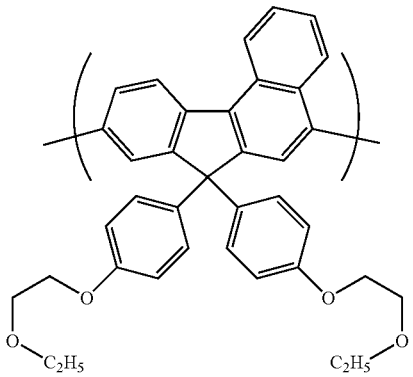
(VI-8)

Furthermore, when $Ar_2$ in the general formula (III) is a divalent heterocyclic group, it is preferably a repeating unit represented by the following general formula (VII) from the viewpoint of obtaining a light-emitting device having a longer half-life when the resulting polymer compound is used as a material for the light-emitting device:

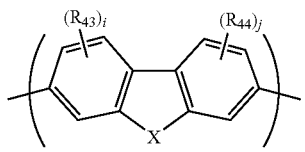
(VII)

wherein X represents an oxygen atom or a sulfur atom; $R_{43}$ and $R_{44}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; i and j may be the same or different and each represent an integer of 0 to 3; and when a plurality of $R_{43}$ or $R_{44}$ are present, they may be the same or different.

The alkyl group, the alkoxy group, the alkylthio group, the aryl group, the aryloxy group, the arylthio group, the arylalkyl group, the arylalkoxy group, the arylalkylthio group, the arylalkenyl group, the arylalkynyl group, the substituted amino group, the substituted silyl group, the halogen atom, the acyl group, the acyloxy group, the imine residue, the amide group, the acid imide group, the monovalent heterocyclic group and the substituted carboxyl group that may be selected as $R_{43}$ or $R_{44}$ in the general formula (VII) have the same definition, specific examples, and so on as those described in $R_5$, $R_6$, $R_7$ and $R_8$ in the general formula (I).

$R_{43}$ and $R_{44}$ in the general formula (VII) are each independently preferably an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group or a monovalent heterocyclic group, more preferably an alkyl group, an alkoxy group, an alkylthio group, an aryl group, an aryloxy group, an arylthio group, an arylalkyl group, an arylalkoxy group or an arylalkylthio group, even more preferably an alkyl group, an alkoxy group, an aryl group or an aryloxy group, particularly preferably an alkyl group or an alkoxy group, from the viewpoint of easy synthesis of a raw material monomer.

i and j in the general formula (VII) are each independently an integer of 0 or 1 from the viewpoint of easy synthesis of a raw material monomer and particularly preferably 1 from the viewpoint of improving the solubility of the polymer compound in an organic solvent.

Examples of the repeating unit represented by the general formula (VII) include repeating units represented by the following formulas (VII-1) to (VII-8):

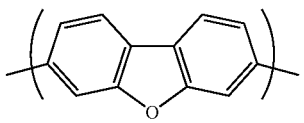
(VII-1)

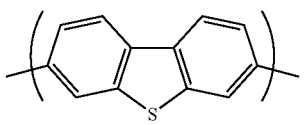
(VII-2)

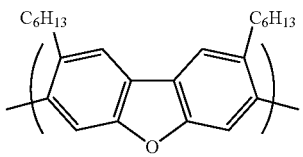
(VII-3)

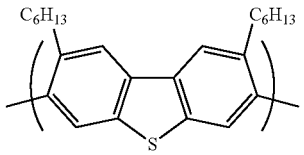
(VII-4)

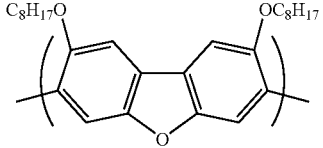
(VII-5)

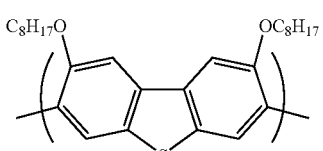
(VII-6)

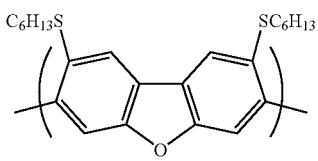
(VII-7)

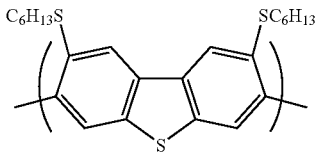
(VII-8)

Moreover, among the repeating units represented by the general formulas (V), (VI) and (VII), the repeating unit represented by the general formula (V) is more preferable from the viewpoint of a long luminance half-life of the polymer light-emitting device.

Moreover, the polymer compound according to the present invention may comprise two or more of each of the repeating unit represented by the general formula (I), the repeating unit represented by the general formula (II) and the repeating unit represented by the general formula (III).

Furthermore, the polymer compound according to the present invention may comprise at least one additional repeating unit in addition to the repeating units represented by the general formulas (I) to (III) from the viewpoint of, for example, changing charge transport properties and improving heat resistance. Such an additional repeating unit is preferably a repeating unit represented by the following general formula (A):

wherein $Ar_a$ each independently represents an arylene group or a divalent heterocyclic group.

Moreover, such a repeating unit represented by the general formula (A) is preferably a repeating unit represented by the following general formula (B), (C), (D) or (E):

wherein $R_a$ represents an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $\alpha$ represents an integer of 0 to 4; and when a plurality of $R_a$ are present, they may be the same or different.

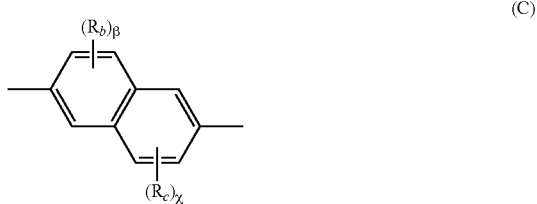

wherein $R_b$ and $R_c$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $\beta$ and $\chi$ may be the same or different and each represent an integer of 0 to 3; and when a plurality of $R_b$ or $R_c$ are present, they may be the same or different.

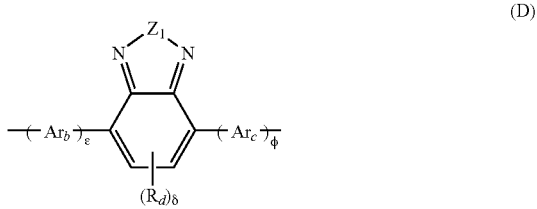

wherein $R_d$ represents an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $\delta$ represents an integer of 0 to 2; $Ar_b$ and $Ar_c$ may be the same or different and each represent an arylene group, a divalent heterocyclic group or a divalent group having a metal complex structure; $\epsilon$ and $\phi$ may be the same or different and each represent an integer of 0 or 1; $Z_1$ represents O, S, SO, $SO_2$, Se or Te; and when a plurality of $R_d$ are present, they may be the same or different.

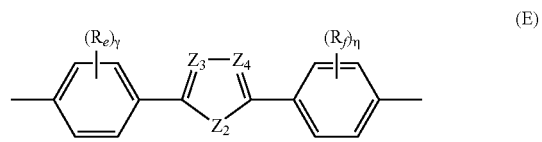

wherein $R_e$ and $R_f$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $\gamma$ and $\eta$ may be the same or different and each represent an integer of 0 to 4; $Z_2$ represents O, S, $SO_2$, Se, Te, N—$R_g$ or $SiR_hR_i$; $Z_3$ and $Z_4$ may be the same or different and each represent N or C—$R_j$; $R_g$, $R_h$, $R_i$ and $R_j$ may be the same or different and each represent a hydrogen atom, an alkyl group, an aryl group, an arylalkyl group or a monovalent heterocyclic group; and when a plurality of $R_e$ or $R_f$ are present, they may be the same or different.

Moreover, examples of the five-membered ring at the center of the repeating unit represented by the general formula (E) include thiadiazole, oxadiazole, triazole, thiophene, furan and silole.

Moreover, the contents of the repeating units represented by the general formulas (I) to (III) in the polymer compound according to the present invention are preferably in the range of 0.02 mol % to 30 mol % (more preferably 0.1 mol % to 20 mol %) of the repeating unit represented by the general formula (I), 10 mol % to 90 mol % (more preferably 10 mol % to 80 mol %) of the repeating unit represented by the general formula (II), and 5 mol % to 95 mol % (more preferably 10 mol % to 80 mol %) of the repeating unit represented by the general formula (III), with respect to the amount of a raw material monomer added.

When the content of the repeating unit represented by the general formula (I) in such a polymer compound is less than the lower limit, the resulting polymer light-emitting device tends to have a short luminance half-life. On the other hand, when the content exceeds the upper limit, the obtained polymer compound tends to have reduced solubility in an organic solvent.

Moreover, when the content of the repeating unit represented by the general formula (II) in the polymer compound is less than the lower limit, the resulting polymer light-emitting device tends to have reduced hole transport properties and reduced luminous efficiency. On the other hand, when the content exceeds the upper limit, the obtained polymer compound tends to have reduced solubility in an organic solvent.

Furthermore, when the content of the repeating unit represented by the general formula (III) in the polymer compound is less than the lower limit, the obtained polymer compound tends to have reduced solubility in an organic solvent. On the other hand, when the content exceeds the upper limit, the resulting polymer light-emitting device tends to have reduced hole transport properties and reduced luminous efficiency.

Moreover, the polymer compound according to the present invention has a number average molecular weight based on polystyrene standards of preferably $10^3$ to $10^8$, more preferably $10^3$ to $10^7$, even more preferably $10^4$ to $10^7$, and a weight average molecular weight based on polystyrene standards of preferably $10^3$ to $10^7$, more preferably $10^3$ to $10^6$, even more preferably $10^4$ to $10^6$, from the viewpoint of lifetime characteristics of the polymer light-emitting device.

In the present invention, the "number average molecular weight" and the "weight average molecular weight" are determined as a number average molecular weight and a weight average molecular weight, respectively, based on polystyrene standards using size exclusion chromatography (SEC) (manufactured by Shimadzu Corp.; LC-10Avp). Moreover, a sample to be measured is dissolved at a concentration of approximately 0.5 wt % in tetrahydrofuran and injected in an amount of 50 μL in GPC. Furthermore, tetrahydrofuran is used as a GPC mobile phase at a flow rate of 0.6 mL/min. Moreover, two TSKgel SuperHM-H (manufactured by TOSOH CORP.) columns and one TSKgel SuperH2000 (manufactured by TOSOH CORP.) column are connected in series and used as a column. Moreover, a differential refractive index detector (manufactured by Shimadzu Corp.; RID-10A) is used as a detector.

Moreover, the polymer compound according to the present invention may be a random, block or graft copolymer or may be a polymer having a structure intermediate therebetween, for example, a random copolymer that assumes blockiness. Moreover, such a polymer compound is preferably a random copolymer that assumes blockiness or a block or graft copolymer, rather than a complete random copolymer form the viewpoint of obtaining a polymer light-emitting substance having a high fluorescence or phosphorescence quantum yield. In this context, such a copolymer includes those having the main chain with branches and three or more ends; and dendrimers.

Moreover, if the polymer compound according to the present invention has a polymerizable active group remaining as an end group, the polymer light-emitting device of the present invention is likely to have reduced emission characteristics or lifetime characteristics. Therefore, the end group may be protected with a stable group. When the end group is thus protected with a stable group, it is preferred that the polymer compound should have a conjugated bond consecutive to the conjugated structure of the main chain. Examples of the structure thereof include a structure bonded to an aryl group or a heterocyclic group via a carbon-carbon bond. Examples of such a stable group for protecting the end group include substituents such as a monovalent aromatic compound group represented by a structural formula as Formula 10 in JP-A-9-45478.

Next, a method for producing the polymer compound according to the present invention will be described. Examples of a preferable method for producing the polymer compound according to the present invention can include a method comprising appropriately selecting, as one of raw materials, a compound represented by the following general formula (X):

$$Y_1\text{-}A\text{-}Y_2 \qquad (X)$$

wherein -A- represents each of the repeating units represented by the general formulas (I) to (III) or the repeating unit represented by $Ar_a$ in the general formula (A); and $Y_1$ and $Y_2$ may be the same or different and each represent a condensation-polymerizable substituent, or, particularly, selecting, as each essential component, a compound represented by the general formula (X) wherein -A- is each of the repeating units represented by the general formulas (I), (II) and (III), and condensation-polymerizing these raw materials or essential components.

Moreover, when the polymer compound according to the present invention contains, in addition to the repeating units represented by -A- in the formula (X), an additional repeating unit other than the -A-, a compound having the additional repeating unit other than the -A- and two substituents that participate in condensation polymerization needs only to be condensation-polymerized together with the compounds represented by the formula (X).

Such a compound having two condensation-polymerizable substituents, which is used to form the additional repeating unit, is exemplified by a compound represented by the following formula (XI):

$$Y_3\text{—}Ar_a\text{—}Y_4 \qquad (XI)$$

wherein $Ar_a$ is as defined above; and $Y_3$ and $Y_4$ each independently represent the substituent that participates in condensation polymerization. In this way, the compound represented by $Y_3$—$Ar_a$—$Y_4$ can be condensation-polymerized together with the compounds represented by $Y_1$-A-$Y_2$ to produce the polymer compound according to the present invention further having the repeating unit represented by —$Ar_a$—.

Moreover, examples of a compound having two substituents that participate in condensation polymerization, which corresponds to the additional repeating unit represented by the formula (E) other than the repeating units represented by the general formulas (I), (II) and (III), include a compound represented by the following general formula (H):

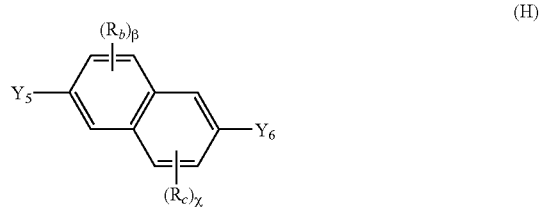

wherein $R_b$, $R_c$, $\beta$ and $\chi$ are the same as those described in the formula (E); and $Y_5$ and $Y_6$ each independently represent the substituent that participates in condensation polymerization.

Examples of such substituents ($Y_1$, $Y_2$, $Y_3$, $Y_4$, $Y_5$ and $Y_6$) that participate in condensation polymerization include a halogen atom, an alkylsulfonate group, an arylsulfonate group, an arylalkylsulfonate group, a borate group, a sulfonium methyl group, a phosphonium methyl group, a phosphonatomethyl group, a methyl monohalide group, —B(OH)$_2$, a formyl group, a cyano group and a vinyl group.

Examples of such a halogen atom that may be selected as a substituent that participates in condensation polymerization include fluorine, chlorine, bromine and iodine atoms.

Moreover, the alkylsulfonate group that may be selected as a substituent that participates in condensation polymerization is exemplified by methanesulfonate, ethanesulfonate and trifluoromethanesulfonate groups. The arylsulfonate that may be selected as such a substituent is exemplified by benzenesulfonate and p-toluenesulfonate groups. The arylsulfonate group that may be selected as such a substituent is exemplified by a benzylsulfonate group.

Moreover, the borate group that may be selected as a substituent that participates in condensation polymerization is exemplified by a group represented by the following formula:

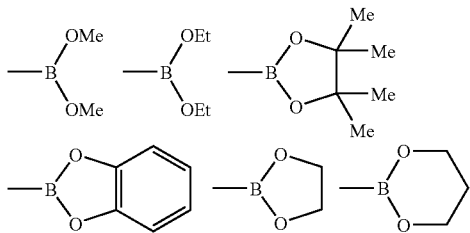

wherein Me represents a methyl group; and Et represents an ethyl group.

Furthermore, the sulfonium methyl group that may be selected as a substituent that participates in condensation polymerization is exemplified by a group represented by the following formula:

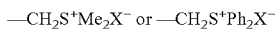

—$CH_2S^+Me_2X^-$ or —$CH_2S^+Ph_2X^-$ wherein X represents a halogen atom; and Ph represents a phenyl group.

Moreover, the phosphonium methyl group that may be selected as a substituent that participates in condensation polymerization is exemplified by a group represented by the following formula:

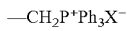

—$CH_2P^+Ph_3X^-$ wherein X represents a halogen atom.

Moreover, the phosphonatomethyl group that may be selected as a substituent that participates in condensation polymerization is exemplified by a group represented by the following formula:

—$CH_2PO(OR')_2$ wherein X represents a halogen atom; and R' represents an alkyl group, an aryl group or an arylalkyl group.

Furthermore, the methyl monohalide group that may be selected as a substituent that participates in condensation polymerization is exemplified by methyl fluoride, methyl chloride, methyl bromide and methyl iodide groups.

Furthermore, substituents preferable as the substituents that participate in condensation polymerization differ depending on the type of a polymerization reaction. Examples thereof include a halogen atom, an alkylsulfonate group, an arylsulfonate group and an arylalkylsulfonate group for use of a zerovalent nickel (Ni(0)) complex, such as Yamamoto coupling reaction. Moreover, examples thereof include an alkylsulfonate group, a halogen atom, a borate group and —$B(OH)_2$ for use of a nickel or palladium catalyst, such as Suzuki coupling reaction.

For producing the polymer compound according to the present invention, for example, a polymerization method may be adopted which comprises: dissolving, in an organic solvent if necessary, the compounds (monomers) represented by the general formula (X) or (XI) having a plurality of substituents that participate in condensation polymerization; and reacting the solution at a temperature between the melting point and the boiling point (inclusive) of the organic solvent by appropriately using an alkali or an appropriate catalyst. For example, methods known in the art such as methods described in, e.g., "Organic Reactions", vol. 14, p. 270-490, John Wiley & Sons, Inc., 1965, "Organic Syntheses", Collective Volume VI, p. 407-411, John Wiley & Sons, Inc., 1988, Chem. Rev., vol. 95, p. 2457 (1995), J. Organomet. Chem., vol. 576, p. 147 (1999), Macromol. Chem., Macromol. Symp., vol. 12, p. 229 (1987) can be adopted appropriately as such a polymerization method.

Moreover, when the polymer compound according to the present invention is prepared as a block copolymer, methods known in the art such as a method described in the pamphlet of WO2005/36666 can be adopted appropriately.

Moreover, for producing the polymer compound according to the present invention, a known condensation polymerization reaction may be adopted appropriately according to the substituents that participate in condensation polymerization. Examples of such a polymerization method include a method comprising polymerizing the corresponding monomers through Suzuki coupling reaction, a method comprising polymerizing the corresponding monomers through Grignard reaction, a method comprising polymerizing the corresponding monomers using a Ni(0) complex, a method comprising polymerizing the corresponding monomers using an oxidizing agent such as $FeCl_3$, a method comprising electrochemically oxidation-polymerizing the corresponding monomers, and a method comprising decomposing an intermediate polymer having an appropriate leaving group. Among such polymerization reactions, a method comprising polymerizing the monomers through Suzuki coupling reaction, a method comprising polymerizing the monomers through Grignard reaction, and a method comprising polymerizing the monomers using a Ni(0) complex are preferable because the structure of the obtained polymer compound is easily controlled.

Furthermore, for producing the polymer compound according to the present invention, a method is preferably adopted which comprises each independently selecting the substituents ($Y_1$ and $Y_2$) that participate in condensation polymerization from a halogen atom, an alkylsulfonate group, an arylsulfonate group and an arylalkylsulfonate group and condensation-polymerizing the corresponding compounds in the presence of a Ni(0) complex to produce the polymer compound. Examples of the raw material compounds represented by the general formula (X) used in such a method include a dihalogenated compound, a bis(alkylsulfonate) compound, a bis(arylsulfonate) compound, a bis(arylalkylsulfonate) compound, a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound and an arylsulfonate-arylalkylsulfonate compound.

One example of a method for producing the polymer compound using such raw material compounds includes a method for producing a sequence-controlled polymer compound by using a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound or an arylsulfonate-arylalkylsulfonate compound.

Moreover, for producing the polymer compound according to the present invention, a method is preferably adopted which comprises each independently selecting the substituents ($Y_1$ and $Y_2$) that participate in condensation polymerization from a halogen atom, an alkylsulfonate group, an arylsulfonate group, an arylalkylsulfonate group, a boric acid group and a borate group and condensation-polymerizing the corresponding compounds using a nickel or palladium catalyst to produce the polymer compound, wherein the ratio of the total number of moles (K) of the boric acid group (—B(OH)$_2$) and the borate group contained in all the raw material compounds to the total number of moles (J) of the halogen atom, the alkylsulfonate group, the arylsulfonate group and the arylalkylsulfonate group contained therein is substantially 1 (usually K/J ranges from 0.7 to 1.2).

Specific examples of combinations of the raw material compounds in such an adopted method for producing the polymer compound include combinations of a dihalogenated compound, a bis(alkylsulfonate) compound, a bis(arylsulfonate) compound or a bis(arylalkylsulfonate) compound with a diboric acid compound or a diborate compound. Moreover, other examples of combinations of the raw material compounds include a halogen-boric acid compound, a halogen-borate compound, an alkylsulfonate-boric acid compound, an alkylsulfonate-borate compound, an arylsulfonate-boric acid compound, an arylsulfonate-borate compound, an arylalkylsulfonate-boric acid compound and an arylalkylsulfonate-borate compound.

Moreover, one example of a method for producing the polymer compound using such raw material compounds includes a method for producing a sequence-controlled polymer compound by using a halogen-boric acid compound, a halogen-borate compound, an alkylsulfonate-boric acid compound, an alkylsulfonate-borate compound, an arylsulfonate-boric acid compound, an arylsulfonate-borate compound, an arylalkylsulfonate-boric acid compound or an arylalkylsulfonate-borate compound.

Moreover, the organic solvent differs depending on the compounds used or the reaction used. In general, those sufficiently treated by deoxygenation for suppressing side reactions are preferably used. For producing the polymer compound, it is preferred that the reaction should be allowed to proceed in an inert atmosphere using such an organic solvent. Moreover, it is preferred that the organic solvent should be treated by dehydration, as with the deoxygenation treatment. However, this shall not apply in a reaction in a two-phase system containing water, such as Suzuki coupling reaction.

Moreover, such an organic solvent is exemplified by: saturated hydrocarbons such as pentane, hexane, heptane, octane and cyclohexane; unsaturated hydrocarbons such as benzene, toluene, ethylbenzene and xylene; saturated halogenated hydrocarbons such as carbon tetrachloride, chloroform, dichloromethane, chlorobutane, bromobutane, chloropentane, bromopentane, chlorohexane, bromohexane, chlorocyclohexane and bromocyclohexane; unsaturated halogenated hydrocarbons such as chlorobenzene, dichlorobenzene and trichlorobenzene; alcohols such as methanol, ethanol, propanol, isopropanol, butanol and t-butyl alcohol; carboxylic acids such as formic acid, acetic acid and propionic acid; ethers such as dimethyl ether, diethyl ether, methyl-t-butyl ether, tetrahydrofuran, tetrahydropyran and dioxane; amines such as trimethylamine, triethylamine, N,N,N',N'-tetramethylethylenediamine and pyridine; and amides such as N,N-dimethylformamide, N,N-dimethylacetamide, N,N-diethylacetamide and N-methylmorpholine oxide. These organic solvents may be used alone or as a mixture of two or more thereof. Moreover, among such organic solvents, ethers are more preferable, and tetrahydrofuran and diethyl ether are even more preferable.

Moreover, for producing the polymer compound according to the present invention, it is preferred that an alkali or an appropriate catalyst should be added appropriately for the reaction of the raw material compounds. Such an alkali or a catalyst needs only to be selected according to the polymerization method adopted, and so on. It is preferred that such an alkali or a catalyst should be dissolved sufficiently in the solvent used in the reaction. Moreover, the method for mixing the alkali or the catalyst thereinto is exemplified by a method comprising gradually adding a solution of the alkali or the catalyst to the reaction solution with stirring in an inert atmosphere such as an argon or nitrogen atmosphere or, by contraries, gradually adding the reaction solution to a solution of the alkali or the catalyst under these conditions.

Next, a hole transport layer, an anode, and so on according to the present invention will be described.

The polymer light-emitting device of the present invention is a polymer light-emitting device having a light-emitting layer between an anode and a cathode and having a hole transport layer between the light-emitting layer and the anode, as described above. Such a polymer light-emitting device is exemplified by a polymer light-emitting device having the following structure a):

a) anode/hole transport layer/light-emitting layer/cathode, wherein the symbol / represents that the layers described before and after the symbol are stacked adjacently to each other. The same holds true for description below.

The hole transport layer according to the present invention is a layer having the function of transporting holes and is a layer containing the polymer compound according to the present invention.

A method for forming such a hole transport layer is not particularly limited as long as it is a method capable of forming a layer containing the polymer compound. Examples thereof include a method comprising forming a film containing the polymer compound (hole transport layer) on the surface of the anode using a solution containing the polymer compound. Moreover, such a method for forming a film using a solution containing the polymer compound according to the present invention is very advantageous in terms of production because the method requires only solvent removal by drying after application of the solution and a similar approach can also be applied to a mixture of a hole transport material therewith.

A solvent used in the solution containing the polymer compound is not particularly limited as long as it can dissolve the polymer compound therein. Such a solvent is exemplified by: chlorine solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate. More specific examples thereof include chloroform, methylene chloride, dichloroethane, tetrahydrofuran, toluene, xylene, mesitylene, tetralin, decalin and n-butylbenzene. In this context, it is usually preferred that these solvents should be capable of dissolving therein 0.1 wt % or more of the polymer compound, depending on the structure or molecular weight of the polymer compound used.

Moreover, application methods such as spin coating, casting, micro-gravure coating, gravure coating, bar coating, roll coating, wire bar coating, dip coating, slit coating, cap coating, spray coating, screen printing, flexographic printing, offset printing, inkjet printing and nozzle coating methods can be adopted as the method for forming such a film (hole transport layer).

Moreover, the film thickness of such a hole transport layer differs in optimum value depending on the polymer compound used and therefore needs only to be selected appropriately to offer appropriate values of a driving voltage and luminous efficiency. It is preferred that the hole transport layer should require at least a thickness that prevents pinhole formation. In this context, too thick a film thickness of the hole transport layer tends to cause the device to require a high driving voltage. Therefore, such a hole transport layer has a film thickness of, but not particularly limited to, preferably 1 nm to 1 µm, more preferably 2 nm to 500 nm, even more preferably 2 nm to 200 nm.

Moreover, in the polymer light-emitting device of the present invention, the hole transport layer may contain a hole transport material together with the polymer compound. Such a hole transport material is not particularly limited, and those known in the art can be used appropriately. High-molecular-weight hole transport materials are preferable such as polyvinylcarbazole and derivatives thereof, polysilane and derivatives thereof, polysiloxane derivatives having an aromatic amine compound group in the side chain or the main chain, polyaniline and derivatives thereof, polythiophene and derivatives thereof, poly(p-phenylene vinylene) and derivatives thereof and poly(2,5-thienylene vinylene) and derivatives thereof. Polyvinylcarbazole and derivatives thereof, polysilane and derivatives thereof and polysiloxane derivatives having aromatic amine in the side chain or the main chain are more preferable.

Moreover, when the hole transport layer contains a low-molecular-weight hole transport material, it is preferred that the low-molecular-weight hole transport material should be dispersed in a polymer binder for use. Such a polymer binder is preferably a polymer binder that does not extremely inhibit hole transport and is preferably a polymer binder that does not have strong visible light absorption. Such a polymer binder is exemplified by polycarbonate, polyacrylate, polymethyl acrylate, polymethyl methacrylate, polystyrene, polyvinyl chloride and polysiloxane.

Moreover, for example, compounds obtained from vinyl monomers by cation polymerization or radical polymerization can be used preferably as the polyvinylcarbazole and derivatives thereof.

Moreover, the polysilane and derivatives thereof are exemplified by compounds described in. e.g., Chem. Rev., vol. 89, p. 1359 (1989) and British Patent No. GB2300196. Such polyvinylcarbazole and derivatives thereof can be synthesized by methods described in these documents. Particularly, a Kipping method is preferably adopted.

Furthermore, the polysiloxane derivatives having the low-molecular hole transport material structure in the side chain or the main chain are preferably used because the siloxane skeleton structure hardly has hole transport properties. Such polysiloxane derivatives are particularly exemplified by those having hole transport aromatic amine in the side chain or the main chain.

Moreover, the light-emitting layer according to the present invention is a layer having the function of emitting light upon voltage application. Materials known in the art can be used appropriately as light-emitting layer materials used in such a light-emitting layer. Low-molecular-weight and high-molecular-weight light-emitting layer materials that can be used in light-emitting layers can be used appropriately. Examples of such low-molecular-weight light-emitting layer materials include naphthalene derivatives, anthracene and derivatives thereof, perylene and derivatives thereof, dyes (e.g., polymethine, xanthene, coumarin and cyanine), metal complexes of 8-hydroxyquinoline and derivatives thereof, aromatic amine, tetraphenylcyclopentadiene and derivatives thereof and tetraphenylbutadiene and derivatives thereof. Moreover, materials known in the art such as those described in JP-A-57- 51781 and JP-A-59-194393 may be used as such low-molecular-weight light-emitting layer materials. Moreover, examples of the high-molecular-weight light-emitting layer materials include polyfluorene derivatives, polyphenylene vinylene derivatives and polyamine derivatives.

A method for forming such a light-emitting layer is not particularly limited. Examples thereof include a method comprising forming a film using a solution containing the light-emitting layer material to form a light-emitting layer. Such a method for forming a film using a solution containing the light-emitting layer material is adopted very advantageously in terms of production because the light-emitting layer can be formed only by solvent removal by drying after application of the solution, resulting in improved production efficiency.

Moreover, application methods such as spin coating, casting, micro-gravure coating, gravure coating, bar coating, roll coating, wire bar coating, dip coating, slit coating, cap coating, spray coating, screen printing, flexographic printing, offset printing, inkjet printing and nozzle coating methods can be adopted as the method for forming a film using a solution containing the light-emitting layer material.

Moreover, the film thickness of such a light-emitting layer differs in optimum value depending on the material used and therefore needs only to be selected to offer appropriate values of a driving voltage and luminous efficiency. The light-emitting layer has a film thickness of, but not particularly limited to, preferably 1 nm to 1 µm, more preferably 2 nm to 500 nm, particularly preferably 5 nm to 200 nm.

Moreover, for electrodes comprising the anode and the cathode according to the present invention, it is preferred that at least one of the electrodes should be transparent or semitransparent. It is more preferred that the anode should be transparent or semitransparent.

Conductive metal oxide films, semitransparent metal thin films, or the like can be used as materials for such an anode. For example, a film (NESA, etc.) prepared using conductive glass comprising indium oxide, zinc oxide, tin oxide and their complex indium tin oxide (ITO) or indium zinc oxide, and the like, or gold, platinum, silver or copper is used as a material for such an anode. ITO, indium zinc oxide and tin oxide are preferable.

Examples of a method for forming such an anode include vacuum deposition, sputtering, ion plating and plating methods. Alternatively, transparent organic conductive films such as polyaniline and derivatives thereof and polythiophene and derivatives thereof may be used as such an anode.

Furthermore, the film thickness of the anode can be selected appropriately in consideration of optical transparency and conductivity. Thus, the anode has a film thickness of, but not particularly limited to, preferably 10 nm to 10 µm, more preferably 20 nm to 1 µm, even more preferably 50 nm to 500 nm.

Moreover, a layer comprising a phthalocyanine derivative, a conductive polymer, carbon, or the like or a layer comprising a metal oxide, a metal fluoride, an organic insulating material, or the like may further be disposed on such an anode for facilitating charge injection.

Moreover, materials having a small work function are preferable as materials for the cathode. Examples of such materials for the cathode include: metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium, and alloys of two ore more thereof or alloys of one or more thereof with one or more of gold, silver, platinum, copper, manganese, titanium, cobalt, nickel, tungsten and tin; and graphite or intercalated graphite. Moreover, examples of the alloys include magnesium-silver, magnesium-indium, magnesium-aluminum, indium-silver, lithium-aluminum, lithium-magnesium, lithium-indium and calcium-aluminum alloys. Moreover, such a cathode may have a double- or more layered structure.

The film thickness of such a cathode can be selected appropriately in consideration of conductivity and durability. Thus, the cathode has a film thickness of, but not particularly limited to, for example, preferably 10 nm to 10 µm, more preferably 20 nm to 1 µm, even more preferably 50 nm to 500 nm.

Moreover, for example, vacuum deposition, sputtering and laminating (thermocompression bonding of a metal thin film) methods can be adopted as methods for forming such a cathode. Moreover, a layer comprising a conductive polymer or a layer comprising a metal oxide, a metal fluoride, an organic insulating material, or the like may be disposed between such a cathode and the light-emitting layer.

Moreover, the polymer light-emitting device of the present invention may further comprise an electron transport layer between the cathode and the light-emitting layer. In this context, the electron transport layer is a layer having the function of transporting electrons. Such a polymer light-emitting device is exemplified by a polymer light-emitting device having the following structure b):

b) anode/hole transport layer/light-emitting layer/electron transport layer/cathode.

An electron transport material used in such an electron transport layer is not particularly limited, and those known in the art can be used appropriately. Examples of such an electron transport material include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof and polyfluorene and derivatives thereof. Specific examples of such an electron transport material include those described in JP-A-63-70257, JP-A-63-175860, JP-A-2-135359, JP-A-2-135361, JP-A-2-209988, JP-A-3-37992 and JP-A-3-152184.

Oxadiazole derivatives, benzoquinone and derivatives thereof, anthraquinone and derivatives thereof, metal complexes of 8-hydroxyquinoline and derivatives thereof, polyquinoline and derivatives thereof, polyquinoxaline and derivatives thereof and polyfluorene and derivatives thereof are more preferable as such an electron transport material. 2-(4-biphenylyl)-5-(4-t-butylphenyl)-1,3,4-oxadiazole, benzoquinone, anthraquinone, tris(8-quinolinol)aluminum and polyquinoline are even more preferable.

Moreover, a method for forming such an electron transport layer is not particularly limited. When a low-molecular-weight electron transport material is used, examples thereof include a vacuum deposition method from powders and a method comprising forming a film from a solution or melted state. When a high-molecular-weight electron transport material is used, examples thereof include a method comprising forming a film from a solution or melted state. In such film formation from a solution or melted state, a polymer binder may be used in combination therewith.

A solvent in the solution used for forming such an electron transport layer is not particularly limited as long as it can dissolve therein the electron transport material and/or the polymer binder. Examples of such a solvent include: chlorine solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate.

Moreover, for example, application methods such as spin coating, casting, micro-gravure coating, gravure coating, bar coating, roll coating, wire bar coating, dip coating, slit coating, cap coating, spray coating, screen printing, flexographic printing, offset printing, inkjet printing and nozzle coating methods can be adopted as the method for forming such an electron transport layer.

Moreover, the polymer binder that may be mixed into the solution used for forming such an electron transport layer is preferably a polymer binder that does not extremely inhibit charge transport and is preferably a polymer binder that does not have strong visible light absorption. Such a polymer binder is exemplified by poly(N-vinylcarbazole), polyaniline and derivatives thereof, polythiophene and derivatives thereof, poly(p-phenylene vinylene) and derivatives thereof, poly(2,5-thienylene vinylene) and derivatives thereof, polycarbonate, polyacrylate, polymethyl acrylate, polymethyl methacrylate, polystyrene, polyvinyl chloride and polysiloxane.

Furthermore, the film thickness of such an electron transport layer differs in optimum value depending on the material used and therefore needs only to be selected to offer appropriate values of a driving voltage and luminous efficiency. The electron transport layer requires at least a thickness that prevents pinhole formation. Moreover, too thick a film thickness of such an electron transport layer tends to cause the device to require a high driving voltage. Therefore, such an electron transport layer has a film thickness of, but not particularly limited to, preferably 1 nm to 1 µm, more preferably 2 nm to 500 nm, even more preferably 5 nm to 200 nm.

Moreover, of the charge transport layers disposed adjacently to the electrode, particularly, a layer having the function of improving charge injection efficiency from the electrode and the effect of decreasing a driving voltage for the device may generally be called a charge injection layer (hole injection layer or electron injection layer).

Moreover, the polymer light-emitting device of the present invention may further comprise the charge injection layer or an insulating layer disposed adjacently to the electrode for improving adhesion to the electrode and charge injection from the electrode. Moreover, a thin buffer layer may be inserted in the interface of the charge transport layer or the light-emitting layer for, for example, improving adhesion of the interface or preventing contamination. Moreover, in the polymer light-emitting device of the present invention, the order in which layers are stacked, the number of layers, and the thickness of each layer need only to be selected appropriately in consideration of luminous efficiency and a device lifetime. Examples of such a polymer light-emitting device comprising the charge injection layer (electron injection layer or hole injection layer) include those having a structure comprising the charge injection layer disposed adjacently to the cathode and those having a structure comprising the charge injection layer disposed adjacently to the anode. It is exemplified by polymer light-emitting devices having the following structures c) to h):

c) anode/charge injection layer/hole transport layer/light-emitting layer/cathode;

d) anode/hole transport layer/light-emitting layer/charge injection layer/cathode;

e) anode/charge injection layer/hole transport layer/light-emitting layer/charge injection layer/cathode;

f) anode/charge injection layer/hole transport layer/light-emitting layer/electron transport layer/cathode;

g) anode/hole transport layer/light-emitting layer/electron transport layer/charge injection layer/cathode; and h) anode/charge injection layer/hole transport layer/light-emitting layer/electron transport layer/charge injection layer/cathode.

Such a charge injection layer is exemplified by: a layer comprising a conductive polymer; a layer which is disposed between the anode and the hole transport layer and comprises a material having an ionization potential intermediate between the corresponding values of the anode material and the hole transport material contained in the hole transport layer; and a layer which is disposed between the cathode and the electron transport layer and comprises a material having electron affinity intermediate between the corresponding values of the cathode material and the electron transport material contained in the electron transport layer.

Moreover, when such a charge injection layer is a layer comprising a conductive polymer, the conductive polymer has a conductivity of preferably between $10^{-5}$ S/cm and $10^3$ S/cm inclusive and more preferably between $10^{-5}$ S/cm and $10^2$ S/cm inclusive, even more preferably between $10^{-5}$ S/cm and $10^1$ S/cm inclusive, for decreasing current leakage between light-emitting pixels. To allow such a conductive polymer to have a conductivity of between $10^{-5}$ S/cm and $10^3$ S/cm inclusive, an appropriate amount of ions is usually doped into the conductive polymer.

The type of the ions thus doped is an anion for the hole injection layer and a cation for the electron injection layer. Examples of such an anion include polystyrene sulfonic acid, alkylbenzene sulfonic acid and camphorsulfonic acid ions. Examples of the cation include lithium, sodium, potassium and tetrabutylammonium ions.

Moreover, such a charge injection layer has a film thickness of preferably 1 nm to 100 nm, more preferably 2 nm to 50 nm.

Moreover, a material used in such a charge injection layer is not particularly limited as long as it is selected appropriately according to the relationship with the materials for the electrode or the adjacent layer. Examples thereof include polyaniline and derivatives thereof, polythiophene and derivatives thereof, polypyrrole and derivatives thereof, polyphenylene vinylene and derivatives thereof, polythienylene vinylene and derivatives thereof, polyquinoline and derivatives thereof, polyquinoxaline and derivatives thereof, conductive polymers (e.g., polymers containing an aromatic amine structure in the main chain or the side chain), metallophthalocyanine (e.g., copper phthalocyanine) and carbon. In this context, a method for producing such a charge injection layer is not particularly limited, and production methods known in the art can be adopted appropriately.

Moreover, the polymer light-emitting device of the present invention may further have an insulating layer, as described above. Examples of such a polymer light-emitting device comprising an insulating layer include polymer light-emitting devices having a structure comprising the insulating layer disposed adjacently to the cathode and polymer light-emitting devices having a structure comprising the insulating layer disposed adjacently to the anode. Examples thereof include polymer light-emitting devices having the following structures i) to n):

i) anode/insulating layer/hole transport layer/light-emitting layer/cathode;

j) anode/hole transport layer/light-emitting layer/insulating layer/cathode;

k) anode/insulating layer/hole transport layer/light-emitting layer/insulating layer/cathode;

l) anode/insulating layer/hole transport layer/light-emitting layer/electron transport layer/cathode;

m) anode/hole transport layer/light-emitting layer/electron transport layer/insulating layer/cathode; and n) anode/insulating layer/hole transport layer/light-emitting layer/electron transport layer/insulating layer/cathode.

In this context, the insulating layer has the function of facilitating charge injection. Such an insulating layer has an average film thickness of preferably 0.1 to 20 nm, more preferably 0.5 to 10 nm, even more preferably 1 to 5 nm. Moreover, examples of a material for such an insulating layer include metal fluorides, metal oxides and organic insulating materials. In this context, a method for producing such an insulating layer is not particularly limited, and production methods known in the art can be adopted appropriately.

Moreover, a substrate used for forming the polymer light-emitting device of the present invention is not particularly limited as long as it permits electrode formation thereon and does not change when organic layers are formed thereon. Examples thereof include glass, plastic, polymer film and silicon substrates. For an opaque substrate, it is preferred that the electrode on the opposite side should be transparent or semitransparent.

Moreover, a protective layer or a protective cover may be attached to the polymer light-emitting device of the present invention thus produced. It is preferred from the viewpoint of stably using the polymer light-emitting device for a long period that the protective layer and/or the protective cover should be attached for externally protecting the device.

A resin, a metal oxide, a metal fluoride, a metal boride, or the like can be used as such a protective layer. Moreover, a glass plate, a plastic plate having a surface subjected to low water permeability treatment, or the like can be used as the protective cover. A method comprising gluing the protective cover to the device substrate for hermetical sealing using a thermosetting or light-curing resin is preferably used as the method for attaching such a protective cover. Moreover, for attaching such a protective cover, the use of a spacer for keeping a space easily prevents the polymer light-emitting device from being damaged. Moreover, the charging of an inert gas such as nitrogen or argon into such a space can prevent oxidation of the cathode. Furthermore, the placement of a desiccant such as barium oxide in the space easily prevents moistures adsorbed in the production step from damaging the device. For attaching such a protective cover, it is preferred that, of these approaches, any one or more should be adopted.

Moreover, the polymer light-emitting device of the present invention can be used in planar light sources, display devices (e.g., segment display devices, dot matrix display devices and liquid-crystal display devices (e.g., backlights)), and so on.

Moreover, for obtaining planar light emission using the polymer light-emitting device of the present invention, it is only required that planar anode and cathode should be arranged such that they overlap with each other. Moreover, for obtaining patterned light emission, methods are used which include: a method comprising placing a mask provided with a window with the pattern on the surface of the planar light-emitting device; a method comprising forming an extremely thick organic layer of a non-light-emitting portion such that the portion becomes substantially non-light-emitting; and a method comprising forming the pattern on either or both of the anode and the cathode. The pattern is formed by any of these methods, and some electrodes are arranged such that they can independently be switched between the ON and OFF positions. As a result, a segment-type display device is obtained which can display numbers, letters, simple symbols, and so on. Furthermore, for preparing the polymer light-emitting device of the present invention into a dot matrix device, it is only required that both the anode and cathode should be formed in a striped form and arranged orthogonally. Moreover, the polymer light-emitting device of the present invention achieves partial color display or multicolor display by a method comprising separately applying plural types of polymer compounds differing in the color of emitted light or by a method using a color filter or a fluorescence conversion filter. Moreover, the dot matrix device can be driven passively or may be driven actively in combination with TFT or the like. These display devices thus formed using the polymer light-emitting device of the present invention can be used as display devices for computers, televisions, mobile terminals, cellular phones, car navigation systems, video camera view finders, and so on. Furthermore, the planar light-emitting device prepared using the polymer light-emitting device of the present invention is a self-light-emitting thin type and can be used preferably as a planar light source for backlights in liquid-crystal display devices or as a light source for planar illumination. Moreover, the polymer light-emitting device of the present invention can be used as a curved light source or display device, when a flexible substrate is used in the polymer light-emitting device.

[First and Second Polymer Compounds, Composition, Liquid Composition and Conductive Thin Film]

A first polymer compound of the present invention is characterized by comprising a repeating unit represented by the general formula (I), a repeating unit represented by the general formula (II) and a repeating unit represented by the general formula (VI).

Moreover, a second polymer compound of the present invention is characterized by comprising a repeating unit represented by the general formula (I), a repeating unit represented by the general formula (II) and a repeating unit represented by the general formula (VII).

The repeating units represented by the general formulas (I), (II), (VI) and (VII) in such first and second polymer compounds are the same as those described in the polymer compound used in the polymer light-emitting device of the present invention.

Moreover, such a first polymer compound is the polymer compound used in the polymer light-emitting device of the present invention, wherein the repeating unit represented by the general formula (III) is a repeating unit represented by the general formula (VI). A method similar to the method for producing the polymer compound used in the polymer light-emitting device of the present invention can be adopted as a method for producing such a first polymer compound, except that a raw material compound represented by the general formula (X) wherein -A- is each of the repeating units represented by the general formulas (I), (II) and (VI) is used as each essential component.

Furthermore, the second polymer compound is the polymer compound used in the polymer light-emitting device of the present invention, wherein the repeating unit represented by the general formula (III) is a repeating unit represented by the general formula (VII). A method similar to the method for producing the polymer compound used in the polymer light-emitting device of the present invention can be adopted as a method for producing such a first polymer compound, except that a raw material compound represented by the general formula (X) wherein -A- is each of the repeating units represented by the general formulas (I), (II) and (VII) is used as each essential component.

Moreover, in such first and second polymer compounds of the present invention, it is preferred that $Ar_1$ in the repeating unit represented by the general formula (II) should be a group represented by the general formula (IV). Such a group represented by the general formula (IV) is the same as those described in the polymer compound used in the polymer light-emitting device of the present invention.

Such first and second polymer compounds of the present invention can be used preferably as an interlayer material. In this context, the interlayer material refers to a material contained in a hole transport layer which is present between a light-emitting layer and an anode in a light-emitting device having a pair of electrodes and is adjacent to the light-emitting layer (this hole transport layer is called an interlayer).

Moreover, when the first and second polymer compounds of the present invention are used in a polymer LED or the like, the purities of the first and second polymer compounds influence device performance such as emission characteristics. Therefore, in the production thereof, it is preferred that the monomers before polymerization should be purified by methods such as distillation, sublimation purification and recrystallization and then polymerized. Moreover, it is preferred that after polymerization, the polymer should be treated by purification such as reprecipitation purification and fractionation by chromatography.

Moreover, the first and second polymer compounds of the present invention can be used not only as a hole transport layer in the light-emitting device but also as a thin film, an organic semiconductor material, an organic transistor, an optical material, a solar cell or a conductive material (which is applied by doping).

Such a thin film is exemplified by a conductive thin film or an organic semiconductor thin film which is obtained using the polymer compound. This conductive thin film will be described later.

For such an organic semiconductor thin film, it is preferred that, of electron mobility and hole mobility, the larger one should be $10^{-5}$ $cm^2$/V/second or larger, more preferably $10^{-3}$ $cm^2$/V/second or larger, particularly preferably $10^{-1}$ $cm^2$/V/second or larger. Moreover, such an organic semiconductor thin film can be used to prepare an organic transistor. Specifically, the organic semiconductor thin film is formed on a Si substrate comprising an insulating film (e.g., a film of $SiO_2$) and a gate electrode formed thereon, and source and drain electrodes can be formed thereon using Au or the like to prepare an organic transistor.

Moreover, the first and second polymer compounds of the present invention can be used as a material for a polymer field-effect transistor and particularly, can be used preferably as an active layer therein. For the structure of the polymer field-effect transistor, usually, it is only required that source and drain electrodes should be disposed in contact with the active layer comprising the polymer and a gate electrode should further be disposed such that an insulating layer is placed between the active layer and the gate electrode.

Such a polymer field-effect transistor is usually formed on a supporting substrate. A material for the supporting substrate is not particularly limited as long as it does not inhibit characteristics as a field-effect transistor. A glass, flexible film or plastic substrate can also be used. Moreover, such a polymer field-effect transistor can be produced by methods known in the art and can be produced according to, for example, a method described in JP-A-5-110069.

Moreover, for forming the active layer, it is preferred that organic solvent-soluble first and second polymer compounds should be used in terms of very advantageous production. Application methods such as spin coating, casting, micro-gravure coating, gravure coating, bar coating, roll coating, wire bar coating, dip coating, slit coating, cap coating, spray coating, screen printing, flexographic printing, offset printing, inkjet printing and nozzle coating methods can be adopted as methods for forming the active layer using a solution containing such organic solvent-soluble first and second polymer compounds dissolved in a solvent.

Moreover, such a polymer field-effect transistor is preferably a sealed polymer field-effect transistor which is obtained by preparing a polymer field-effect transistor and then sealing the transistor. The polymer field-effect transistor thus produced is blocked from atmosphere. Thus, reduction in the characteristics of the polymer field-effect transistor can be suppressed. Moreover, examples of the sealing method include: a method comprising covering the transistor with a UV-curable resin, a thermosetting resin, an inorganic SiONx film, or the like; and a method comprising gluing a glass plate or a film thereto using a UV-curable resin, a thermosetting resin, or the like. For effectively blocking the polymer field-effect transistor from atmosphere, it is preferred that steps from polymer field-effect transistor preparation to sealing should be performed without exposing the transistor to atmosphere (e.g., performed in a dried nitrogen atmosphere, in vacuum, or the like).

Moreover, a solar cell that can be produced using the first and second polymer compounds of the present invention will be described by taking, as an example, an organic photoelectric conversion device which is one aspect of an organic solar cell and is a solid photoelectric conversion device using photovoltaic effects.

The first and second polymer compounds of the present invention can be used as a material for the organic photoelectric conversion device and can be used particularly preferably as an organic semiconductor layer in a Schottky barrier-type device that utilizes the interface between an organic semiconductor and a metal and as an organic semiconductor layer in a p-n heterojunction-type device that utilizes the interface between organic and inorganic semiconductors or between organic semiconductors.

Furthermore, the first and second polymer compounds of the present invention can be used preferably as an electron-donating or electron-accepting polymer in a bulk heterojunction-type device having an increased area of donor-acceptor contact and as an electron-donating conjugated polymer (dispersed support) in an organic photoelectric conversion device that utilizes a polymer and low-molecular compound composite system, for example, a bulk heterojunction-type organic photoelectric conversion device comprising dispersed fullerene derivatives as electron acceptors.

For the structure of such an organic photoelectric conversion device, for example, a p-n heterojunction-type device, it is only required that a p-type semiconductor layer should be formed on an ohmic electrode (e.g., ITO) and an n-type semiconductor layer and subsequently an ohmic electrode should be stacked thereon.

Such an organic photoelectric conversion device is usually formed on a supporting substrate. A material for the supporting substrate is not particularly limited as long as it does not inhibit characteristics as an organic photoelectric conversion device. A glass, flexible film or plastic substrate can also be used.

Moreover, such an organic photoelectric conversion device can be produced by methods known in the art, for example, methods described in Synth. Met., 102, 982 (1999) and Science, 270, 1789 (1995).

Next, a composition of the present invention will be described.

The composition of the present invention is characterized by comprising at least one of the first and second polymer compounds of the present invention and at least one material selected from the group consisting of a light-emitting material and a hole transport material.

Such a light-emitting material is not particularly limited, and those known in the art can be used appropriately. Examples of low-molecular-weight light-emitting materials include naphthalene derivatives, anthracene and derivatives thereof, perylene and derivatives thereof, dyes (e.g., polymethine, xanthene, coumarin and cyanine), metal complexes of 8-hydroxyquinoline and derivatives thereof, aromatic amine, tetraphenylcyclopentadiene and derivatives thereof and tetraphenylbutadiene and derivatives thereof. Examples of such a light-emitting material include those described in JP-A-57-51781 and JP-A-59-194393.

Moreover, the hole transport material is not particularly limited, and those known in the art can be used appropriately. Examples of such a hole transport material include polyvinylcarbazole and derivatives thereof, polysilane and derivatives thereof, polysiloxane derivatives having aromatic amine in the side chain or the main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylene vinylene) and derivatives thereof and poly(2,5-thienylene vinylene) and derivatives thereof.

Moreover, the content of the at least one material selected from the group consisting of a light-emitting material and a hole transport material in the composition of the present invention is preferably 1 wt % to 80 wt %, more preferably 5 wt % to 60 wt %. When the content of such a material is less than the lower limit, the material tends to fail to impart sufficient light-emitting properties or hole transport properties thereto. On the other hand, when the content exceeds the upper limit, the polymer compound tends to fail to exert charge transport properties. In this context, the first and second polymer compounds may be used alone or in combination in such a composition. Moreover, two or more of each of the first and second polymer compounds may be contained therein.

Next, a liquid composition of the present invention will be described.

The liquid composition of the present invention is characterized by comprising at least one of the first and second polymer compounds of the present invention and a solvent.

Such a liquid composition is useful in the preparation of light-emitting devices (e.g., polymer light-emitting devices) or organic transistors. Moreover, the "liquid composition" means a composition that is in a liquid state during device preparation and typically means a composition that is in a liquid state at 25° C. under the atmospheric pressure (i.e., 1 atmospheric pressure). Moreover, in general, the liquid composition may be called an ink, an ink composition, a solution, or the like.

Moreover, the content of the solvent in the liquid composition of the present invention is preferably 1 wt % to 99.9 wt %, more preferably 60 wt % to 99.9 wt %, even more preferably 90 wt % to 99.8 wt %, with respect to the total mass of the liquid composition. Moreover, the preferable viscosity of the liquid composition differs depending on a printing method adopted for producing a thin film or the like using this liquid composition. The viscosity is preferably in the range of 0.5 to 500 mPa·s at 25° C. and is preferably in the range of 0.5 to 20 mPa·s at 25° C. for preventing clogging or flight bending during discharge, for example, in an inkjet printing method which involves passing the liquid composition through a discharging apparatus.

Moreover, it is preferred that such a solvent should be capable of dissolving or discharging therein components other than the solvent contained in the liquid composition of the present invention. Such a solvent is exemplified by: chlorine solvents such as chloroform, methylene chloride, 1,2-dichloroethane, 1,1,2-trichloroethane, chlorobenzene and o-dichlorobenzene; ether solvents such as tetrahydrofuran and dioxane; aromatic hydrocarbon solvents such as toluene, xylene, trimethylbenzene and mesitylene; aliphatic hydrocarbon solvents such as cyclohexane, methylcyclohexane, n-pentane, n-hexane, n-heptane, n-octane, n-nonane and n-decane; ketone solvents such as acetone, methyl ethyl ketone and cyclohexanone; ester solvents such as ethyl acetate, butyl acetate, methyl benzoate and ethyl cellosolve acetate; polyhydric alcohols and derivatives thereof such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol; alcoholic solvents such as methanol, ethanol, propanol, isopropanol and cyclohexanol; sulfoxide solvents such as dimethyl sulfoxide; and amide solvents such as N-methyl-2-pyrrolidone and N,N-dimethylformamide. Moreover, these solvents may be used alone or in combination of two or more thereof. It is preferred from the viewpoint of viscosity, film formation properties, and so on that, of the solvents, one or more organic solvents that have a structure containing at least one or more benzene rings and have a melting point of 0° C. or lower and a boiling point of 100° C. or higher should be contained in the liquid composition.

Moreover, the type of such a solvent is preferably aromatic hydrocarbon solvents, aliphatic hydrocarbon solvents, ester solvents and ketone solvents and is preferably toluene, xylene, ethylbenzene, diethylbenzene, trimethylbenzene, mesitylene, n-propylbenzene, isopropylbenzene, n-butylbenzene, isobutylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone and dicyclohexyl ketone, from the viewpoint of the solubility, in the solvent, of components other than the solvent contained in the liquid composition, uniform film formation, viscosity characteristics, and so on. It is more preferred that at least one of xylene, anisole, mesitylene, cyclohexylbenzene, bicyclohexyl and methyl benzoate should be contained therein.

Furthermore, the liquid composition of the present invention contains more preferably two or more, even more preferably two to three, particularly preferably two solvents, from the viewpoint of film formation properties, device characteristics, and so on.

When the liquid composition of the present invention contains two solvents, one of the solvents may be in a solid state at 25° C. Moreover, it is preferred from the viewpoint of film formation properties that one of the solvents should have a boiling point of 180° C. or higher and the other solvent should have a boiling point lower than 180° C. It is more preferred that one of the solvents should have a boiling point of 200° C. or higher and the other solvent should have a boiling point lower than 180° C. Furthermore, it is preferred from the viewpoint of viscosity that 0.2 wt % or more of components other than the solvents in the liquid composition should be dissolved in the solvents at 60° C. and in one of the solvents at 25° C.

Moreover, when the liquid composition of the present invention contains three solvents, one or two of these three solvents may be in a solid state at 25° C. It is preferred from the viewpoint of film formation properties that at least one of the three solvents should have a boiling point of 180° C. or higher and at least one of the remaining solvents should have a boiling point lower than 180° C. It is more preferred that at least one of the three solvents should have a boiling point of between 200° C. and 300° C. inclusive and at least one of the remaining solvents should have a boiling point lower than 180° C. Moreover, it is preferred from the viewpoint of viscosity that 0.2 mass % or more of components other than the solvents in the liquid composition should be dissolved in two of the three solvents at 60° C. and in one of the three solvents at 25° C.

Furthermore, when the liquid composition of the present invention contains two or more solvents, the solvent having the highest boiling point occupies preferably 40 to 90 wt %, more preferably 50 to 90 wt %, even more preferably 65 to 85 wt % of the total mass of the solvents contained in the liquid composition from the viewpoint of viscosity and film formation properties. When the content of such a solvent having the highest boiling point is less than the lower limit, the resulting liquid composition tends to have low viscosity, resulting in difficulty in producing a film at the optimum film thickness using this composition. On the other hand, when the content exceeds the upper limit, the resulting liquid composition tends to have high viscosity, resulting in difficulty in producing a uniform film using this composition.

Moreover, the liquid composition of the present invention may contain, in addition to the first and second polymer compounds of the present invention and the solvent, optional components such as a low-molecular light-emitting material, a hole transport material, a stabilizer, an additive for adjusting viscosity and/or surface tension, and an antioxidant. Each of these optional components may be used alone or in combination of two or more thereof.

Examples of the low-molecular light-emitting material that may be contained in the liquid composition of the present invention include naphthalene derivatives, anthracene, anthracene derivatives, perylene, perylene derivatives, polymethine dyes, xanthene dyes, coumarin dyes, cyanine dyes, metal complexes having a metal complex of 8-hydroxyquinoline as a ligand, metal complexes having a metal complex of an 8-hydroxyquinoline derivative as a ligand, other fluorescent metal complexes, aromatic amine, tetraphenylcyclopentadiene, tetraphenylcyclopentadiene derivatives, tetraphenylcyclobutadiene, tetraphenylcyclobutadiene derivatives and fluorescent materials of low-molecular compounds (e.g., stilbene compounds, silicon-containing aromatic compounds, oxazole compounds, furoxan compounds, thiazole compounds, tetraarylmethane compounds, thiadiazole compounds, pyrazole compounds, metacyclophane compounds and acetylene compounds). Examples of such a low-molecular light-emitting material include materials known in the art such as those described in JP-A-57-51781 and JP-A-59-194393.

Moreover, the hole transport material that may be contained in the liquid composition of the present invention is the same as those described in the composition of the present invention.

Moreover, examples of the stabilizer that may be contained in the liquid composition of the present invention include phenol antioxidants and phosphorus antioxidants.

Furthermore, for example, high-molecular-weight compounds for increasing viscosity (thickeners), poor solvents, low-molecular-weight compounds for decreasing viscosity and surfactants for decreasing surface tension may be combined appropriately and used as the additive for adjusting viscosity and/or surface tension that may be contained in the liquid composition of the present invention.

Such high-molecular-weight compounds for increasing viscosity (thickeners) are not particularly limited as long as they do not inhibit light emission or charge transport. It is preferred that these compounds should be soluble in the solvent in the liquid composition of the present invention. For example, high-molecular-weight polystyrene and high-molecular-weight polymethyl methacrylate can be used as such thickeners. The thickeners should have a polystyrene equivalent weight average molecular weight of preferably 500,000 or higher, more preferably 1,000,000 or higher. Moreover, the poor solvents can also be used as thickeners.

Moreover, the antioxidant that may be contained in the liquid composition of the present invention is not particularly limited as long as it does not inhibit light emission or charge transport. It is preferred that the antioxidant should contained in the solvent. Such an antioxidant is exemplified by phenol antioxidants and phosphorus antioxidants. Moreover, the use of such an antioxidant tends to improve the storage stability of the hole transport layer or the solvent.

Moreover, when the liquid composition of the present invention contains a hole transport material, the content of the hole transport material in the liquid composition is preferably 1 wt % to 80 wt %, more preferably 5 wt % to 60 wt %. When the content of such a hole transport material is less than the lower limit, the material tends to fail to impart sufficient hole transport or electron transport ability to a film formed using the obtained liquid composition. On the other hand, when the content exceeds the upper limit, the polymer compound tends to fail to exert charge transport properties.

Moreover, when a hole transport layer is formed using the liquid composition of the present invention in polymer light-emitting device production, the hole transport layer can be formed only by solvent removal by drying after application of the liquid composition. Moreover, a similar approach can also be applied to a mixture of a charge transport material or a light-emitting material therewith to form a charge transport layer or a light-emitting layer. Therefore, the liquid composition of the present invention can improve the production efficiency of a polymer light-emitting device and is very advantageous in terms of production. In this context, the drying may be performed in a state heated to approximately 50 to 150° C. and may further be performed under pressure reduced to approximately $10^{-3}$ Pa.

Moreover, application methods such as spin coating, casting, micro-gravure coating, gravure coating, bar coating, roll coating, wire bar coating, dip coating, slit coating, cap coating, spray coating, screen printing, flexographic printing, offset printing, inkjet printing and nozzle coating methods can be adopted as methods for forming a film using the liquid composition of the present invention.

Next, a conductive thin film of the present invention will be described.

The conductive thin film of the present invention is characterized by comprising one or more of a polymer compound selected from the first and second polymer compounds of the present invention.

Such a conductive thin film has a surface resistivity of preferably 1 KΩ/□ or smaller, more preferably 100Ω/□ or smaller, even more preferably 10Ω/□ or smaller. Moreover, the conductivity of such a conductive thin film can be enhanced by doping thereinto Lewis acid, an ionic compound, or the like.

Moreover, the content of the polymer compound selected from the first and second polymer compounds of the present invention in the conductive thin film of the present invention is not particularly limited and is preferably 20 to 100 wt %, more preferably 40 to 100 wt %. When the content of such a polymer compound is less than the lower limit, the polymer compound tends to fail to exert charge transport properties.

In this context, a method for producing such a conductive thin film is not particularly limited, and methods known in the art can be adopted appropriately. Moreover, the film thickness of such a conductive thin film differs depending on its usage, the type of the polymer compound, and so on. The film thickness can be changed for use according to the usage and so on. Furthermore, such a conductive thin film may contain various additives, if necessary.

EXAMPLES

Hereinafter, the present invention will be described more specifically with reference to Examples and Comparative Examples. However, the present invention is not intended to be limited to Examples below.

[Production of Polymer Compounds <P-1> to <P-6>]

Synthesis Example 1

A polymer compound <P-1> containing repeating units represented by the following structural formulas was produced:

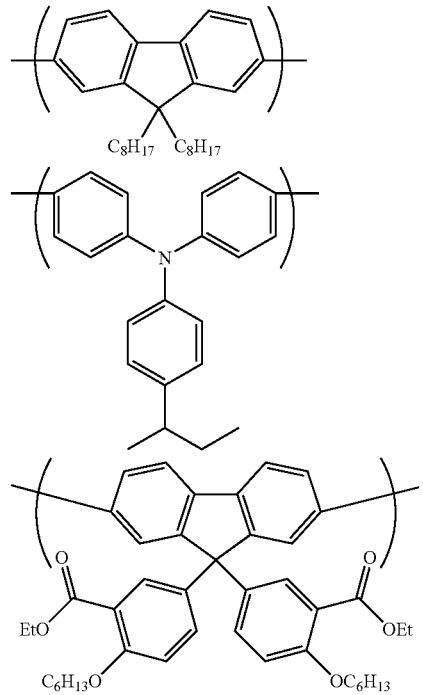

Specifically, first, 2,7-bis(1,3,2-dioxaborolan-2-yl)-9,9-dioctylfluorene (2.10 g), bis(4-bromophenyl)-(4-secondary butylphenyl)-amine (1.65 g), 2,7-dibromo-9,9-bis(4'-hexyloxy-3-ethoxycarbonylphenyl)-fluorene (0.32 g), bis(triphenylphosphine)palladium dichloride (8.4 mg), Aliquat 336

(0.52 g, manufactured by Sigma-Aldrich, Inc.) and toluene (40 ml) were mixed in an inert atmosphere, and the obtained reaction solution was heated to 105° C. Next, a 2 M aqueous Na$_2$CO$_3$ solution (11 ml) was added dropwise to the reaction solution, and the mixture was refluxed for 4 hours for reaction. Then, phenylboric acid (50 mg) was added thereto, and the mixture was further refluxed for 3 hours. Subsequently, a 1.8 M aqueous sodium diethyldithiacarbamate solution (10 ml) was added to the reaction solution. After stirring at 80° C. for 4 hours, the mixture was cooled to 25° C., washed with water (60 ml) three times, with a 3 wt % aqueous acetic acid solution (60 ml) four times and with water (60 ml) three times, and then applied to an alumina column and a silica gel column for purification to obtain a toluene solution. Then, the obtained toluene solution was added dropwise to methanol (3 L), and the mixture was stirred for 3 hours. Then, the obtained solid was filtered and dried to obtain the polymer compound <P-1>. The polymer compound <P-1> was obtained at a yield of 1.87 g. Moreover, the polymer compound <P-1> had a polystyrene equivalent weight average molecular weight of 1.4×10$^5$ and a polystyrene equivalent number average molecular weight of 5.7×10$^4$.

In this context, the bis(4-bromophenyl)-(4-secondary butylphenyl)-amine was synthesized according to a method described in the pamphlet of WO2002/045184. The 2,7-dibromo-9,9-bis(4'-hexyloxy-3-ethoxycarbonylphenyl)-fluorene was synthesized according to a method described in the pamphlet of WO2006/060437.

Example 1

A polymer compound <P-2> containing repeating units represented by the following structural formulas (a first polymer compound of the present invention) was produced:

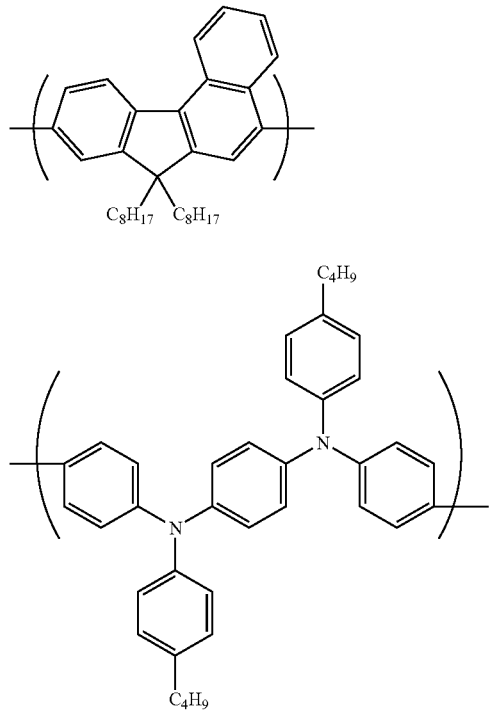

-continued

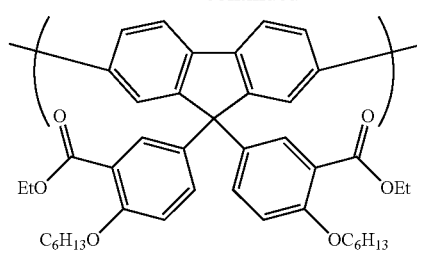

Specifically, first, 5,9-bis(4,4,5,5-tetramethyl-1,3,2-dioxaborolan-2-yl)-7,7-dioctyl-benzo[c]fluorene (2.78 g), N,N'-bis(4-bromophenyl)-N,N'-bis(4-n-butylphenyl)-1,4-phenylenediamine (2.46 g), 2,7-dibromo-9,9-bis(4-hexyloxy-3-ethoxycarbonylphenyl)-fluorene (0.33 g), bis(triphenylphosphine)palladium dichloride (8.4 mg), Aliquat 336 (0.52 g, manufactured by Sigma-Aldrich, Inc.) and toluene (40 ml) were mixed in an inert atmosphere, and the obtained reaction solution was heated to 105° C. Next, a 2 M aqueous Na$_2$CO$_3$ solution (11 ml) was added dropwise to the reaction solution, and the mixture was refluxed for 3.5 hours for reaction. Then, phenylboric acid (50 mg) was added thereto, and the mixture was further refluxed for 3 hours. Subsequently, a 1.8 M aqueous sodium diethyldithiacarbamate solution (25 ml) was added to the reaction solution. After stirring at 80° C. for 4 hours, the mixture was cooled to 25° C., washed with water (60 ml) three times, with a 3 wt % aqueous acetic acid solution (60 ml) four times and with water (60 ml) three times, and then applied to an alumina column and a silica gel column for purification to obtain a toluene solution. Then, the obtained toluene solution was added dropwise to methanol (3 L), and the mixture was stirred for 3 hours. Then, the obtained solid was filtered and dried to obtain the polymer compound <P-2> as the first polymer compound of the present invention. The polymer compound <P-2> was obtained at a yield of 3.22 g. Moreover, the polymer compound <P-2> had a polystyrene equivalent weight average molecular weight of 2.4×10$^5$ and a polystyrene equivalent number average molecular weight 9.1×10$^4$.

In this context, the 5,9-bis(4,4,5,5-tetramethyl-1,3,2-dioxaborolan-2-yl)-7,7-dioctyl-benzo[c]fluorene was synthesized according to a method described in the pamphlet of WO2005/056633. The N,N'-bis(4-bromophenyl)-N,N'-bis(4-n-butylphenyl)-1,4-phenylenediamine was synthesized according to a method described in the pamphlet of WO2005/049689.

Synthesis Example 2

A polymer compound <P-3> containing repeating units represented by the following structural formulas was produced:

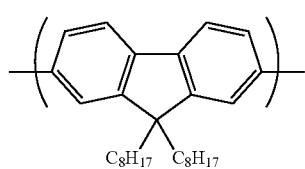

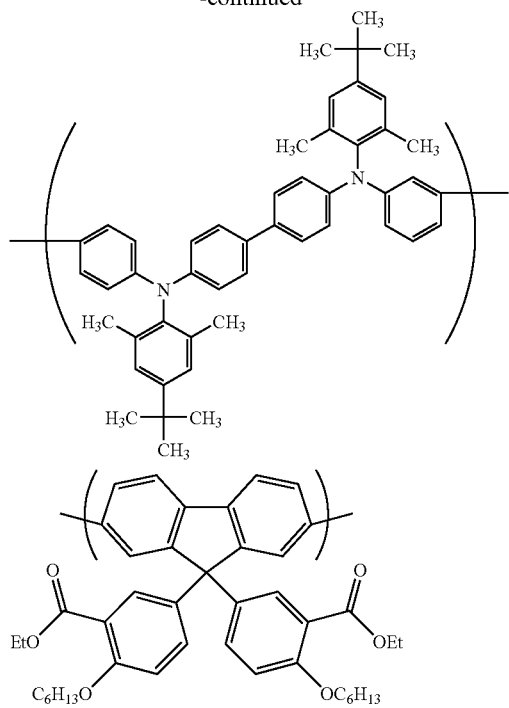

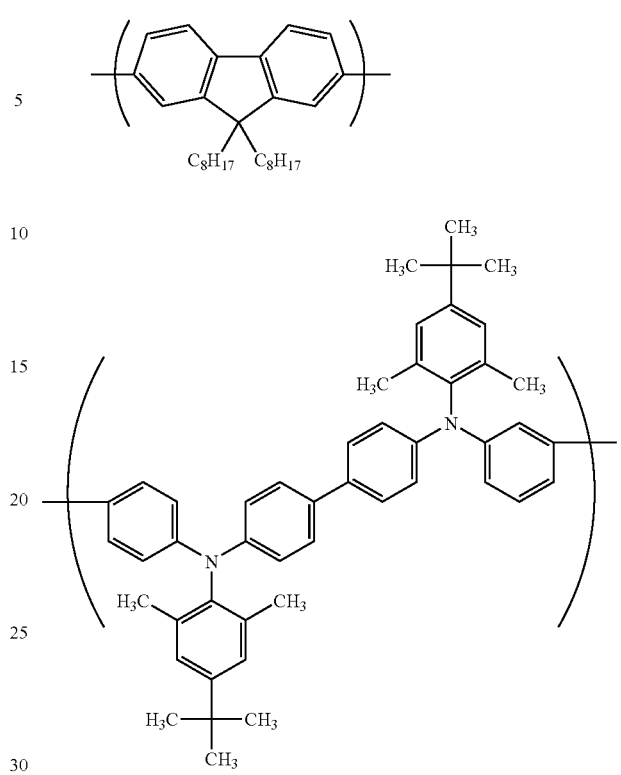

Specifically, first, 2,7-bis(1,3,2-dioxaborolan-2-yl)-9,9-dioctylfluorene (6.14 g), N,N'-bis(4-bromophenyl)-N,N'-bis(4-t-butyl-2,6-dimethylphenyl)-benzidine (8.44 g), 2,7-dibromo-9,9-bis(4-hexyloxy-3-ethoxycarbonylphenyl)-fluorene (0.95 g), bis(triphenylphosphine)palladium dichloride (8.9 mg), Aliquat 336 (1.9 g, manufactured by Sigma-Aldrich, Inc.) and toluene (88 ml) were mixed in an inert atmosphere, and the obtained reaction solution was heated to 105° C. Next, a 2 M aqueous $Na_2CO_3$ solution (28 ml) was added dropwise to the reaction solution, and the mixture was refluxed for 1 hour for reaction. Then, phenylboric acid (170 mg) was added thereto, and the mixture was further refluxed for 3 hours. Subsequently, a 1.8 M aqueous sodium diethyldithiacarbamate solution (50 ml) was added to the reaction solution. After stirring at 80° C. for 4 hours, the mixture was cooled to 25° C., washed with water (200 ml) three times, with a 3 wt % aqueous acetic acid solution (200 ml) four times and with water (200 ml) three times, and then applied to an alumina column and a silica gel column for purification to obtain a toluene solution. Then, the obtained toluene solution was added dropwise to methanol (3 L), and the mixture was stirred for 3 hours. Then, the obtained solid was filtered and dried to obtain the polymer compound <P-3>. The polymer compound <P-3> was obtained at a yield of 9.78 g. Moreover, the polymer compound <P-3> had a polystyrene equivalent weight average molecular weight of $3.6 \times 10^5$ and a polystyrene equivalent number average molecular weight of $9.2 \times 10^4$.

In this context, the N,N'-bis(4-bromophenyl)-N,N'-bis(4-t-butyl-2,6-dimethylphenyl)-benzidine was synthesized according to a method described in the pamphlet of WO2005/056633.

Comparative Example 1

A polymer compound <P-4> containing repeating units represented by the following structural formulas was produced:

Specifically, first, 2,7-bis(1,3,2-dioxaborolan-2-yl)-9,9-dioctylfluorene (5.10 g), N,N'-bis(4-bromophenyl)-N,N'-bis(4-t-butyl-2,6-dimethylphenyl)-benzidine (7.78 g), palladium acetate (2.4 mg), tri(2-methylphenyl)phosphine (32.3 mg), Aliquat 336 (1.5 g, manufactured by Sigma-Aldrich, Inc.) and toluene (73 ml) were mixed in an inert atmosphere, and the obtained reaction solution was heated to 105° C. Next, a 2 M aqueous $Na_2CO_3$ solution (23 ml) was added dropwise to the reaction solution, and the mixture was refluxed for 2 hours for reaction. Then, phenylboric acid (140 mg) was added thereto, and the mixture was further refluxed for 3 hours. Subsequently, a 1.8 M aqueous sodium diethyldithiacarbamate solution (50 ml) was added to the reaction solution. After stirring at 80° C. for 4 hours, the mixture was cooled to 25° C., washed with water (120 ml) three times, with a 3 wt % aqueous acetic acid solution (120 ml) four times and with water (120 ml) three times, and then applied to an alumina column and a silica gel column for purification to obtain a toluene solution. Then, the obtained toluene solution was added dropwise to methanol (3 L), and the mixture was stirred for 3 hours. Then, the obtained solid was filtered and dried to obtain the polymer compound <P-4>. The polymer compound <P-4> was obtained at a yield of 8.78 g. Moreover, the polymer compound <P-4> had a polystyrene equivalent weight average molecular weight of $1.3 \times 10^5$ and a polystyrene equivalent number average molecular weight of $5.3 \times 10^4$.

Example 2

A polymer compound <P-5> containing repeating units represented by the following structural formulas (a second polymer compound of the present invention) was produced:

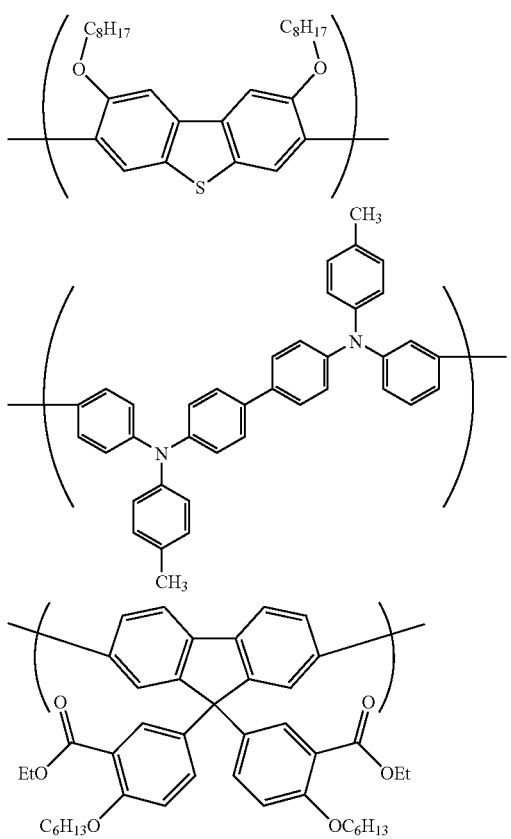

Specifically, first, 3,7-dibromo-2,8-dioctyloxydibenzothiophene (0.30 g), N,N'-bis(4-bromophenyl)-N,N'-bis(4-methylphenyl)-benzidine (0.30 g), 2,7-dibromo-9,9-bis(4-hexyloxy-3-ethoxycarbonylphenyl)-fluorene (0.04 g) and 2,2'-bipyridyl (0.39 g, 3.1 mmol) were dissolved in 40 mL of dehydrated tetrahydrofuran. Then, nitrogen was bubbled into the system for nitrogen substitution to obtain a reaction solution. Subsequently, bis(1,5-cyclooctadiene)nickel(0) {Ni(COD)$_2$} (0.68 g) was added to the reaction solution in a nitrogen atmosphere, and the mixture was heated to 60° C. and reacted for 3 hours. Subsequently, the reaction solution was cooled to 25° C. Then, the reaction solution after reaction was poured into a mixed solution of 25 wt % ammonia water (10 ml)/methanol (120 ml)/ion-exchanged water (50 ml), and the mixture was stirred for approximately 1 hour to deposit a precipitate. Next, the precipitate was collected by filtration, washed with ethanol, and then dried under reduced pressure for 2 hours. Subsequently, the precipitate after drying was dissolved in 30 mL of toluene. 30 mL of 1 N hydrochloric acid was added thereto, and the mixture was stirred for 1 hour. Then, the aqueous layer was removed. 30 mL of 4 wt % ammonia water was further added to the organic layer, and the mixture was stirred for 1 hour. Then, the aqueous layer was removed. Next, the organic layer thus obtained was added dropwise to 200 mL of methanol, and the mixture was stirred for 1 hour. The deposited precipitate was filtered, dried under reduced pressure for 2 hours, and dissolved in 30 mL of toluene to obtain a toluene solution. Then, the toluene solution was applied to an alumina column (the amount of alumina: 20 g) for purification, and the solution was collected. Then, the collected solution was added dropwise to 250 mL of methanol, and the mixture was stirred for 1 hour. The deposited precipitate was filtered and dried under reduced pressure for 2 hours to obtain the polymer compound <P-5> as the second polymer compound of the present invention. The polymer compound <P-5> was obtained at a yield of 0.25 g. Moreover, the polymer compound <P-5> had a polystyrene equivalent weight average molecular weight of 3.4×10$^5$ and a polystyrene equivalent number average molecular weight of 1.2×10$^4$.

In this context, the 3,7-dibromo-2,8-dioctyloxydibenzothiophene was synthesized according to a method described in EP1344788.

Synthesis Example 3

A red light-emitting polymer compound <P-6> was produced. Specifically, first, 2,7-bis(1,3,2-dioxaborolan-2-yl)-9,9-dihexylfluorene (1.91 g), 4,7-bis(5-bromo-4-methyl-2-thienyl)-2,1,3-benzothiadiazole (0.10 g), 4,7-dibromo-2,1,3-benzothiadiazole (0.35 g), bis(4-bromophenyl)-(4-secondary butylphenyl)-amine (0.74 g), 2,7-dibromo-9,9-dihexylfluorene (0.79 g), bis(triphenylphosphine)palladium dichloride (8.4 mg), Aliquat 336 (0.52 g, manufactured by Sigma-Aldrich, Inc.) and toluene (40 ml) were mixed in an inert atmosphere, and the obtained reaction solution was heated to 105° C. Next, a 2 M aqueous Na$_2$CO$_3$ solution (11 ml) was added dropwise to the reaction solution, and the mixture was refluxed for 1.5 hours. Then, phenylboric acid (40 mg) was added thereto, and the mixture was further refluxed for 3 hours. Subsequently, a 1.8 M aqueous sodium diethyldithiacarbamate solution (15 ml) was added to the reaction solution. After stirring at 80° C. for 4 hours, the mixture was cooled to 25° C., subsequently washed with water (50 ml) three times, with a 3 wt % aqueous acetic acid solution (50 ml) four times and with water (50 ml) three times, and then applied to an alumina column and a silica gel column for purification to obtain a toluene solution. Then, the obtained toluene solution was added dropwise to methanol (3 L), and the mixture was stirred for 1 hour. Then, the obtained solid was filtered and dried to obtain the red light-emitting polymer compound <P-6>. The polymer compound <P-6> was obtained at a yield of 2.02 g. Moreover, the polymer compound <P-6> had a polystyrene equivalent weight average molecular weight of 1.8×10$^5$ and a polystyrene equivalent number average molecular weight of 8.0×10$^4$.

In this context, the 4,7-dibromo-2,1,3-benzothiadiazole was synthesized according to a method described in U.S. Pat. No. 3,577,427. The 4,7-bis(5-bromo-4-methyl-2-thienyl)-2,1,3-benzothiadiazole was synthesized according to a method described in the pamphlet of WO2000/046321.

[Assembling of Polymer Light-Emitting Device (Electroluminescent Device: EL Device)]

Example 3

A suspension of poly(3,4)ethylenedioxythiophene/polystyrene sulfonic acid (manufactured by Bayer AG) was applied at a thickness of approximately 65 nm by a spin coating method onto the surface of a glass substrate laminated with an ITO film at a thickness of 150 nm by a sputtering method. The first film thus formed was dried at 200° C. for 15 minutes on a hot plate.

Next, the polymer compound <P-3> obtained in Synthesis Example 2 was dissolved at a concentration of 1.5 wt % in a mixture of xylenes to obtain a xylene solution. The xylene solution was applied onto the surface of the first film by a spin coating method to form a hole transport layer. Then, the film was dried under temperature conditions of 200° C. for 1 hour in a nitrogen atmosphere containing 10 ppm or lower (by weight) oxygen and moisture concentrations. In this context, the thickness of the hole transport layer thus dried was adjusted to approximately 10 nm by rinsing out soluble matter using mixed xylene in atmosphere.

Next, the red light-emitting polymer compound <P-6> obtained in Synthesis Example 3 was dissolved at a concentration of 1.7 wt % in mixed xylene to obtain a xylene solution. The xylene solution was applied at a thickness of approximately 100 nm onto the surface of the hole transport layer by a spin coating method to form a light-emitting layer. The film was dried under temperature conditions of 130° C. for 1 hour in a nitrogen atmosphere containing 10 ppm or lower (by weight) oxygen and moisture concentrations.

Subsequently, the pressure was reduced to $1.0 \times 10^{-4}$ Pa or lower. Then, barium (approximately 5 nm) and further aluminum (approximately 80 nm) were deposited onto the surface of the light-emitting layer to stack cathode layers. After such deposition, sealing was performed using a glass substrate to prepare a polymer light-emitting device of the present invention.

<Device Configuration>

ITO (anode)/first film (Baytron P; thickness: approximately 65 nm)/hole transport layer (polymer compound <P-3>; thickness: approximately 10 nm)/light-emitting layer (polymer compound <P-6>; thickness: approximately 80 nm)/Ba (cathode)/Al (cathode).

<Evaluation on Performance of Polymer Light-Emitting Device (EL Device) Obtained in Example 3>

The polymer light-emitting device obtained in Example 3 was evaluated for its performance by voltage application. A voltage was applied at 10.0 V to the polymer light-emitting device obtained in Example 3. As a result, the polymer light-emitting device emitted fluorescence with a peak-top emission wavelength of 670 nm, and the luminance in this emission was 2836 cd/m$^2$. Moreover, it exhibited the maximum value of luminous efficiency, which was 0.70 cd/A, at 3.8 V. Furthermore, the time required for luminance to be decreased to 50% of initial luminance 1500 cd/m$^2$ (luminance half-life) was confirmed to be 176.6 hours. Thus, the obtained polymer light-emitting device was confirmed to have a sufficiently long lifetime.

Comparative Example 2

A suspension of poly(3,4)ethylenedioxythiophene/polystyrene sulfonic acid (manufactured by Bayer AG) was applied at a thickness of approximately 65 nm by a spin coating method onto the surface of a glass substrate laminated with an ITO film at a thickness of 150 nm by a sputtering method. The first film thus formed was dried at 200° C. for 15 minutes on a hot plate.

Next, the polymer compound <P-4> obtained in Comparative Example 1 was dissolved at a concentration of 1.5 wt % in a mixture of xylenes to obtain a xylene solution. The xylene solution was applied onto the surface of the first film by a spin coating method to form a hole transport layer. Then, the film was dried under temperature conditions of 200° C. for 1 hour in a nitrogen atmosphere containing 10 ppm or lower (by weight) oxygen and moisture concentrations. In this context, the thickness of the hole transport layer thus dried was adjusted to approximately 10 nm by rinsing out soluble matter using mixed xylene in atmosphere.

Next, the red light-emitting polymer compound <P-6> obtained in Synthesis Example 3 was dissolved at a concentration of 1.7 wt % in mixed xylene to obtain a xylene solution. The xylene solution was applied at a thickness of approximately 100 nm onto the surface of the hole transport layer by a spin coating method to form a light-emitting layer. The film was dried under temperature conditions of 130° C. for 1 hour in a nitrogen atmosphere containing 10 ppm or lower (by weight) oxygen and moisture concentrations.

Subsequently, the pressure was reduced to $1.0 \times 10^{-4}$ Pa or lower. Then, barium (approximately 5 nm) and further aluminum (approximately 80 nm) were deposited onto the surface of the light-emitting layer to stack cathode layers. After such deposition, sealing was performed using a glass substrate to prepare a polymer light-emitting device for comparison with Example 3.

<Device Configuration>

ITO (anode)/first film (Baytron P; thickness: approximately 65 nm)/hole transport layer (polymer compound <P-4>; thickness: approximately 10 nm)/light-emitting layer (polymer compound <P-6>; thickness: approximately 80 nm)/Ba (cathode)/Al (cathode).

<Evaluation on Performance of Polymer Light-Emitting Device (EL Device) Obtained in Comparative Example 2>

The polymer light-emitting device obtained in Comparative Example 2 was evaluated for its performance by voltage application. A voltage was applied at 10.0 V to the polymer light-emitting device obtained in Comparative Example 2. As a result, the polymer light-emitting device emitted fluorescence with a peak-top emission wavelength of 665 nm, and the luminance in this emission was 3090 cd/m$^2$. Moreover, it exhibited the maximum value of luminous efficiency, which was 0.63 cd/A, at 4.6 V. Furthermore, the time required for luminance to be decreased to 50% of initial luminance 1500 cd/m$^2$ (luminance half-life) was confirmed to be 82.6 hours. Thus, the obtained polymer light-emitting device did not have a sufficient luminance half-life.

Industrial Applicability

As described above, the present invention can provide a polymer light-emitting device that can have a sufficiently long luminance half-life and can provide a polymer compound that allows production of a polymer light-emitting device having a sufficiently long luminance half-life, when used as a material for the polymer light-emitting device, and a composition, a liquid composition and a conductive thin film which are obtained using the polymer compound.

Thus, the polymer light-emitting device of the present invention is particularly useful as a device used in planar light sources, display devices (e.g., segment display devices, dot matrix display devices and liquid-crystal display devices (e.g., backlights)), and so on.

The invention claimed is:

1. A polymer light-emitting device having a light-emitting layer between an anode and a cathode and having a hole transport layer between the light-emitting layer and the anode, characterized in that the hole transport layer is a layer containing a polymer compound comprising a repeating unit represented by the following general formula (I), a repeating unit represented by the following general formula (II) and a repeating unit represented by the following general formula (III):

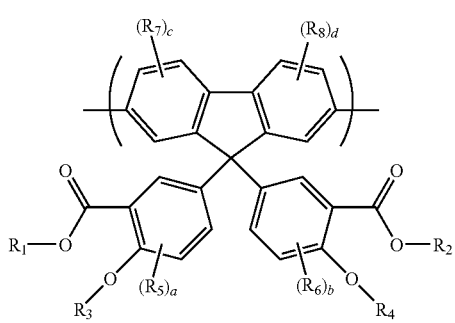

(I)

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different, —$Ar_1$— (II)

wherein $Ar_1$ represents a divalent aromatic amine, and

—$Ar_2$— (III)

wherein $Ar_2$ represents an arylene group or a divalent heterocyclic group.

2. The polymer light-emitting device according to claim 1, wherein $Ar_1$ in the general formula (II) is a group represented by the following general formula (IV):

wherein $R_9$ to $R_{34}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; o and p may be the same or different and each represent an integer of 0 or 1; and carbon bonded to $R_{10}$ and carbon bonded to $R_{18}$, carbon bonded to $R_{12}$ and carbon bonded to $R_{13}$, carbon bonded to $R_{24}$ and carbon bonded to $R_{34}$, or carbon bonded to $R_{30}$ and carbon bonded to $R_{31}$ may form a ring through a direct bond or through a bond via an oxygen or sulfur atom, and when such a ring is formed, $R_{10}$ and $R_{18}$, $R_{12}$ and $R_{13}$, $R_{24}$ and $R_{34}$, or $R_{30}$ and $R_{31}$ together represent the direct bond or the oxygen or sulfur atom.

3. The polymer light-emitting device according to claim 1, wherein $Ar_2$ in the general formula (III) is a group represented by the following general formula (V):

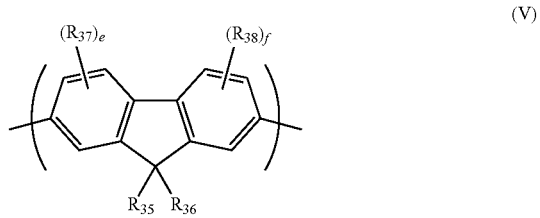

(V)

wherein $R_{35}$ and $R_{36}$ may be the same or different and each represent a hydrogen atom, an alkyl group, an alkoxy (IV)

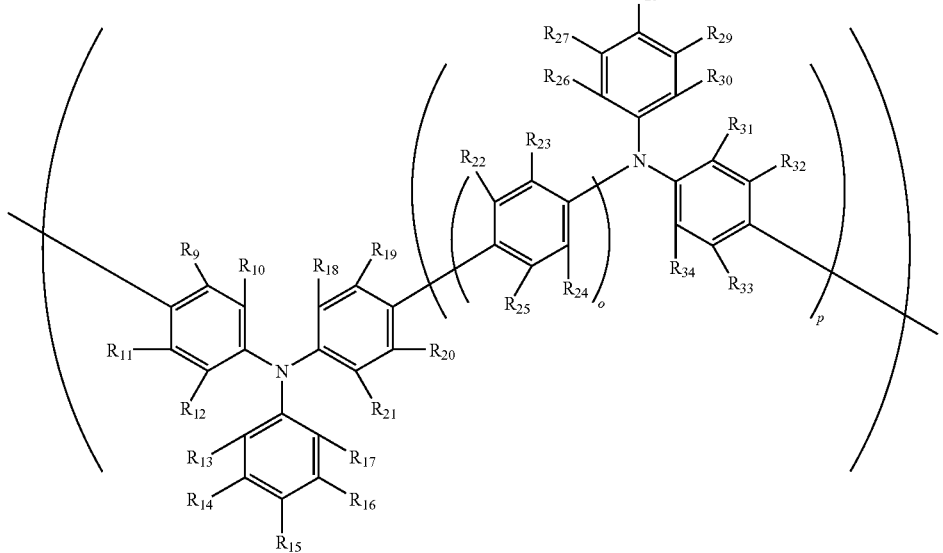

group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{37}$ and $R_{38}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; e and f may be the same or different and each represent an integer of 0 to 3; and when a plurality of $R_{37}$ or $R_{38}$ are present, they may be the same or different.

4. The polymer light-emitting device according to claim 1, wherein $Ar_2$ in the general formula (III) is a group represented by the following general formula (VI):

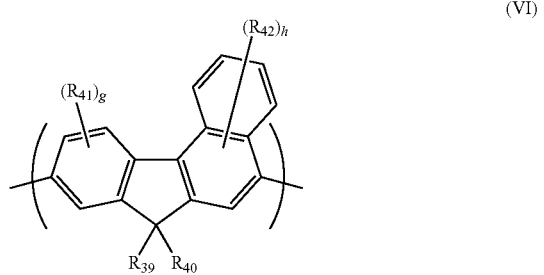

(VI)

wherein $R_{39}$ and $R_{40}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{41}$ and $R_{42}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; g represents an integer of 0 to 3; h represents an integer of 0 to 5; and when a plurality of $R_{41}$ or $R_{42}$ are present, they may be the same or different.

5. The polymer light-emitting device according to claim 1, wherein $Ar_2$ in the general formula (III) is a group represented by the following general formula (VII):

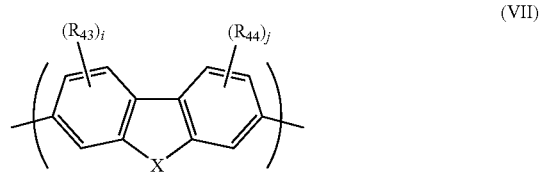

(VII)

wherein X represents an oxygen atom or a sulfur atom; $R_{43}$ and $R_{44}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; i and j may be the same or different and each represent an integer of 0 to 3; and when a plurality of $R_{43}$ or $R_{44}$ are present, they may be the same or different.

6. The polymer light-emitting device according to claim 1, wherein the polymer compound has a polystyrene equivalent weight average molecular weight of $10^3$ to $10^7$.

7. The polymer light-emitting device according to claim 1, wherein the hole transport layer is a layer further containing a hole transport material.

8. A polymer compound characterized by comprising a repeating unit represented by the following general formula (I), a repeating unit represented by the following general formula (II) and a repeating unit represented by the following general formula (VI):

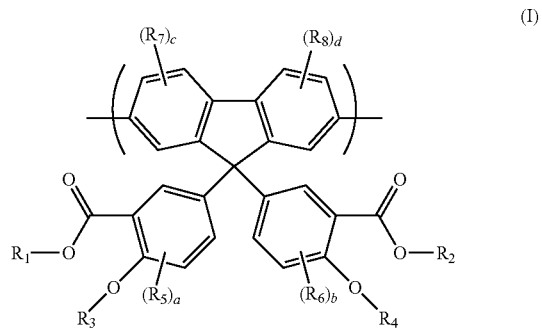

(I)

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different, —Ar$_1$— (II)

wherein Ar$_1$ represents a divalent aromatic amine, and

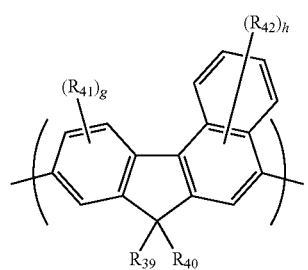
(VI)

wherein $R_{39}$ and $R_{40}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; $R_{41}$ and $R_{42}$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; g represents an integer of 0 to 3; h represents an integer of 0 to 5; and when a plurality of $R_{41}$ or $R_{42}$ are present, they may be the same or different.

9. A polymer compound characterized by comprising a repeating unit represented by the following general formula (I), a repeating unit represented by the following general formula (II) and a repeating unit represented by the following general formula (VII):

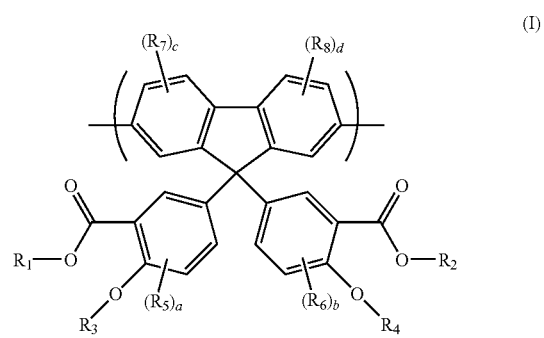

wherein $R_1$, $R_2$, $R_3$ and $R_4$ may be the same or different and each represent a hydrogen atom or an alkyl group; $R_5$, $R_6$, $R_7$ and $R_8$ may be the same or different and each represent an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; a, b, c and d may be the same or different and each represent an integer of 0 to 3; and when a plurality of $R_5$, $R_6$, $R_7$ or $R_8$ are present, they may be the same or different, —Ar$_1$— (II)

wherein Ar$_1$ represents a divalent aromatic amine, and

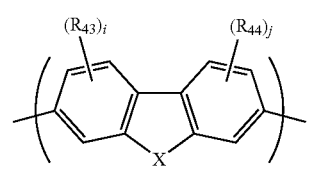
(VII)

wherein X represents an oxygen atom or a sulfur atom; $R_{43}$ and $R_{44}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; i and j may be the same or different and each represent an integer of 0 to 3; and when a plurality of $R_{43}$ or $R_{44}$ are present, they may be the same or different.

10. The polymer compound according to claim 8, wherein Ar$_1$ in the general formula (II) is a group represented by the following general formula (IV):

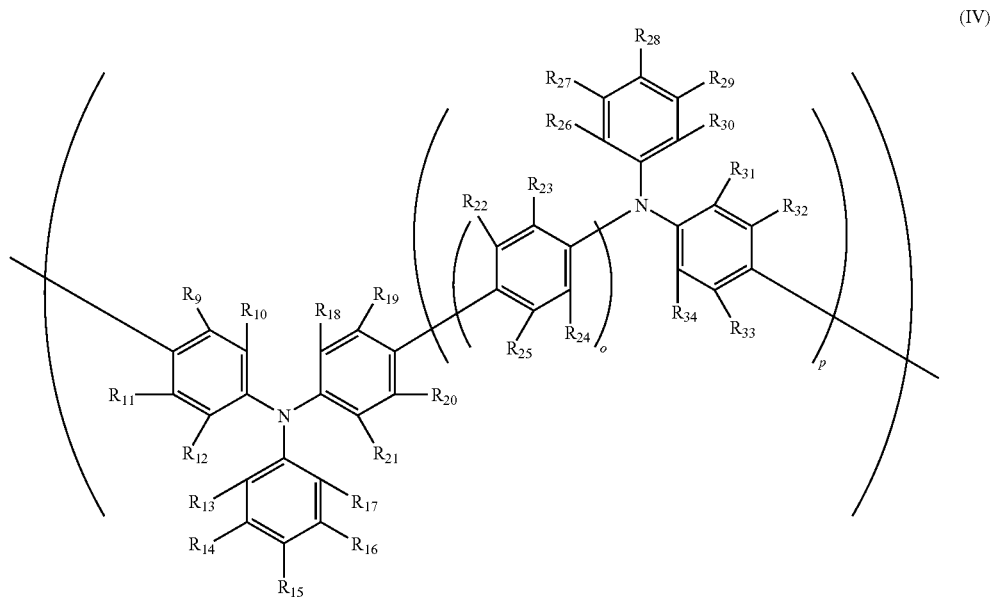

(IV)

wherein $R_9$ to $R_{34}$ may be the same or different and each represent a hydrogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amide group, an acid imide group, a monovalent heterocyclic group, a carboxyl group, a substituted carboxyl group, a cyano group or a nitro group; o and p may be the same or different and each represent an integer of 0 or 1; and carbon bonded to $R_{10}$ and carbon bonded to $R_{18}$, carbon bonded to $R_{12}$ and carbon bonded to $R_{13}$, carbon bonded to $R_{24}$ and carbon bonded to $R_{34}$, or carbon bonded to $R_{30}$ and carbon bonded to $R_{31}$ may form a ring through a direct bond or through a bond via an oxygen or sulfur atom, and when such a ring is formed, $R_{10}$ and $R_{18}$, $R_{12}$ and $R_{13}$, $R_{24}$ and $R^{34}$, or $R_{30}$ and $R_{31}$ together represent the direct bond or the oxygen or sulfur atom.

11. The polymer compound according to claim 8, wherein the polymer compound has a polystyrene equivalent weight average molecular weight of $10^3$ to $10^7$.

12. A composition characterized by comprising a polymer compound according to claim 8 and at least one material selected from the group consisting of a light-emitting material and a hole transport material.

13. A liquid composition containing a polymer compound according to claim 8 and a solvent.

14. A conductive thin film characterized by comprising one or fmore polymer compounds according to claim 8.

* * * * *